(12) United States Patent
Noguchi et al.

(10) Patent No.: US 6,958,938 B2
(45) Date of Patent: Oct. 25, 2005

(54) DATA WRITING METHOD FOR SEMICONDUCTOR MEMORY DEVICE AND SEMICONDUCTOR MEMORY DEVICE

(75) Inventors: Mitsuhiro Noguchi, Yokohama (JP); Akira Goda, Yokohama (JP); Yuji Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/007,461

(22) Filed: Dec. 9, 2004

(65) Prior Publication Data

US 2005/0157558 A1    Jul. 21, 2005

Related U.S. Application Data

(60) Continuation of application No. 10/796,180, filed on Mar. 10, 2004, now Pat. No. 6,870,773, which is a division of application No. 10/077,757, filed on Feb. 20, 2002, now Pat. No. 6,809,967.

(30) Foreign Application Priority Data

Feb. 20, 2001 (JP) .............................. 2001-043643
Feb. 15, 2002 (JP) .............................. 2002-038244

(51) Int. Cl.[7] ............................................. G11C 16/04
(52) U.S. Cl. ............................. 365/185.22; 365/185.28
(58) Field of Search ....................... 365/185.22, 185.28

(56) References Cited

U.S. PATENT DOCUMENTS

| 4,656,610 A | 4/1987 | Yoshida et al. |
|---|---|---|
| 5,452,249 A | 9/1995 | Miyamoto et al. |
| 5,835,436 A | 11/1998 | Ooishi |
| 6,091,640 A | 7/2000 | Kawahara et al. |
| 6,467,056 B1 | 10/2002 | Satou et al. |
| 6,496,418 B2 | 12/2002 | Kawahara et al. |
| 6,512,702 B1 | 1/2003 | Yamamura et al. |
| 6,563,746 B2 | 5/2003 | Fujioka et al. |
| 6,574,147 B2 | 6/2003 | Tanaka et al. |
| 6,580,638 B2 | 6/2003 | Conley et al. |

(Continued)

FOREIGN PATENT DOCUMENTS

| CN | 1216388 A | 5/1999 |
|---|---|---|
| JP | 7-182886 | 7/1995 |
| JP | 10-222989 | 8/1998 |
| JP | 2000-76872 | 3/2000 |

(Continued)

*Primary Examiner*—Anh Phung
*Assistant Examiner*—Tuan T. Nguyen
(74) *Attorney, Agent, or Firm*—Oblon, Spivak, McClelland, Maier & Neustadt, P.C.

(57) ABSTRACT

A data writing method for a semiconductor memory device includes writing data into the first memory cell, rewriting the data into the first memory cell when an insufficiency of the data of the first memory cell is determined as a result of verifying the data of the first memory cell at one first reference threshold voltage, writing data into the second memory cell following writing the data into the first memory cell, and rewriting the data into the first memory cell following writing the data into the second memory cell when an insufficiency of the data of the first memory cell is determined as a result of verifying the data of the first memory cell at one second reference threshold voltage. The first reference threshold voltage is set to be different from the second reference threshold voltage.

20 Claims, 41 Drawing Sheets

U.S. PATENT DOCUMENTS

| | | |
|---|---|---|
| 6,646,920 B2 | 11/2003 | Takashina et al. |
| 6,760,255 B2 | 7/2004 | Conley et al. |
| 6,809,967 B2 * | 10/2004 | Noguchi et al. ....... 365/185.22 |
| 6,868,032 B2 * | 3/2005 | Kozakai et al. ........ 365/230.03 |

FOREIGN PATENT DOCUMENTS

| | | |
|---|---|---|
| JP | 2000-276887 | 10/2000 |
| KR | 2000-0023177 | 4/2000 |
| KR | 10-0282026 | 2/2001 |

* cited by examiner

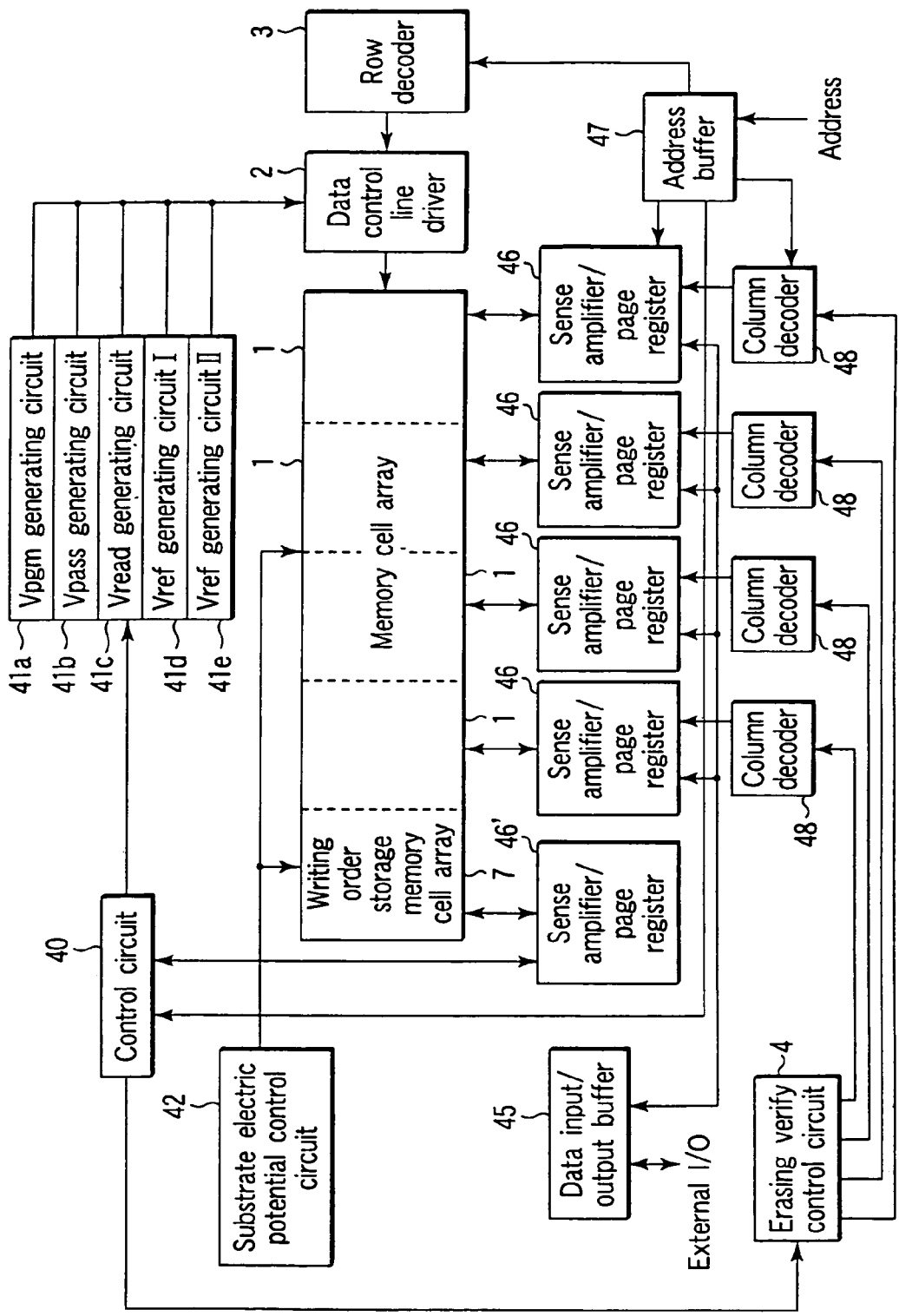
F I G. 1

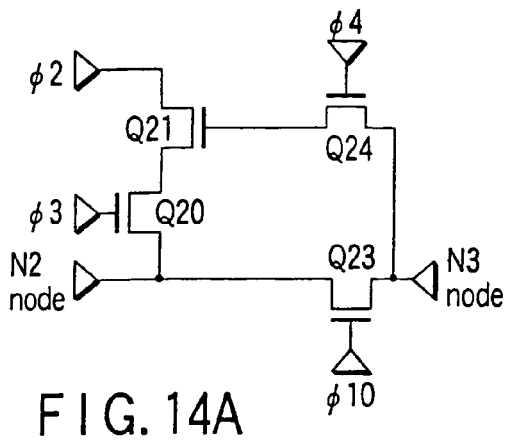
F I G. 14A
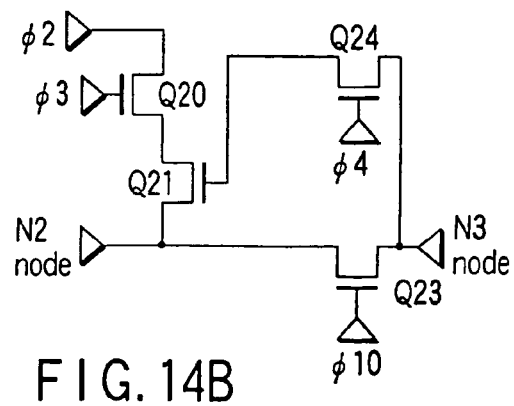
F I G. 14B
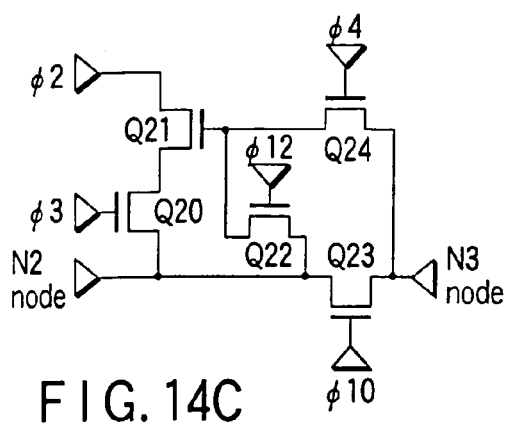
F I G. 14C
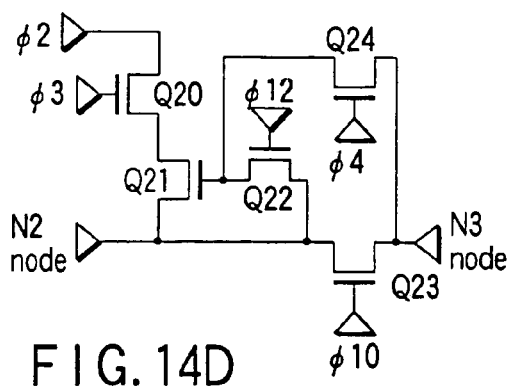
F I G. 14D
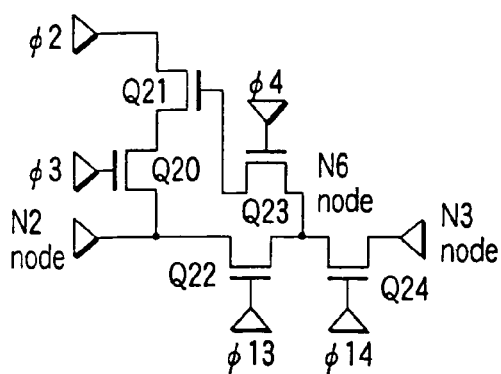
F I G. 14E
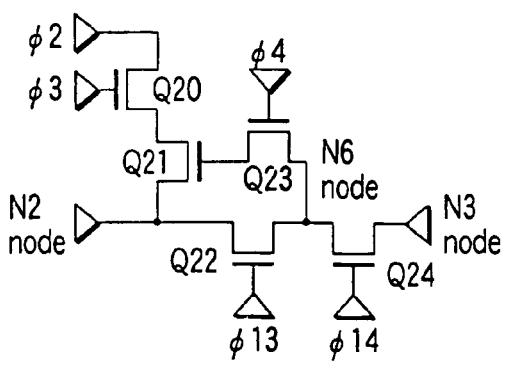
F I G. 14F

| Q21 gate initial value (corresponding to TR1) | N2 node initial value | N2 node output after φ3="H" |
|---|---|---|
| "L" | "L" | "L" |
| "H" | "L" | "L" |
| "L" | "H" | "H" |
| "H" | "H" | "L" |

In the case of φ2="L"
(selective discharge operation and inverted output operation)

FIG. 15A

| Q21 gate initial value (corresponding to TR1) | N2 node initial value | N2 node output after φ3="H" |
|---|---|---|
| "L" | "L" | "L" |
| "H" | "L" | "H" |
| "L" | "H" | "H" |
| "H" | "H" | "H" |

In the case of φ2="H"
(selective charge operation)

FIG. 15B

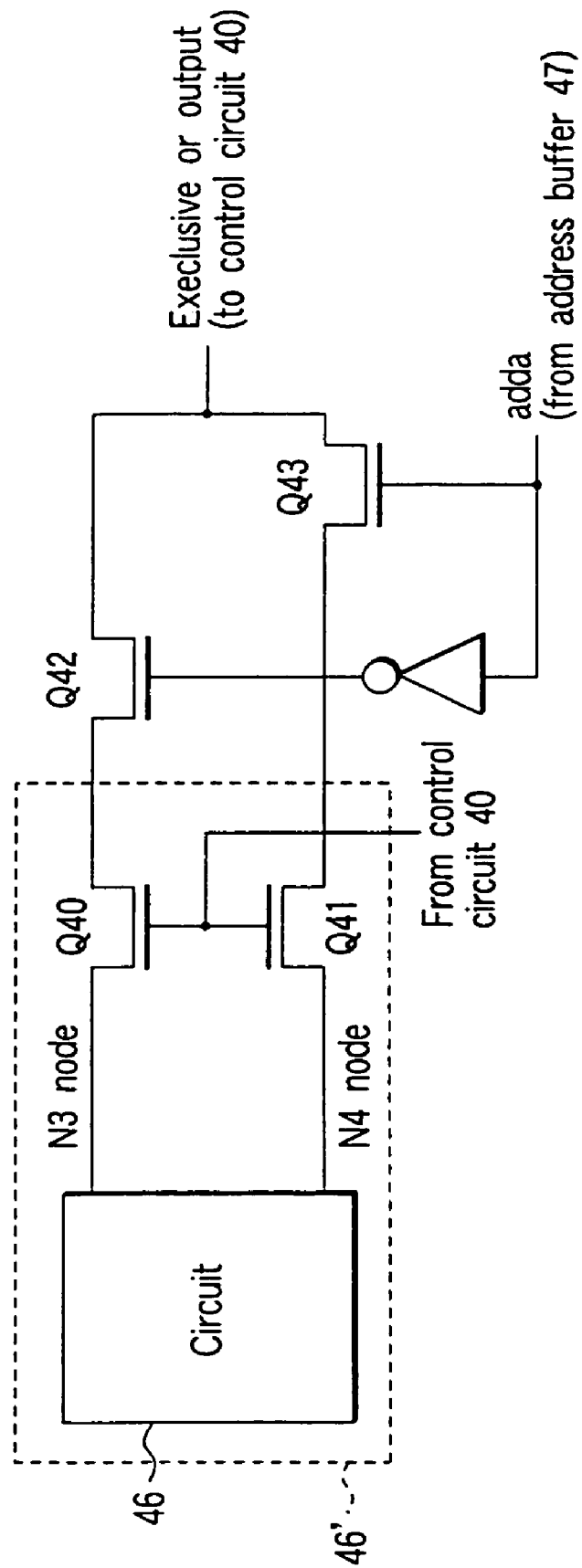
F I G. 29

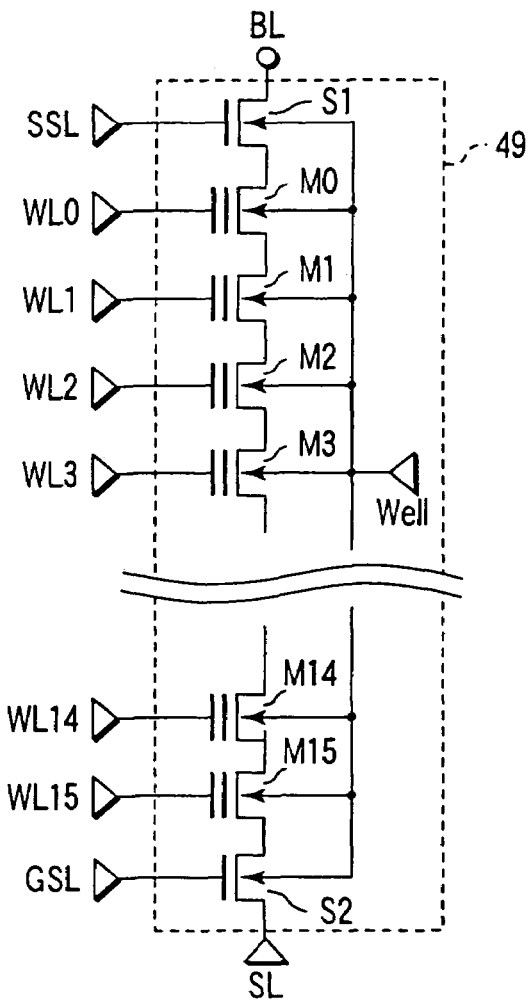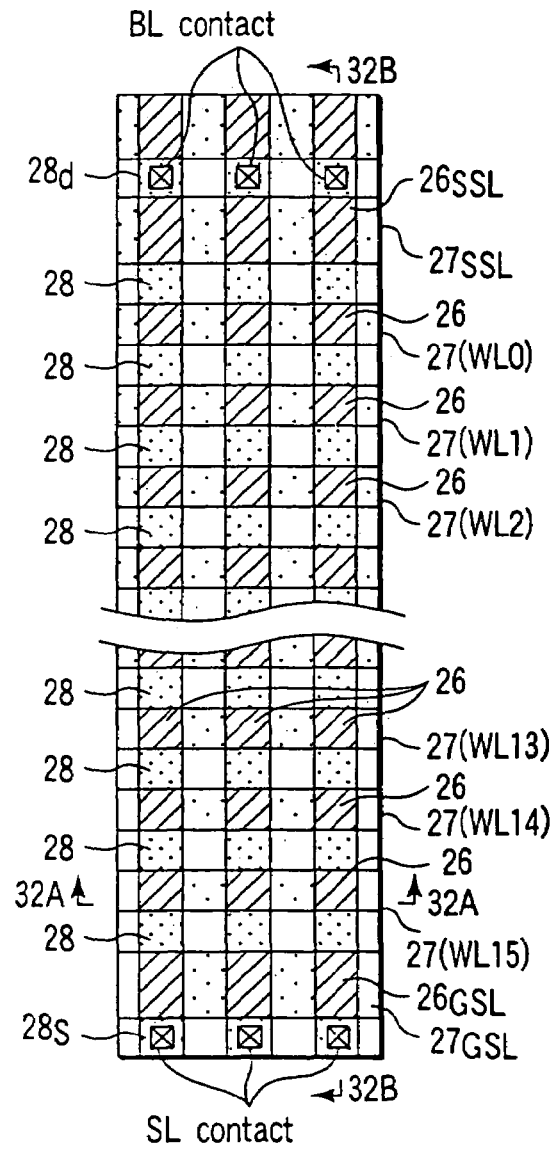
F I G. 31A    F I G. 31B

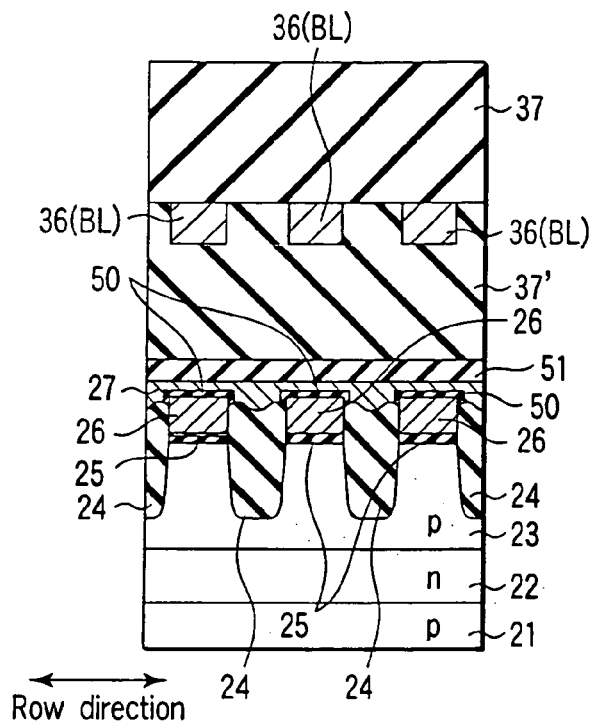
F I G. 32A
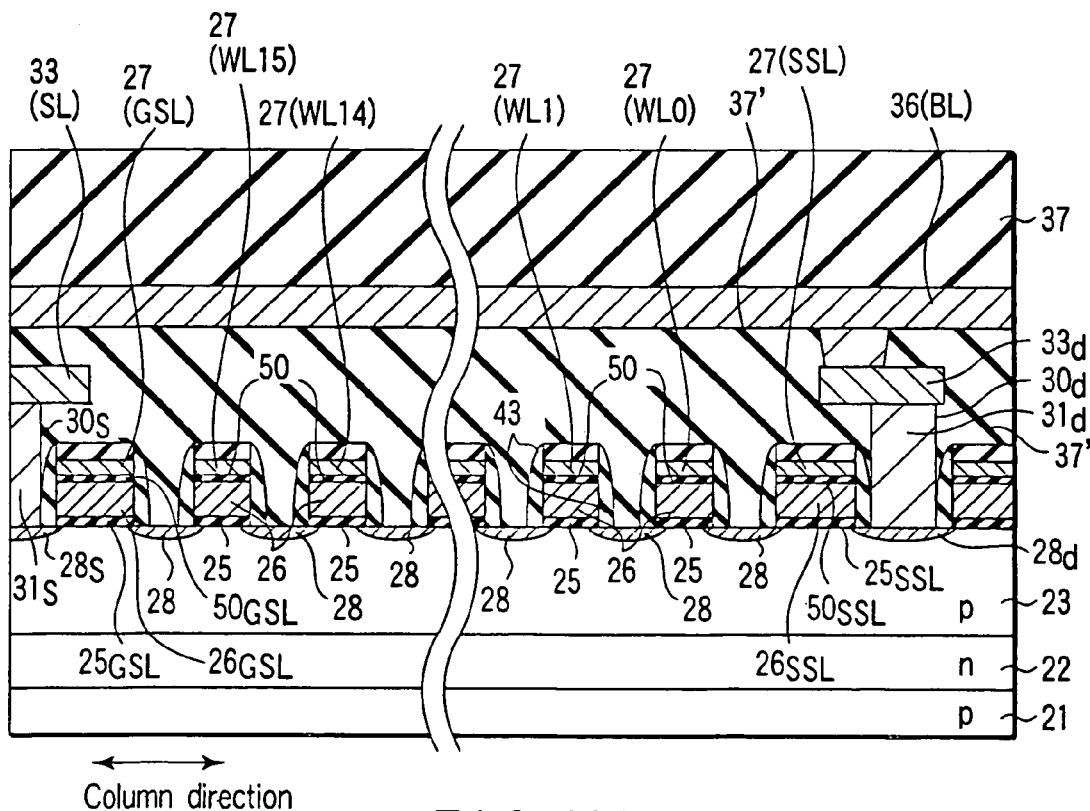
F I G. 32B

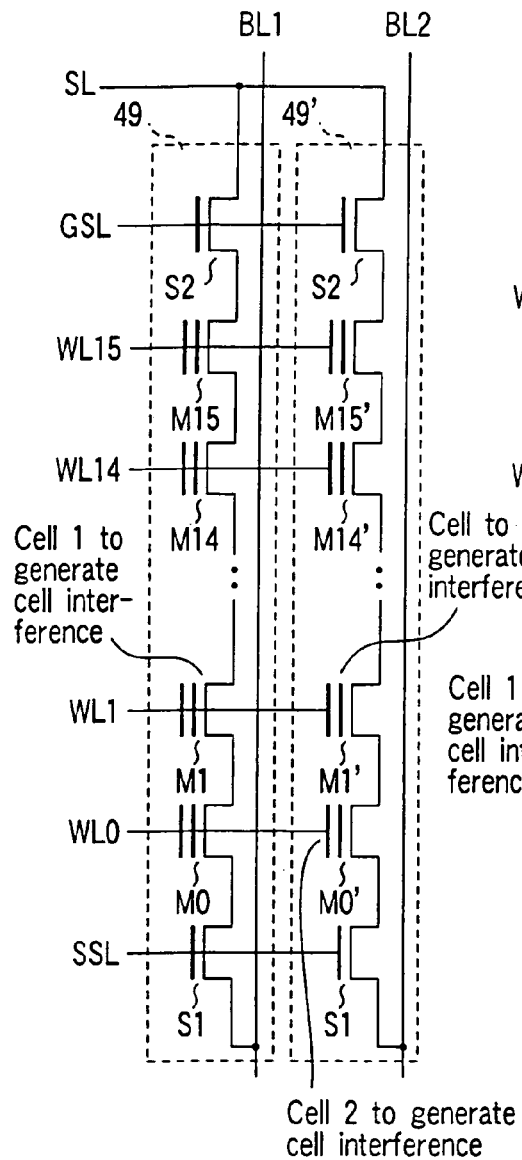
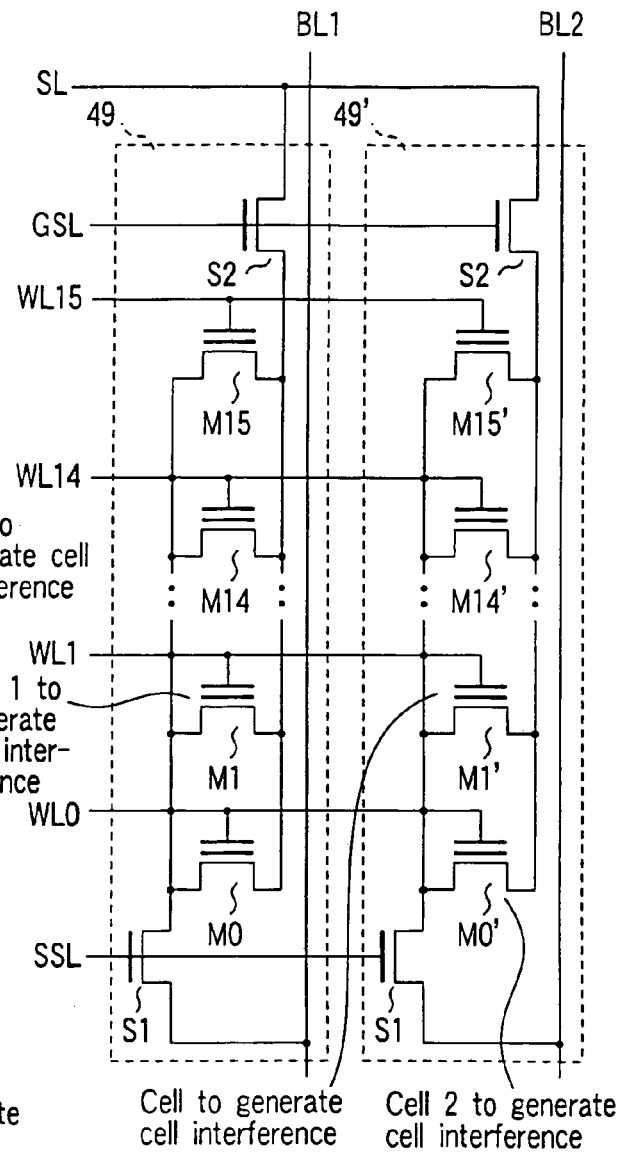
FIG. 38A
PRIOR ART
FIG. 38B
PRIOR ART

DATA WRITING METHOD FOR SEMICONDUCTOR MEMORY DEVICE AND SEMICONDUCTOR MEMORY DEVICE

CROSS-REFERENCE TO RELATED APPLICATIONS

This application is a continuation application of U.S. patent application Ser. No. 10/796,180, filed Mar. 10, 2004 now U.S. Pat. No. 6,870,773, which is a divisional application of U.S. patent application Ser. No. 10/077,757, filed Feb. 20, 2002, now U.S. Pat. No. 6,809,967, and is based upon and claims the benefit of priority from the prior Japanese Patent Application No. 2001-043643, filed Feb. 20, 2001, and No. 2002-038244, filed Feb. 15, 2002. The entire contents of these applications are incorporated herein by reference.

BACKGROUND OF THE INVENTION

1. Field of the Invention

The present invention relates to a semiconductor integrated circuit device. More specifically, the present invention relates to a data writing method for a nonvolatile semiconductor memory device capable of decreasing the disturbance of the data due to capacitance coupling even if the distance between adjacent memory cells becomes narrow, and the nonvolatile semiconductor memory device.

2. Description of the Related Art

A nonvolatile semiconductor memory to read the information, has been developed, in such a manner that an electric charge, which is injected from a channel to an charge accumulation layer through a tunnel insulation film by a tunneling current, is used as information storage of a digital bit and the conductance change of MOSFET in accordance with its electric charge amount is measured. However, according to a constitution of a conventional nonvolatile semiconductor memory and a conventional writing method, in concurrence with high accumulation of a memory cell, the capacitance coupling between the charge accumulation layers of the memory cells is increased, so that this involves a problem such that the data of the adjacent memory cells is disturbed dependent on an order of writing. First, a problem in a conventional example will be explained with reference to FIGS. 37 to 43.

FIG. 38A and FIG. 38B illustrate circuit diagrams of a cell block of a conventional NAND type and a cell block of a conventional AND type EEPROM.

In FIG. 38A and FIG. 38B, reference numerals M0 to M15 and M0' to M15' denote memory cells and reference numerals 49 and 49' respectively denote one memory cell block to be formed, for example, by a NAND type block and an AND type block. A plurality of data selection lines (WL0 to WL15) is connected to one memory cell block 49, 49'. Alternatively, memory cell block selection lines SSL and GSL are connected to the memory cell block 49. Further, reference numerals BL1 and BL2 denote data transfer lines and they are arranged in a direction mutually orthogonal to the data selection line (not shown). Each memory cell in the memory cell block 49 is formed at an intersecting point of the data transfer line and the data selection line. In each memory cell, it is possible to data store and data read, independently. In this case, assume a memory cell is a transistor having, for example, a charge accumulation layer and representing data by the electric charge amount of its charge accumulation layer. These plural memory cell blocks 49 are formed in a direction of the data transfer-line and in a direction of the data selection line to form a memory cell array 1.

FIG. 39 illustrates a layout example of a memory cell array 1 and a sense amplifier 46 according to a conventional example including a sense amplifier circuit. In FIG. 39, in order to make the drawing understandable, the data selection lines WL0 to WL15 and the block selection lines SSL and GSL are omitted.

In FIG. 39, reference numerals BL1$x$, BL2$x$ (x=a, b, c ... k) denote data transfer lines. The memory cell blocks 49 and 49' shown in FIG. 38 are connected to the data transfer lines, respectively and the data transfer lines are connected to one sense amplifier x via Q1$x$ and Q2$x$. The subscripts such as a, b, ... k are indices which are attached conveniently for representing plural lines of memory cell layouts and a total number of the indices may be any number if it is a plural number. In other words, the sense amplifier needs a transistor larger than one memory cell, so that one sense amplifier 46 is shared by a plurality of data transfer lines so that an area occupied by the sense amplifier is contracted. Further, the sense amplifier 46 serves to read the data of the memory cell and it doubles with a data register, which temporally keeps data to be written in the memory cell. Further, this sense amplifier 46 is commonly connected to data lines I/O and I/OB for connecting writing and the reading data to a data input/output buffer 45, respectively. Following a general rule, a direction along the data selection line is referred to as a row and a direction along the data transfer line is referred to as a column below.

In the case of writing data in the memory cell M1' of the memory cell block 49' in the conventional circuit of FIG. 38, the data transfer line BL2 connected to the sense amplifiers is biased, for example, in such a manner that the output voltage of the data register takes a voltage value in accordance with the written data. At the same time, a program voltage Vpgm having a potential difference which is sufficiently larger than the potential of the data transfer line which writes the data is pulsed in time to a sufficient extent for injecting a carrier to be applied to the data selection line WL1 in such a manner that the sufficiently high voltage is applied so that the current flows through the tunnel insulation film of a nonvolatile memory element of the memory cell. In this case, it is necessary that the data of M1' should not written in the memory cell block 49 adjacent to the memory cell block 49'. Further, it is also necessary that the data of M1' should not written in the memory cell M0' adjacent to M1'. Alternatively, according to the conventional example, these memory cells M0', M1' and M1 are connected to one sense amplifier 46, so that it is not possible to write arbitrary data in a plurality of memory cells connected to one sense amplifier.

Next, FIG. 40 shows a writing sequence according to the conventional example, in which a problem occurs.

FIG. 40 illustrates a flowchart for independently writing data, for example, in the memory cells M1 and M1' belonging to two adjacent columns. The present example is formed on the same well. In the present example, it is supposed that a flash memory in which the data is entirely deleted. Further, in the present example, it is supposed that an initial state of the memory cell is a state that all data are "11", namely, a state that the negative accumulated electric charge in the charge accumulation layer is most decreased. In a constitution of the conventional example, according to a procedure for writing data in a cell at a first column connected to BL1, at first, the written data is latched in a data register of the sense amplifier 46 through an I/O and an I/OB and then, a step (SE120) is performed to determine whether or not the data are sufficiently written in all memory cells at the first column in such a manner that the written data at the first column is written, the data at the first column is read and a determination result of a threshold voltage of the written memory cell is stored in the data register of the sense amplifier 46. Hereby, it is possible to form, for example, a threshold voltage distribution of the memory cell M1' as shown by a broken line in FIG. 41. According to the custom, it is assumed that four threshold distributions correspond to values of "11", "10", "00" and "01." in sequence from a distribution in which the threshold voltage is lower.

Next, the arbitrary data of "11", "10", "00" and "01" is written in the adjacent memory cell M1 in a row direction (SE121). Hereby, a negative electric charge of the charge accumulation layer of M1 is increased in accordance with the value of each data. In this case, if the negative electric charge of the charge accumulation layer of M1 is increased, its voltage rises. In this case, the charge accumulation layer lies in an electrically floating state, so that a voltage of the charge accumulation layer of M1' is increased by the capacitance coupling between the charge accumulation layer of M1' and the charge accumulation layer of M1 as the negative electric charge amount of M1 is increased. This threshold voltage is most increased in the case that the data of M1 adjacent to M1' is "01". In the case that it is "11", the threshold voltage is not changed. Since the data of M1 can take an arbitrary value, "incrementation of the distribution width of the threshold voltage" occurs as shown by a solid line in FIG. 41. This increasing amount is not capable of being controlled while writing the data in the SE120 according to the conventional example.

Accordingly, if a sequence (SE122) for reading the data of M1' is performed after that, the above described "incrementation of the distribution width of the threshold voltage" reduces the margin between a reference threshold voltage for reading and a written threshold voltage is decreased. As a result, for example, a probability of mal-reading the data of "10" as "00" and a probability of mal-reading the data of "00" as "01" are increased.

On the other hand, conventionally, the same problem occurs also in a memory cell belonging to an adjacent row. FIG. 42 shows a flowchart for writing the data independently in two adjacent rows. It is supposed that an initial state of the memory cell is a state that all data are "11", namely, a state that the negative accumulated electric charge in the charge accumulation layer is most decreased.

At first, the arbitrary data of "11", "10", "00" and "01" is written in the memory cell M1' connected to WL1 (SE123). Hereby, for example, it is possible to form a threshold voltage distribution of the memory cell M1'. Next, the arbitrary data of "11", "10", "00" and "01" is written in the memory cell M0' adjacent in a column direction. Hereby, a negative electric charge of the charge accumulation layer of M0' is increased in accordance with the value of each data. In this case, if the negative electric charge of the charge accumulation layer of M0' is increased, its voltage rises. The charge accumulation layer lies in an electrically floating state, so that a voltage of the charge accumulation layer of M1' is increased by the capacitance coupling between the charge accumulation layer of M1' and the charge accumulation layer of M0' as the negative electric charge amount of M0' is increased. This threshold voltage is most increased in the case that the data of M0' adjacent to M1' is "01". In the case that it is "11", the threshold voltage is not changed. Since the data of M0' can take an arbitrary value, "incrementation of the distribution width of the threshold voltage"

occurs as shown by a solid line in FIG. 43. The M0' and M1' are connected to one sense amplifier 46, so that this increasing amount is not capable of being controlled while writing the data in the SE123 according to the conventional example.

Accordingly, if a sequence (SE125) for reading the data of M1' after that, by the above described incrementation of the threshold voltage, the difference between the reading threshold voltage and the writing threshold voltage is decreased. As a result, for example, a probability of mal-reading the data of "10" as "00" and a probability of mal-reading the data of "00" as "01" are increased and the data destruction such that the data of "00" becomes the data of "01" and the data of "10" becomes the data of "00".

Alternatively, it is obvious that a problem in the memory cell belonging to the adjacent row also occurs in a constitution such that one sense amplifier is connected to one data transfer line.

Further, in order to prevent misreading of the data, it is needed that a whole threshold voltage distribution of a cell is enlarged to a higher threshold voltage. In this case, a data retention characteristic of a higher threshold voltage is worsened compared to the data retention characteristic of a lower threshold voltage due to a self electric field of the accumulated electric charge, so that it becomes difficult to obtain a sufficient data retention characteristic.

Further, in a memory cell block of the NAND type formed in such a manner that a memory cell is connected in series as shown in FIG. 38A, it is necessary for a memory cell connected in series to a cell to read the data to apply a voltage higher than the highest value of the whole threshold voltage distribution to a gate. Therefore, by repeating the reading operation, a negative electric charge is injected in the charge accumulation layer and a threshold voltage rises, so that the threshold voltage of "11" is increased and this accounts for the data destruction and the misreading of the data.

As described above, according to a conventionally constituted nonvolatile semiconductor memory, the data is changed by the capacitance coupling if the data is written in the adjacent memory cell.

BRIEF SUMMARY OF THE INVENTION

A data writing method for a semiconductor memory device having a first memory cell block capable of rewriting data and having at least one first memory cell; and a second memory cell block capable of rewriting data and having at least one second memory cell adjoining the first memory cell, according to a first aspect of the present invention includes: writing data into the first memory cell; rewriting the data into the first memory cell when an insufficiency of the data of the first memory cell is determined as a result of verifying the data of the first memory cell at one first reference threshold voltage; writing data into the second memory cell following writing the data into the first memory cell; rewriting the data into the first memory cell following writing the data into the second memory cell when an insufficiency of the data of the first memory cell is determined as a result of verifying the data of the first memory cell at one second reference threshold voltage, and the first reference threshold voltage is set to be different from the second reference threshold voltage.

A data writing method for a semiconductor memory device having a memory cell block capable of rewriting data, the memory cell block having at least two first and second memory cells connected in series or in parallel and adjoined to each other, according to a second aspect of the present invention includes: writing data into the first memory cell; rewriting the data into the first memory cell when an insufficiency of the data of the first memory cell is determined as a result of verifying the data of the first memory cell at one first reference threshold voltage; writing data into the second memory cell following writing the data into the first memory cell; rewriting the data into the first memory cell following writing the data into the second memory cell when an insufficiency of the data of the first memory cell is determined as a result of verifying the data of the first memory cell at one second reference threshold voltage, and the first reference threshold voltage is set to be different from the second reference threshold voltage.

A data writing method for a semiconductor memory device having a memory cell block capable of rewriting data, the memory cell block having at least two first and second memory cells connected in series or in parallel and adjoined to each other, and a data control line of the first memory cell and a data control line of the second memory cell adjoin to each other, according to a third aspect of the present invention includes: writing data into the first memory cell; rewriting the data into the first memory cell when an insufficiency of the data of the first memory cell is determined as a result of verifying the data of the first memory cell at one first reference threshold voltage; writing data into the second memory cell following writing the data into the first memory cell; rewriting the data into the first memory cell following writing the data into the second memory cell when an insufficiency of the data of the first memory cell is determined as a result of verifying the data of the first memory cell at one second reference threshold voltage, and the first reference threshold voltage is set to be different from the second reference threshold voltage.

BRIEF DESCRIPTION OF THE SEVERAL VIEWS OF THE DRAWING

FIG. 1 is a block diagram showing a semiconductor memory device according to a first embodiment of the present invention.

FIGS. 14A, 14B, 14C, 14D, 14E and 14F are circuit diagrams showing circuit examples of a circuit 10.

FIGS. 15A and 15B are tables showing logic of the circuit 10.

FIG. 29 is a circuit diagram showing a circuit example of a sense amplifier 46'.

FIG. 31A is an equivalent circuit diagram showing an example of a memory cell to be used for the semiconductor memory devices according to the first, second and third embodiments of the present invention.

FIG. 31B is a plan view showing an example of a memory cell to be used for the semiconductor memory devices according to the first, second and third embodiments of the present invention.

FIG. 32A is a cross sectional view taken along the line 32A—32A shown in FIG. 31B.

FIG. 32B is a cross sectional view taken along the line 32B—32B shown in FIG. 31B.

FIG. 38A is an equivalent circuit diagram showing a NAND cell.

FIG. 38B is an equivalent circuit diagram showing an AND cell.

DETAILED DESCRIPTION OF THE INVENTION

Embodiments according to the present invention will be explained with reference to the drawings below.

First Embodiment

Figure 2:
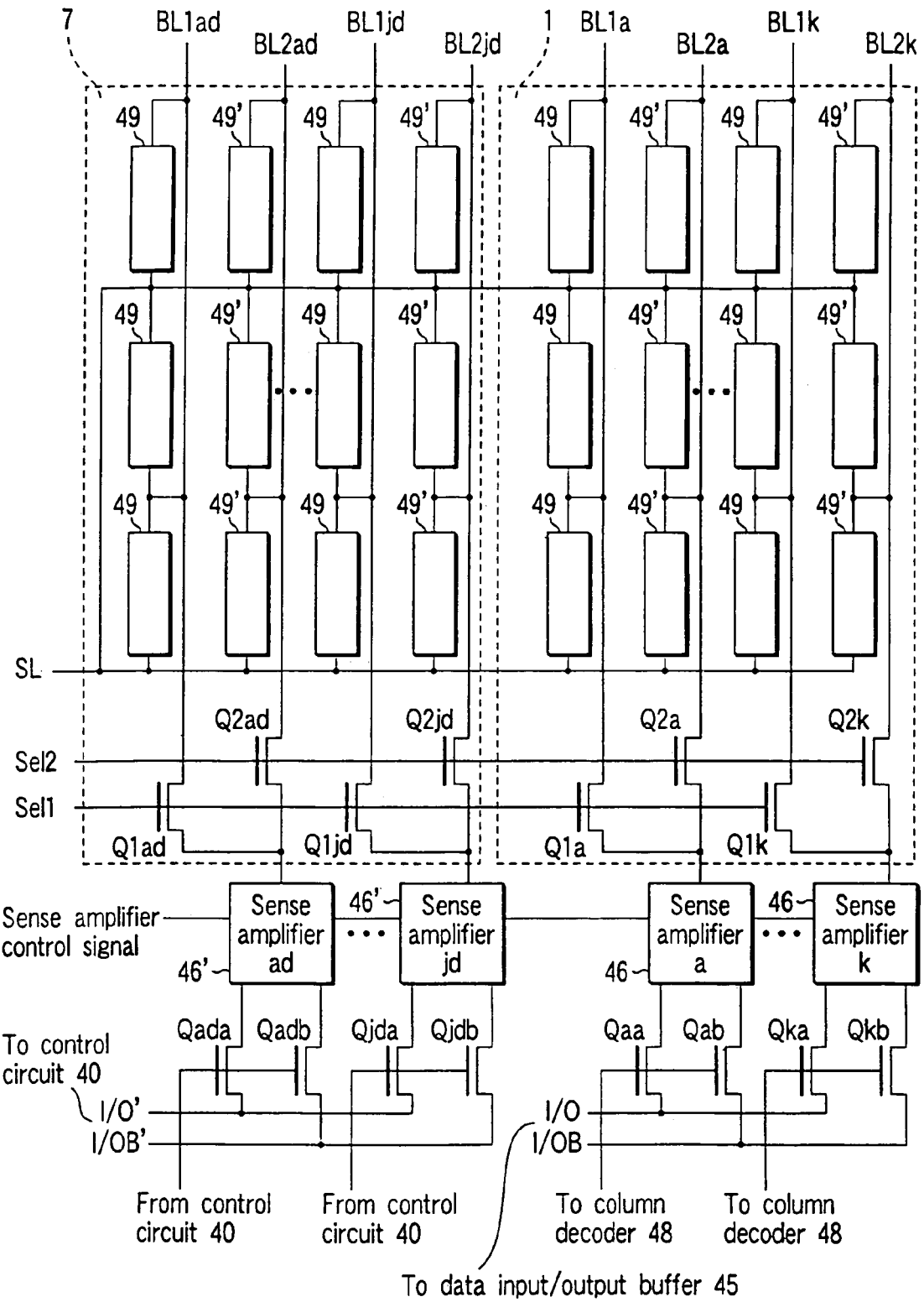
FIG. 2 is a layout diagram showing a layout example of a cell array and a sense amplifier circuit of the semiconductor memory device according to the first embodiment of the present invention.

In FIG. 1 and FIG. 2, a block diagram for illustrating a semiconductor memory device according to a first embodiment of the present invention and a layout example of a cell array and a sense amplifier circuit of the semiconductor memory device according to the first embodiment are shown. Alternatively, in the following explanation, the same reference numerals are given to the same portions as those in FIG. 37 to FIG. 43 and a double explanation is herein omitted. Alternatively, in FIG. 2, in order to simplify the drawing, control gates WL0 to WL15 and block selective gates SSL and GSL, which are shared by memory cell blocks 49 and 49' of a memory cell array 1 and a writing order storage memory cell array 7 in a horizontal direction of a page space.

As shown in FIG. 2, the memory cell array 1 is constructed in such a manner that the memory cell blocks 49 and 49', in which nonvolatile memory cells are connected in series or in parallel, are arranged. In order to sense the data of a data transmission line of this cell array 1 or hold the writing data thereof, sense amplifier circuits 46 are provided. The sense amplifier circuits 46 serve as data registers. For example, the sense amplifier circuits 46 are mainly constituted by a flip-flop circuit. Further, the sense amplifier circuits 46 are connected to a data input/output buffer 45. These connections are controlled by the output of column decoders 48 to receive address signals from an address buffer 47. The data given to the data input/output buffer 45 can be written in the cell array 1 and the data can be read out to the data input/output buffer 45. In order to select a memory cell with respect to the cell array 1, specifically, a row decoder 3 is provided so that it controls the control gates WL0 to WL15 and the block selective gates SSL and GSL.

As shown in FIG. 1, a substrate electric potential control circuit 42 is provided so as to control the electric potential of a p-type well 23 (refer to FIG. 32 or the like) in which the cell array 1 is formed. Particularly, the substrate electric potential control circuit 42 is preferably formed in such a manner that a voltage thereof is boosted to the erasing voltage of 10V or more when it is erased. Further, upon writing the data in the selected memory cells of the cell array 1, a circuit 41a for generating a written voltage Vpgm boosted higher than the source voltage is provided. Other than the voltage Vpgm generating circuit 41a, a circuit 41b for generating a middle voltage Vpass for writing to be applied to unselected memory cells upon writing the data, a circuit 41c for generating a voltage Vread for reading to be applied to unselected memory cells upon reading the data, a Vref generating circuit I 41d to apply a threshold voltage determination voltage of the selected cell and a Vref generating circuit II 41e are provided. The generating circuits are controlled by the control circuit 40 in such a manner that a necessary voltage output is added to a data control line driver 2 in each state of writing, erasing and reading. The voltage Vpgm is a voltage of 6V or more and 30V or less and the voltage Vpass is a voltage of 3V or more and 15V or less. Alternatively, the voltage Vread is a voltage of 1V or more and 9V or less. In the case of a NAND type array, it is preferable that a voltage, which is higher than a upper limit of the writing threshold voltage by 1V, sufficiently secures the reading current and it lowers read disturb. Further, the Vref generating circuit I 41d and the Vref generating circuit II 41e are set in between respective adjoining threshold voltages of the memory cells, for example, the separation threshold voltages of the threshold voltage distribution of "10" and "00". Alternatively, the data control line driver 2 is a switching-circuit, which applies the above described voltage output to the control gates WL0 to WL15, the block selection lines SSL and GSL, which are needed to be written or to be read, in accordance with the output of the row decoder 3.

According to the present embodiment, two Vref generating circuits, namely, 41d and 41e are provided. In the case that the memory cell adjoining each of them is written in advance, 41d and 41e are set so that the output of 41e is higher than the output of 41d by a voltage $\Delta V$. It is preferable that the voltage $\Delta V$ is nearly equal to the rising amount of the threshold voltage of the cell in the case of writing the data in the adjoining cell.

Further, according to the present embodiment, the writing order storage cell array 7 is formed in such a manner that the output of the data control line driver 2 is shared by the cell array 1. Hereby, it is possible to store the writing order in the adjoining memory cell for each data transfer line.

Additionally, one writing order storage cell array 7 is formed with respect to each block 49 in a direction of the data transfer line and respective writing order storage cell arrays 7 are connected to the data transfer line in parallel. The data transfer line is connected to the sense amplifier 46' for evaluating the writing order and storing the writing order and its data register to write, erase, and read the data in the writing order storage cell array 7.

Alternatively, the number of the sense amplifiers 46' for evaluating the writing order and storing the writing order may be the number of the blocks, which need the divided writing, at least. A divided block is shown in FIG. 1 in such a manner that it is divided into four by a dotted line. In this case, it is assumed that there are four divided blocks, however, the number of the divided blocks may be a natural number. It is preferable that the number of the divided blocks is $2^m$ (m=0, 1, 2, . . . ) from a stand point of address decoding. If the sense amplifiers 46' not less than ($2^m$+m+1) are prepared assuming that the number of the divided blocks is $2^m$, it is possible to correct one bit error of the writing order storage cell array 7, for example, by using a Hamming code, so that the sense amplifiers 46' not less than ($2^m$+m+1) are preferable. It is assumed that the number of the sense amplifiers included in the writing order storage cell array 7 as j below.

Further, an input and an output of the sense amplifier 46' are connected to the control circuit 40, which controls reading and writing in accordance with the writing information of the cell. Additionally, an address to map a physical address and a logical address of the cell in accordance with the writing-order information of the cell is referred to as "adda" and this comprises an input of the control circuit 40. Further, an output of the control circuit 40 is connected to an erasing verify control circuit 4 for controlling a position at which the data is erased and verified in accordance with the position information of the divided page. Additionally, the output of the erasing verify control circuit 4 is connected to the column decoder 48 divided into each divided page as a divided page sense amplifier selective signal. Although they are not illustrated in the drawing in order to simplify the drawing, a control signal for controlling the operation of the sense amplifier and control signals sel1 and sel2 are connected from the control circuit 40 to the column decoder 48.

Next, a constitution of a memory cell to be used in the first embodiment will be described. A constitution of a memory cell to be described below is also capable of being used in second and third embodiments described later.

FIGS. 31A and 31B are an equivalent circuit diagram of the NAND cell block 49 and a plane view thereof, respectively. Since a constitution of the NAND cell block 49' is the same as that of the NAND cell block 49, the constitution of the NAND cell block 49 represents the constitution of the NAND cell block 49' below.

FIG. 31B illustrates a constitution such that three cell blocks shown in FIG. 31A are arranged in parallel. Particularly, for promoting better understanding of the cell constitution, FIG. 31B only illustrates a constitution below a control gate electrode 27.

In FIG. 31A, nonvolatile memory cells M0 to M15 comprising a MOS transistor having an electric charge accumulation electrode 26 are connected in series and one end thereof is connected to a data transfer line denoted as BL via a block selection transistor S1 and the other end thereof is connected to a common source line denoted as SL via a block selection transistor S2. Alternatively, respective transistors are formed on the same p-type well 23 and respective control electrodes of the memory cells M0 to M15 are connected to the data selection lines denoted as WL0 to WL15. In order to select one memory cell block among a plurality of memory cell blocks along the data transfer line and connect it to the data transfer line, the control electrode of the block selection transistor S1 is connected to the memory cell block selection line SSL. Further, the control electrode of the block selection transistor S2 is connected to the memory cell block selection line GSL. In this way, a so-called NAND type memory cell block 49 (an area represented by a dotted line) is formed. In this case, according to the present embodiment, the control wires SSL and GSL of the selective gate are formed with being connected to the cell adjoining in a horizontal direction of a page space by a conductive body in the same layer as the electric charge accumulation electrode 26 of the control wires WL0 to WL15 of the memory cell. In this case, at least not less than one block selection line of SSL and GSL may be sufficient. For example, the block selection line of SSL and GSL may be formed in the same direction as that of the data selection lines WL0 to WL15 for the high density. According to the present embodiment, an example is shown such that $16=2^4$ pieces of the memory cells are connected to the cell block 49. However, the number of the memory cells to be connected to the data transfer line and the data selection line may be a plural number. For example, the number thereof may be $2^n$ (n is a positive integer number) for the address decoding.

FIG. 32A is a cross sectional view taken along the line 32A—32A shown in FIG. 31B and it is equivalent to a cross sectional view of a memory cell portion. FIG. 32B is a cross sectional view taken along the line 32B—32B shown in FIG. 31B.

In FIG. 31B, FIG. 32A and FIG. 32B, for example, on a p-type silicon region (p-type well) 23 with a density of boron impurities lying in the range of $10^{14}$ cm$^{-3}$ to $10^{19}$ cm$^{-3}$, for example, charge accumulation layers 26, 26SSL and 26GSL composed of polycrystalline silicon doped with $10^{18}$ cm$^{-3}$ to $10^{21}$ cm$^{-3}$ of phosphor or arsenic are formed with a thickness of 10 nm to 500 nm for example, via a tunnel gate insulation film with a thickness of 3 nm to 15 nm formed by silicon oxide films or oxynitride films 25, 25SSL and 25GSL. These charge accumulation layers are formed, for example, on an area in which an element isolation insulation film 24 composed of silicon oxide film is not formed, with being self-alignment to the p-type silicon region 23. For example, these charge accumulation layers can be formed in such a manner that the silicon oxide or oxynitride film 25 and the charge accumulation layer 26 are patterned after being accumulated entirely on the p-type silicon region 23 and further, the film 25 and the layer 26 are etched to, for example, the depth of 0.05 μm to 0.5 μm and the insulation film 24 is embedded in the etched portion. Thus, it is possible to form the silicon oxide or oxynitride film 25 and the charge accumulation layer 26 on a flat face without a step, so that it is possible to form a film, of which uniformity is improved and of which property is uniformed.

On this film, the control gate 27 is formed with a thickness of 10 nm to 500 nm comprising a stack constitution of polycrystalline silicon doped with $10^{17}$ cm$^{-3}$ to $10^{21}$ cm$^{-3}$ of phosphor, arsenic or boron, or a stack constitution of NiSi, MoSi, TiSi, CoSi and polycrystalline silicon, for example, via block insulation films 50, 50SSL and 50GSL. The block insulation films 50, 50SSL and 50GSL have a thickness in the range of 5 nm to 30 nm and composed of a silicon oxide film, or an oxynitride film, or an insulation film including a silicon oxide film, a silicon nitride film and a silicon oxide film. The control gate 27 is formed up to a block boundary in a horizontal direction of a page space in such a manner that it is connected to the adjoining memory cell block in FIG. 31B and the control gate 27 forms the data selection lines WL0 to WL15. For example, the p-type silicon region 23 can be applied with a voltage by an n-type silicon area 22 independently of the p-type substrate 21 for decreasing a boosting circuit load upon erasing the data and suppressing the electric power consumption. Alternatively, upon writing the data, it is possible to use an FN tunneling current, so that it is possible to suppress the electric power consumption with higher efficiency than that upon writing the data by a hot electron current. In a gate shape according to the present embodiment, a side-wall of the p-type silicon region 23 is covered with the insulation film 24, so that the side-wall is not exposed by the etching before a floating gate electrode 26 is formed. As a result, it is possible to prevent the gate electrode 26 from being lower than the p-type silicon region 23. Therefore, a parasitic transistor, of which gate electric field concentration and threshold voltage are lowered, is hardly generated in a boundary between the p-type silicon region 23 and the insulation film 24. Further, a phenomenon such that the writing threshold voltage arising from the electric field concentration, namely, so-called sidewalk phenomenon is hardly generated, so that it is possible to form a transistor with higher reliability.

As shown in FIG. 32B, at the opposite sides of these gate electrodes, for example, n-type diffused layers 28 as a source or a drain electrode are formed with interposing a side-wall insulation film 43 composed of a silicon nitride film or a silicon oxide film with a thickness of 5 nm to 200 nm. By the n-type diffused layers 28, the charge accumulation layer 26 and the control gate 27, a floating gate type EEPROM cell, of which information amount is the potential amount accumulated in the charge accumulation layer 26, is formed. A gate length of the floating gate type EEPROM cell is defined in the range of 0.01 $\mu$m or more and 0.5 $\mu$m or less. The n-type diffused layers 28 as the source or the drain electrodes are formed at the depth in the range of 10 nm to 500 nm so that, for example, a surface density of phosphor, arsenic and antimony becomes $10^{17}$ cm$^{-3}$ to $10^{21}$ cm$^{-3}$. Further, these n-type diffused layers 28 are shared by the adjoining memory cells, so that the NAND connection is realized.

Alternatively, in the drawing, reference numerals 26SSL and 26GSL denote the gate electrodes, which are connected to the block selection line and are equivalent to SSL and GSL, respectively. The gate electrodes 26SSL and 26GSL are formed by the same layer as the floating gate electrode of the above described floating gate type EEPROM. The gate lengths of the gate electrodes 26SSL and 26GSL are longer than the gate length of the gate electrode of the memory cell. If the gate lengths thereof are defined in the range of 0.02 $\mu$m or more and 1 $\mu$m or less, it is possible to obtain a sufficient on/off ratio between the case that the block is selected and the case that it is not selected largely and it is possible to prevent miswriting and misreading.

An n-type diffused layer 28d as a source or drain electrode formed at one side of the control gate 27SSL, are connected to a data transfer line 36 (BL) composed of, for example, tungsten, tungsten silicide, titanium, titanium nitride, or aluminum via a contact 31d. In this case, the data transfer line 36 (BL) is formed up to a block boundary in a vertical direction of a page space in such a manner that it is connected to the adjoining memory cell block in FIG. 31B. On the other hand, an n-type diffused layer 28S as a source or drain electrode formed at one side of the control gate 27GSL, are connected to a source line SL via a contact 31s.

The source line SL is formed up to a block boundary in a horizontal direction of a page space in such a manner that it is connected to the adjoining memory cell block in FIG. 31B. It is a matter of course that the n-type diffused layer 28S is formed up to a block boundary in a horizontal direction of a page space to form a source line. As these BL contact and SL contact, for example, a conductive material such as polycrystalline silicon doped in an n-type or a p-type, tungsten, tungsten silicide, Al, TiN, Ti or the like, are used and these conductive materials are filled in a contact hole to form a conductor region. Further, the space between these SL and BL and the transistor is filled by, for example, the interlayer insulation film 37' composed of SiO$_2$ and SiN. Alternatively, on the upper portion of this BL, for example, an insulation film protective film 37 composed of SiO$_2$, SiN or polyimide and an upper wire composed of W, Al and Cu (not shown) are formed.

FIG. 2 shows a layout example of the memory cell array 1 including a sense amplifier circuit and the sense amplifier 46, and the memory cell array 7 and the sense amplifier 46'. Although the data selection lines WL0 to WL15 and the block selection lines SSL and GSL are omitted in order to simplify the drawing in FIG. 2, these are shared by the memory cell blocks 49 and 49' in the horizontal direction of a page space.

In FIG. 2, the reference numerals BL1x, BL2x (x=a, b, c . . . k) denote data transmission lines. The memory cell blocks 49 and 49' shown in FIG. 2 are connected to these data transmission lines, respectively and these data transmission lines are connected to one sense amplifier x via Q1x and Q2x. Additionally, the subscripts such as a, b, . . . k are indices which are conveniently attached for representing a plurality of layouts and a total number of the indices may be any number if it is a plural number. FIG. 2 shows a constitution such that two indices are arranged in the data transfer line direction and the data selection line direction, respectively, the number thereof may be a plural number in order to prevent the influence by the capacitance coupling of the memory cells adjoining in the data selection line direction. The number thereof may be $2^i$ (i is a positive integer number) for the address decoding. Further, in the sense amplifier, a transistor, which is larger than one memory cell, is required, so that one sense amplifier 46 is shared by a plurality of the data transfer lines and an area shared by the sense amplifier is contracted. Although FIG. 2 shows that there are provided two data transfer lines BL to be connected to one sense amplifier, for example, the number thereof may be one or four and it is that the number thereof may be $2^n$ (n is a natural number) for simplifying an address decoding circuit. In the case that there are two data transfer lines BL, two cells adjoining at the opposite sides in a row direction in an arbitrary data memory cell are capable of reading the data simultaneously. Therefore, it is possible to read the data of the two adjoining memory cells at once and to decrease the influence of the threshold voltage of the cells adjoining in the row direction, so that it is possible that the data reading time is contracted, the number of the adjoining data buffers is decreased and the circuit can be simplified.

Further, in order to prevent the influence by the capacitance coupling of the memory cells adjoining in the data selection line direction, one sense amplifier 46 may be connected to each one data transmission line. Additionally, the sense amplifier 46 is for reading the data of the memory cell and it serves as a data register, which temporarily holds the data to be written in the memory cell. The sense amplifiers 46 are connected in common via the data line I/O, the I/OB and Qxa and Qxb (x=a, b, c . . . k) to connect the written data and the read data to the data input/output buffer 45, respectively. In this case, for example, the I/O and the I/OB are formed in a row direction of the cell in order to decrease the capacitance coupling noise to the data transfer line by the voltage alternation of the I/O and the I/OB. Moreover, the wiring area can be contracted.

Further, in FIG. 2, BL1xd and BL2xd (x=a, b, c . . . , j) denote data transfer lines connected to a memory cell for storing the writing order of the cell. In this case, the cell blocks 49 and 49' belonging to the memory cell array 7 for storing the writing order of the cell are capable of being formed by the same constitution as those of the cell blocks 49 and 49' belonging to the memory cell array 1. In this case, the cell blocks 49 and 49' included in the memory cell array 7 are formed on the p-type silicon region (the p-type well) 23, which are identical with the memory cell blocks 49 and 49' on the memory cell array 1 in order to decrease the varieties of the memory cell properties, since the memory cell included in the memory cell array 1 can be identified with the memory cell included in the memory cell array 7.

Additionally, the sense amplifier 46' is for reading the data of the memory cell for storing the writing order and it serves as a data register which temporarily holds the data to be written in the memory cell. The sense amplifier 46' are connected in common via the data lines I/O' and I/OB' and Qxda and Qxdb (x a, b, c . . . j) to connect the written data and the read data to the control circuit 40, respectively. Further, the gate electrodes of Q1xd and Q1x are connected to the control line sel1 in common in the horizontal direction of the page space of FIG. 2 and the gate electrodes of Q2xd and Q2x are connected to the control line se12 in common in the horizontal direction of the page space of FIG. 2. Hereby, it is possible to control the data selection line in a small wiring area by the use of sel1 and se12.

According to the first embodiment of the present invention, compared to a conventional example such that the memory cell 7 for storing the writing order of the cell is not formed, at the cell array portion 1 in FIG. 2, the data transfer line direction is not elongated, so that it is possible to keep the circuit area small. Further, in FIG. 2, the sense amplifier control signal can be shared by 46 and 46' and the sense amplifier control signal can be constituted so as to program, erase and read the writing order storage cell 7 and the data storage cell 1 simultaneously with respect to the memory cell connected to the same data selection line. Such a constitution enables to extremely decrease the increment of the number of the signal line for the sense amplifier and the memory cell array even if the writing order storage cell area 7 is formed. In the circuit shown in FIG. 2, only (the number of the divided blocks+2) pieces of the wires are formed up to the outside and are increased than the conventional example, namely, the minimum Qxda driving lines needed for the number of the divided blocks and I/O' and I/OB' lines are formed up to the outside and are increased than the conventional example. If the same wiring layer as the conventional BL is used for wiring, the wiring layer is not increased compared to the conventional example and it is possible to easily layout the wires. Further, the well division is not needed between the writing order storage cell area 7 and the memory cell array 1, so that this overhead space is capable of being kept small.

In this case, in the present embodiment, the sense amplifier and the data registers 46 and 46' are omitted since they are substituted by a sense amplifier circuit capable of being verified for each bit which is well-known by, for example, Jpn. Pat. Appln. KOKAI Publication No. 7-182886 (U.S. Pat. No. 5,452,249) and a sense amplifier according to a third embodiment to be described later. The entire contents of U.S. Pat. No. 5,452,249 is incorporated herein by reference.

Figure 3:
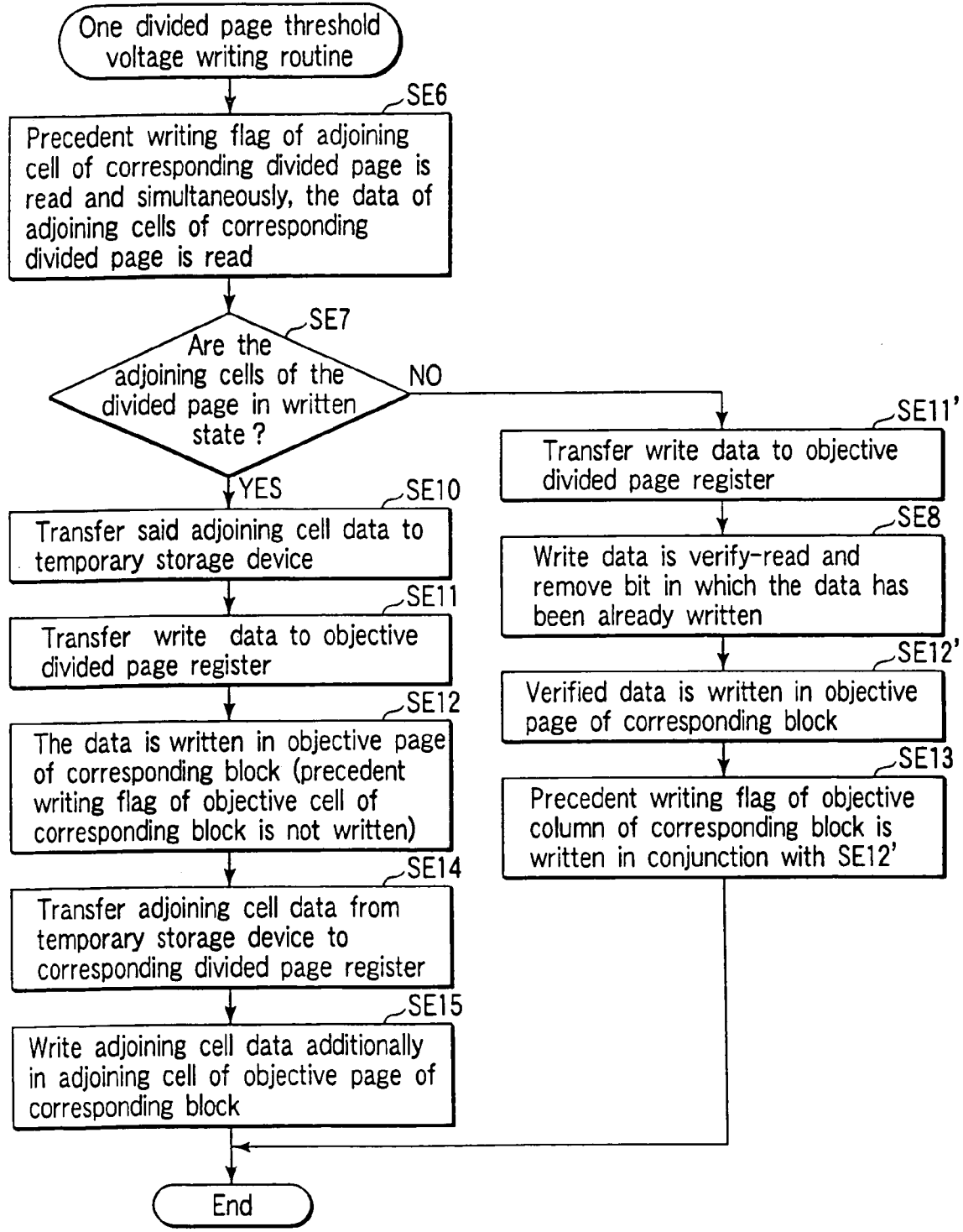
FIG. 3 is a flowchart showing the data writing operation of the semiconductor memory device according to the first embodiment of the present invention.
Figure 4:
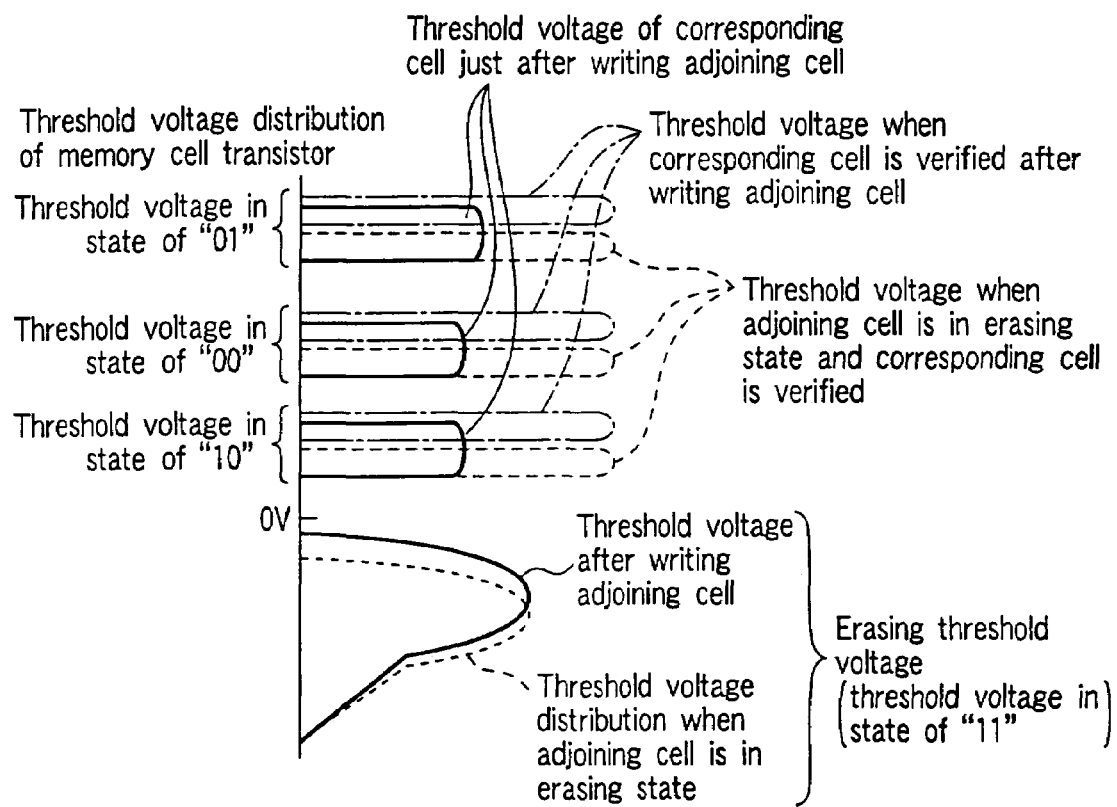
FIG. 4 is a diagram showing a threshold voltage distribution with respect to setting of the threshold voltage shown in FIG. 3.

Next, the data writing operation according to the present embodiment will be explained with reference to FIG. 3 and FIG. 4 below. It is assumed that "0" denotes a state that a carrier, for example, an electron is injected in an charge accumulation layer (the floating gate electrode) 26 to raise a threshold voltage and "1" denotes a state that a carrier is not injected in the floating gate electrode 26 and the threshold voltage is kept lower below. Alternatively, in a state having 4 values, the erasing state is denoted as "11" and the writing states are denoted as "10", "00" and "01" in sequence from the state of which threshold voltage is lower. By so-called gray code like this, even if the error reading is generated in a distribution in which the threshold voltages are adjoining, the error of 2 bits is not generated, so that the data error ratio can be lowered.

In this case, it is assumed that the data of the memory cell block for writing the data has been already erased by, for example, a well-known method to draw out the electron of the floating gate electrode 26 and it is in the state "1" or the state "11". Further, it is assumed that the initial values in the data registers within the sense amplifiers 46 and 46' are in the data erasing state. It may be obvious that the states of "1" and "0" are capable of being easily inverted by the use of the inversion of the voltage appropriately.

Additionally, a memory cell will be described by the use of a reference numeral shown in FIG. 38. In this case, in order to promote better understanding of the explanation, for example, a case is considered such that the data of 4 values is written in the memory cell M1' connected to BL2a. Alternatively, it is assumed that 2 values are sufficient for the correspond precedent written flags in FIG. 3 and FIG. 4 and in the precedent written flag in the same page as the memory cell M1', the state of "00" or the state of "01" denotes a case that the data is written in advance in the memory cell M1' than in the adjoining memory cell M1 and the state of "11" denotes other cases. On the other hand, in the precedent written flag in the same page as the memory cell M1, the state of "00" or the state of "01" denotes a case that the data is written in advance in the memory cell M1 than in the adjoining memory cell M1' and the state of "11" denotes other cases.

At first, the data of the memory cell M1 of the data transfer line BL1a adjoining BL2a is read to the data register in the sense amplifier 46. In this case, the memory cell M1 is a memory cell formed adjoining the memory cell M1' and belongs to the same divided block. The above operation allows the data of the memory cells of BL1x (x=a, b, . . . k) to be read simultaneously. In this time, the data of the writing order storage cell connected to BL1x (x=a, b, . . . j) is read to the data register in the sense amplifier 46' simultaneously (SE6). In this case, for example, a reference threshold voltage to discriminate the read data may be higher than a upper limit of a threshold voltage in the state of "11" and lower than a lower limit of a threshold voltage in the state of "01". However, it may be at the about midpoint of the lower limit of the threshold voltage in the state of "00" and the upper limit of the threshold voltage in the state of "10" since a margin can be secured most easily. This reading operation enables the information indicating whether the writing order storage cell is in the writing state, namely, the state of "00" or the state of "01" or not in the data register in the sense amplifier 46'.

Next, by discriminating the data of the sense amplifier 46' by the control circuit 40, it is determined whether the writing order storage cell is in the state of "00" or in the state of "01" (SE7). In the case that the writing order storage cell is in the state of "11", the data is not written in the adjoining cell M1, so that the writing operation is performed with respect to the memory cell M1' just as it is. In other words, after making the page register 46 into the initial value of the erasing state, the written data is transferred from the outside I/O to an objective divided page 46 (SE11') and further, the precedent written flags is made into "01" or "00", namely, the writing state to be transferred to the data register in the sense amplifier 46' from the control circuit 40.

After that, the verify reading is performed with respect to the cells including the cell M1' (SE8) and then, with respect to the precedent written flag belonging to the same page as the cell M1', the data is additionally written merely in the erasing bit simultaneously (SE12', SE13). A sequence SE8 serves to decrease the application of the writing stress of the tunnel insulation film 25 so that the writing threshold voltage is not extremely increased by rewriting the data in the precedent writing flag in which the data has been already written.

In the case that the writing order storage cell is in the state of "0" in SE7, the data has been already written in the adjoining cell M1. In this case, for example, after a page of the data read by SE6 is rested in a temporary storage device through the data input/output buffer 45 (SE10) and the page register 46 is made into the initial value in the erasing state, the written data is transferred from the outside I/O to an objective divided page register 46 (SE11) and further, the precedent written flag is made into "11", namely, the non-writing state to be transferred to the data register from the control circuit 40 in 46'. The data is additionally written in the precedent written flag belonging to the same page as M1' simultaneously (SE12). In this case, FIG. 4 shows a threshold voltage distribution of M1 in the case that the written data is a threshold voltage of 4 values. Before the sequence of SE12, the threshold voltage is distributed as shown by a broken line in FIG. 4. However, as described according to a conventional example, after SE12, the threshold voltage is partially increased by the capacitance coupling. Then, the distribution width of the threshold voltage is widened as shown by a solid line in FIG. 4. Then, according to the present embodiment, for example, the data including a page of the data of M1 rested in SE10 is transferred from the temporary storage device through the data input/output buffer 45 (SE14) and further, the precedent flag is made into "11", namely, the non-writing state to be transferred from the control circuit 40 to the data register in the sense amplifier 46'. Further, by verify-writing the data of M1 additionally, as shown by a dashed line in FIG. 4, the minimum value of the threshold voltage distribution is increased as the maximum value thereof is kept substantially at a certain value so that the distribution width thereof is narrowed (SE15). Hereby, it is possible to increase the separation width of the threshold voltage distribution in the writing state. Therefore, if the reference threshold voltage to discriminate the read data is changed in accordance with the precedent written flag, a voltage margin of the threshold voltage is capable of being secured. In this case, the change amount of the threshold voltage of a cell by the sequence of SE12 is changed from the state of "11" to the state of "01". Particularly, with respect to the erasing state of "11", it is difficult for the sense amplifier for measuring a positive threshold voltage to determine a threshold voltage at a negative side since an operational point thereof is changed, the change amount of the threshold voltage is spread to 2V or more. Therefore, although the change amount of the threshold voltage from the state of "11" to the state of "01" is large, i.e., 4V or more, compared to this value, the change amount of a threshold voltage of a cell by the sequence of SE15 is small, i.e., nearly equal to a width of the threshold voltage distribution (<0.5 V). Therefore, it is possible to sufficiently suppress the influence due to the rise of the threshold voltage of M1' in SE15, i.e., not more than 0.5 V/4V to 0.125 times as the conventional example.

It is a matter of course that the temporary storage device shown herein may be a data register that is formed in the sense amplifier 46. However, if the temporary storage device is the data register, it is possible to better shorten a time period taken for the data transfer and to better decrease electric power consumption necessary for activating the data line I/O.

Next, the operation for reading the data according to the present embodiment will be described with reference to FIG. 5 and FIG. 6.

In this case, in order to promote better understanding of the operation, for example, a case is considered such that the data is read from the memory cell M1' connected to BL2a. At first, the data of the memory cell M1 of the data transfer line BL1a adjoining BL2a is read to the data register in the sense amplifier 46. In this case, M1 is a memory cell belonging to the same divided block and it is formed adjoining M1' in a row direction. In this case, at the same time, the data of the writing order storage cell connected to BL1ad is read to the data register in the sense amplifier 46' (SE1). In this case, for example, a reference threshold voltage to discriminate the read data may be higher than a upper limit of the threshold voltage of "11" and lower than a lower limit of the threshold voltage of "10". By this read operation, information representing whether or not data has been written in memory cells M1 can be stored in the data register of the sense amplifier 46', and it can be checked whether or not all data in memory cells M1 of the divided block are in the erased state.

Then, by determining the data of the sense amplifiers 46 and 46' by the control circuit 40, it is determined whether or not the data is written in M1 earlier than in M1' (SE2). In a case where the writing order storage cell is in the "00" or "01" state (which means that the cell is in the data-written state), or where the data of the memory cells M1 of the divided block are all "11" (which means that the memory cells M1 are in the data-erased state), data has not been written in memory cell M1, after written in memory cells M1'. In this state, the reference threshold voltage to discriminate the read data is set at the first setting value (SE4), and data is read out from memory cell M1'. As shown in FIG. 6, for example, this first reading threshold voltage lies at a substantially mid point between the separation widths of the threshold voltages so that when the adjoining cell lies in the threshold voltage distribution in a memory cell in the erasing state of "11", a reference threshold voltage to discriminate the read data can enter in the threshold voltage separation width. In a case where the writing order storage cell is in the "11" state and where at least one of the data of the memory cells M1 of the divided block is not "11", data has been written in memory cell M1', and data has been written in memory cells M1. In this state, the reference threshold voltage to discriminate the read data is set as the second setting value (SE3), and data is read out from memory cell M1'. As shown in FIG. 6, for example, this second reading threshold voltage lies at a substantially mid point between the separation widths of the threshold voltages so that, assuming the threshold voltage distribution in the present memory cell M1' after the data is additionally written in the adjoining cell in accordance with SE10 to SE15, a reference threshold voltage to discriminate the read data can enter in the threshold voltage separation width. As being obvious from FIG. 6, the second threshold voltage rises than the first threshold voltage by ΔV. The ΔV is substantially equal to a value obtained in such a manner that (threshold voltage in the case that the adjoining cell is in the state of "01")–(threshold voltage in the case that the adjoining cell is in the state of "11").

As described above, the reading operation and the writing operation can be used not only in the case that the adjoining cell is in the row direction, namely, the M1 cell with respect to M1', but also in the case that the adjoining cell is in a column direction, namely, M0' and M2' with respect to M1'. In this case, the M1 portion of the above described writing sequence may be read as M0' or M2' and BL2x may be read as WL1 and BL1x may be read as WL0 or WL2.

Alternatively, according to an article, "IEEE Electron Device Letters, 13, No. 1, pp. 32–34 (1992)" by J. H. Chern et al., it is publicly known that a capacitance C between the charge accumulation layers sharing a source drain electrode and adjoining in its direction is in proportion to a following mathematical expression when a thickness of the charge accumulation layer is T, a space between the charge accumulation layers is S, a length in a source/drain direction of the charge accumulation layer is W and a thickness of the tunnel insulation film is 1/10 or less of the space between the charge accumulation layers.

$$C \propto 1.064 \left(\frac{T}{S}\right)\left(\frac{T}{T+0.5S}\right)^{0.695} + \left(\frac{W}{W+0.8S}\right)\left(\frac{T}{T+0.5S}\right)^{0.804}$$

In the above mathematical expression, when T<0.5S, an electric field of the charge accumulation layer ends at the source/drain layer, so that the above mathematical expression indicates that the capacitance between the charge accumulation layers gets smaller by the amount of {T/(T+0.5S)}. On the contrary, in the case of T>0.5S, an electric field cutoff effect due to the source/drain from the charge accumulation layer is weakened, so that the capacitance between the charge accumulation layers is rapidly increased to the case of T<0.5S and the threshold voltage variation between the adjoining cells is increased. In the other words, according to the present invention, the adjoining memory cells share the source/drain electrode. Spacing S between these charge accumulation layers particularly brings about an effect when the spacing S is twofold or less of the thickness T of the charge accumulation layer.

Some advantages obtained from the present embodiment will be indicated below.

(1) According to the present embodiment, the verify writing is performed with respect to all of the written data of the adjoining memory cells. Therefore, even after writing the data in the adjoining memory cells, it is possible to keep the threshold voltage distribution width smaller.

(2) It is not necessary to erase the memory cell after erasing the block initial value, so that it is possible to keep the threshold voltage distribution width smaller only in the writing. Therefore, recovery time after long erasing time, which is necessary for an electric potential of a well is returned to 0V in a flash memory, is not needed, so that it is possible to perform the writing operation at a high speed. Alternatively, a circuit for applying a negative voltage to a gate is also unnecessary, so that it is possible to simplify the constitutions of the circuit of the data control line driver 2 and the well. Particularly defining a period taken for reading the data as tR, a period taken for writing the data including the verify as tW and a period taken for transferring the data to the temporary storage device as tt, it takes a shorter period for discriminating the writing flag compared to tW, so that it is possible to write the data during a period of (tR+2×tW+2×tt) at the very most.

(3) Compared to a temporary storage device of two pages according to a second embodiment to be described later, a page is sufficient for the temporary storage device according to the present embodiment, so that it is possible to make an area of the temporary storage device smaller and decrease the electric power consumption.

(4) Compared to a case of erasing the data according to the second embodiment to be described later, the erasing stress and the rewriting stress are not applied to a divided page in which the data is not written, so that it is possible to realize a memory cell with higher reliability.

(5) Compared to a third embodiment to be described later, the present embodiment is capable of being applied to a case of storing the data of 2 values in a memory cell.

(6) Since the writing order storage cells are provided for the divided blocks, respectively, it is possible to arbitrarily determine the writing order for each divided block and further, it is possible to correct the threshold voltage.

Alternatively, the writing order storage cell array 7 may store the 2 values even if the data of the memory cell array 1 has many values of 2 values or more, so that the writing order storage cell array 7 can obtain a sufficient threshold voltage margin and it is possible to decrease a probability of misreading and a probability of the data destruction in the writing order storage cell array 7.

Second Embodiment

Figure 7:
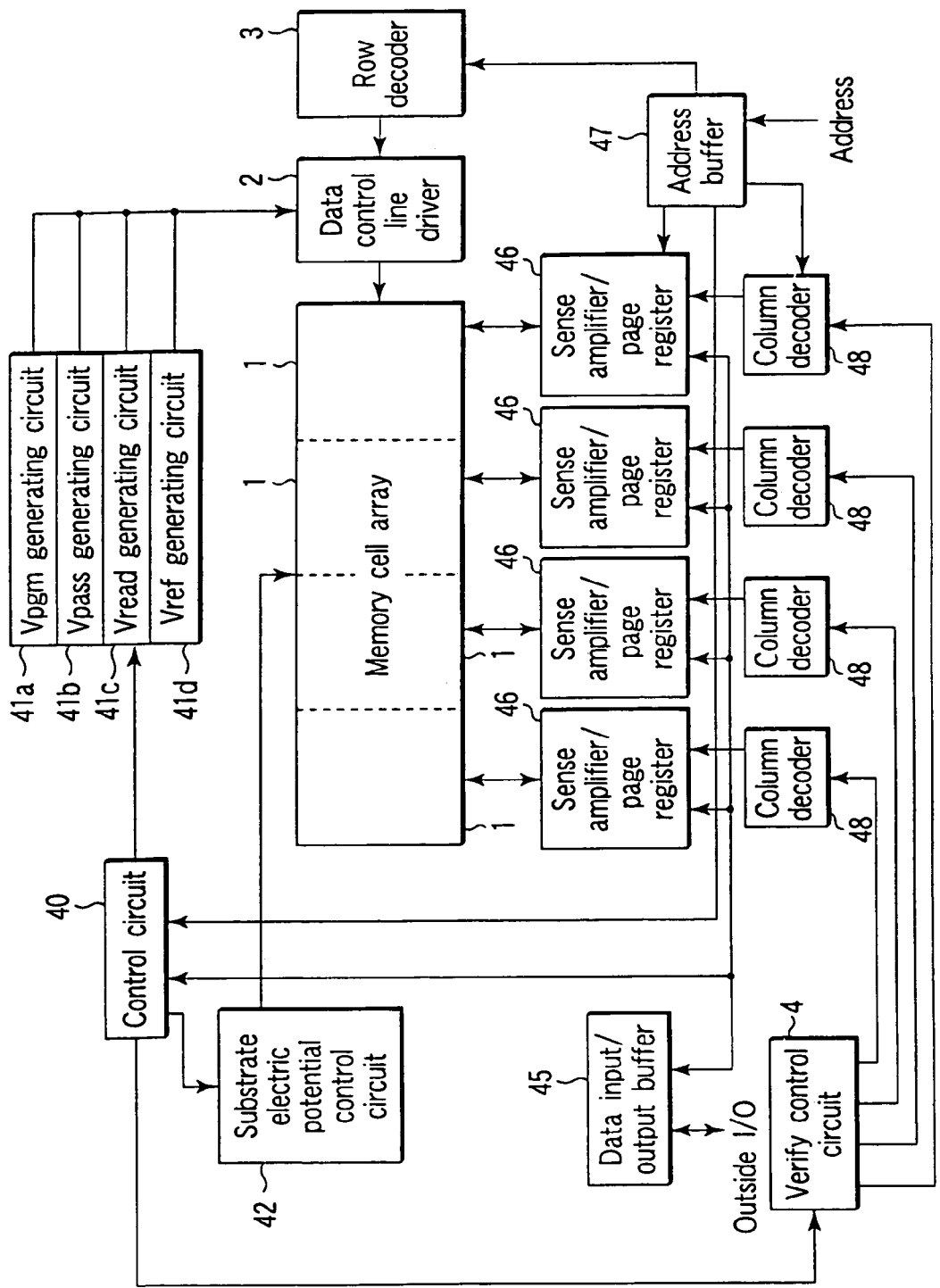
FIG. 7 is a block diagram showing a semiconductor memory device according to a second embodiment of the present invention.

FIG. 7 is a block diagram for illustrating a second embodiment according to the present invention.

The present embodiment is substantially the same as the first embodiment. However, the present embodiment is different from the first embodiment in that the writing order storage memory cell array 7, the sense amplifier 46 and a Vref circuit 2 (41e) are not formed. Further, a sequence of the writing of the present embodiment is different from that of the first embodiment. Alternatively, according to the present embodiment, the same portions as those of the first embodiment and the same voltage relations as those of the first embodiment are provided with the same reference numerals and the detailed explanations thereof are herein omitted.

In FIG. 7, a data input/output I/O line or I/OB is connected to the control circuit 40. Alternatively, a signal output is connected to a circuit for controlling a substrate voltage from the control circuit 40 to control timing for performing weak erasing in SE126 to be described later.

In the following explanation, an ON state of a transistor indicates that a voltage, which is larger than a threshold voltage of the transistor, is added to a gate electrode, and a source electrode of MISFET and a drain electrode are in a conductive state. Further, an OFF state of the transistor indicates that a voltage, which is smaller than a threshold voltage of the transistor, is added to a gate electrode, and the source electrode of MISFET and the drain electrode are in a cutoff state. Alternatively, the threshold voltage of the transistor is defined as a gate voltage in the case that the currents flowing through the source electrode and the drain electrode have values of, for example, 40 nA×(channel width)/(gate length). Additionally, according to the present embodiment, a constitution of a normal CMOS logical circuit is simple, so that a transistor having a positive threshold voltage will be explained as an example. In the case that particular reference is not made, for example, if a positive voltage of Vcc within a range of 0.5V to 15V is given as a control voltage, it is assumed that a logic is defined as "H" and a circuit is in the ON state. For example, in the case that a voltage GND of 0V is given as a control voltage, it is assumed that logic is defined as "L" and a circuit is in the OFF state. It is obvious that a threshold voltage may be included in a variable range of a gate voltage even if the threshold voltage uses a negative transistor.

According to the present embodiment, by adjusting a threshold voltage after writing the data in the adjoining cells and a threshold voltage in a state that the adjoining cells are erased, for example, the reference threshold voltage to discriminate the read data are unified.

Figure 8:
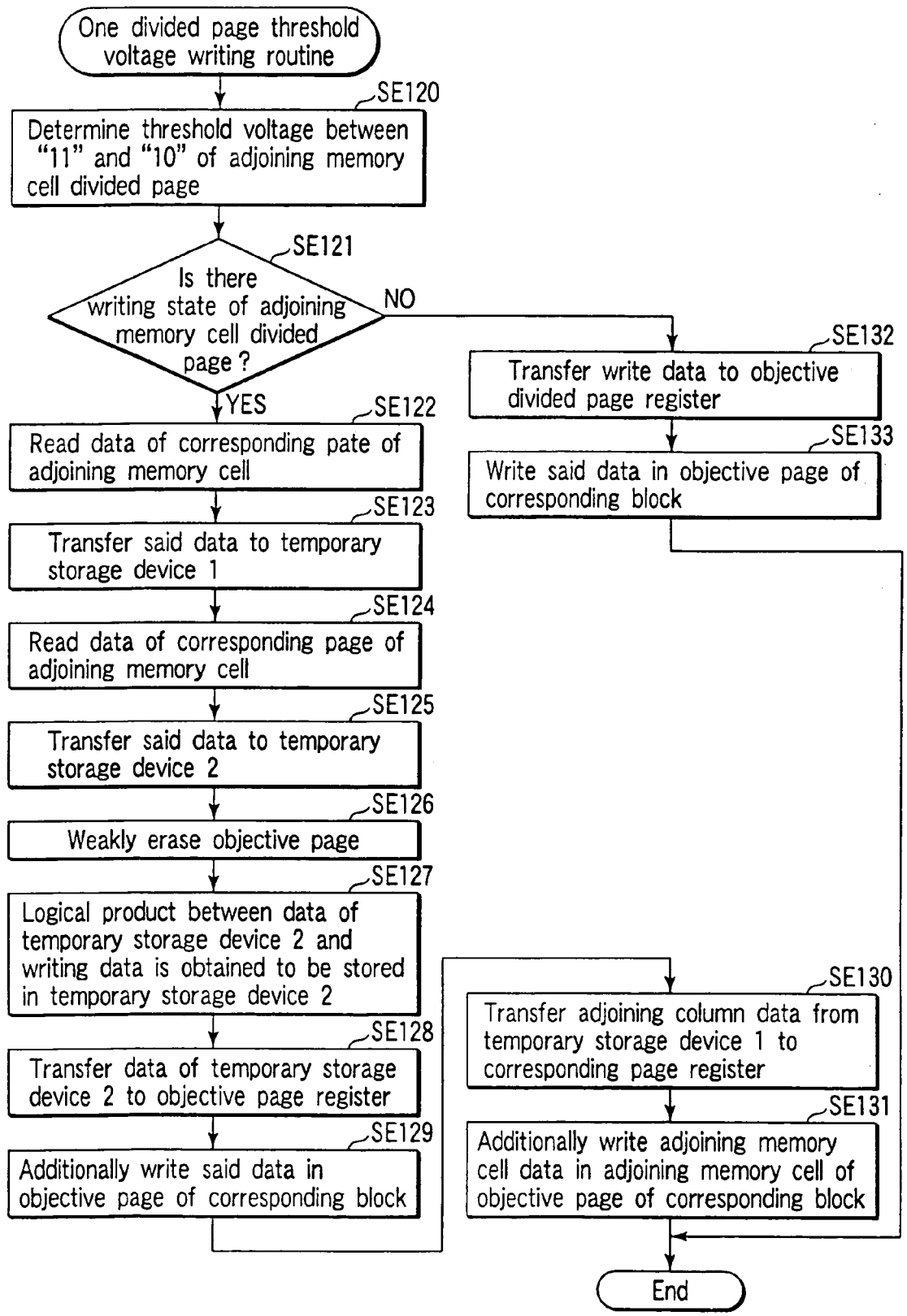
FIG. 8 is a flowchart showing the data writing operation of the semiconductor memory device according to the second embodiment of the present invention.
Figure 9:
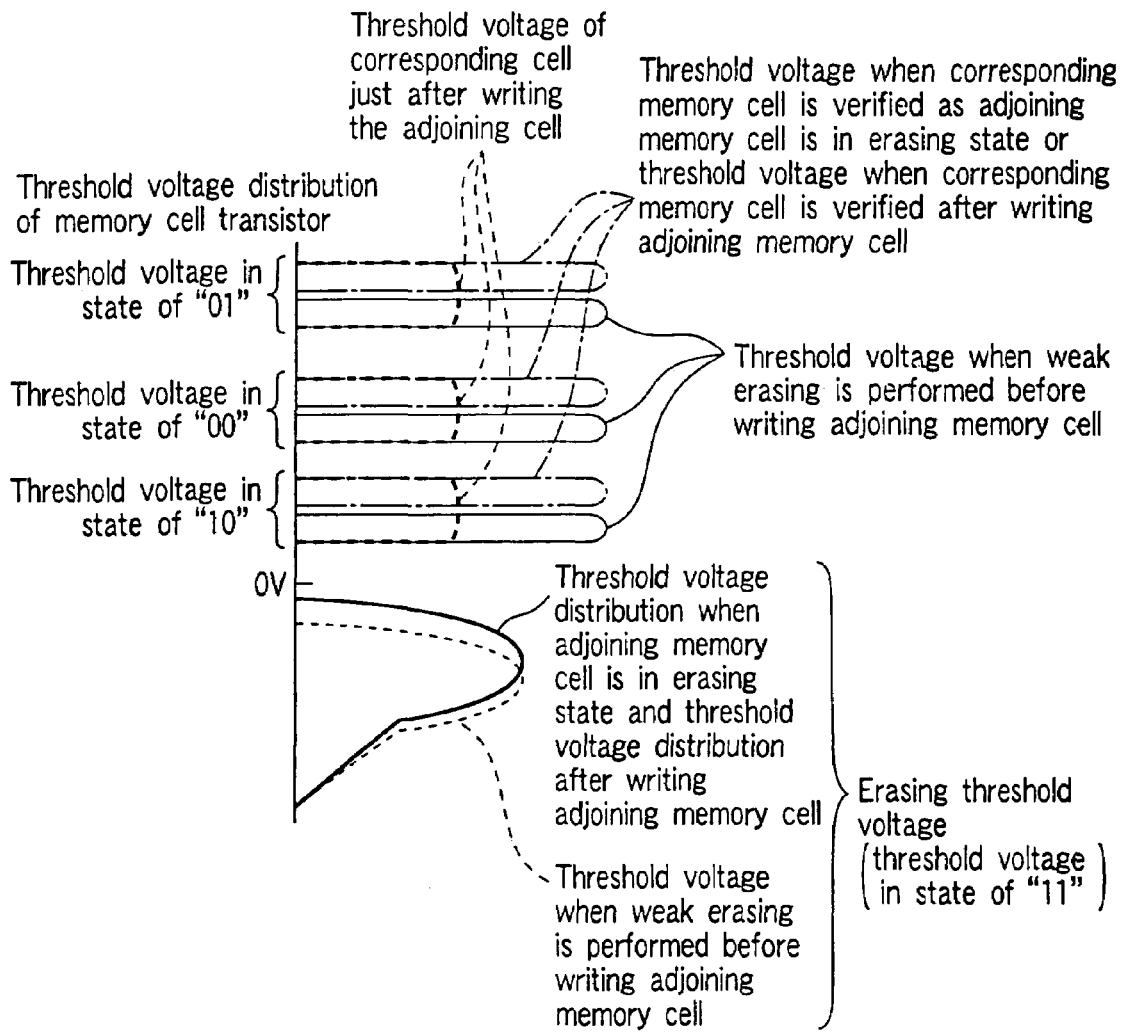
FIG. 9 is a diagram showing a threshold voltage distribution with respect to setting of the threshold voltage shown in FIG. 8.

The data writing operation according to the present embodiment will be described with reference to FIG. 8 and FIG. 9. In this case, it is assumed that the data in a memory cell block, in which the data is written, has been already erased by, for example, a publicly known method for drawing out an electron of the charge accumulation layer 26. Further, it is assumed that an initial value of a data register in the sense amplifiers 46 and 46' is in a state that the data is erased. It is obvious that a state of "1" and a state of "0" can be easily inverted by using the inversion of the voltage appropriately.

Additionally, a memory cell will be explained by using the reference numerals shown in FIG. 38. In this case, in order to promote better understanding of the explanation, for example, a case is considered such that the data of 4 values is written in a memory cell M1' connected to BL2a.

At first, the data of the memory cell M1 of the data transfer line BL1a adjoining BL2a is read to the data register in the sense amplifier 46. In this case, the memory cell M1 comprises a memory cell formed adjoining the memory cell M1' and belongs to the same divided block. The above operation allows the data of the memory cells of BL1x (x=a, b, ... k) to be read simultaneously (SE120). In this case, for example, a reference threshold voltage to discriminate the read data may be higher than a upper limit of a threshold voltage in the state of "11" and lower than a lower limit of a threshold voltage in the state of "10". However, for example, it may be at the about midpoint of the upper limit of the threshold voltage in the state of "11" and the lower limit of the threshold voltage in the state of "10" since a margin can be secured most easily. This reading operation enables the information indicating whether the data storage cell is in the writing state, namely, the state of "10", "00" or the state of "01" or not in the data register in the sense amplifier 46'.

Next, after the I/O is pre-charged, for example, in Vcc, all Qxa of the sense amplifier 46 belonging to the divided page are made in the ON state and the voltage of the I/O, namely, Vcc/2 is determined as a threshold voltage (SE121). In this case, if all bits belonging to the divided page of the memory cell array 1 are in the erasing state of "11", the output of the I/O becomes in the state of "H", namely, Vcc. Further, in the case that there is at least one cell, in which the data has been already written, the output of the I/O becomes in the state of "L", so that it is possible to determine the output of the I/O at a high speed even if the state of each sense amplifier is not checked.

Then, in the case that all bits belonging to the divided page are in the erasing state, the data is not written in the adjoining cell M1, so that the writing operation is performed with respect to M1' just as it is. In other words, after making the page register of 46 into the initial value of the erasing state, the written data is transferred from the outside I/O to an objective divided page 46 (SE132), so that the writing operation is performed (SE133).

On the other hand, in the case that there is a writing state in the bits belonging to the divided page, the data will be written in the adjoining M1 in advance. In this case, a page of the data belonged by M1 is read (SE122) and a page of the read data is rested in a temporary storage device 1 through the data input/output buffer 45 (SE123). Then, a page of the data belonged by M1' is further read (SE124) and a page of the read data is rested in a temporary storage device 2 through the data input/output buffer 45 (SE125).

After that, all of the memory cells of the data selection line to which M1 and M1' are connected are weakly erased and the threshold voltage is lowered (SE126). Then, M1 is changed from a distribution represented by a dashed line to a distribution represented by a solid line in FIG. 9. This lowering amount of the threshold voltage is defined to be larger than the highest value of the increasing amount of the threshold voltage by writing the data in the adjoining cell. Alternatively, according to a method for weakly erasing the memory cell in SE126, for example, as keeping the data selection line to which M1 and M1' are connected to 0V, other data selection line is defined as floating and a voltage of a well, in which the memory cell array 1 is formed, is boosted from 5V to 20V during period of 10 $\mu$s to 1 s.

Next, with respect to correspond divided page, a logical product between the data of the temporary storage device 2 and the writing data is obtained to be stored in the temporary storage device 2 (SE127). In this case, with respect to other divided page, the data in the temporary storage device 1 is used just as it is.

Then, after the data in the temporary storage device 2 is transferred to the data register of the sense amplifier 46 through the data input/output buffer 45 (SE128), the additional writing operation will be performed with respect to the page to which M1' is belonged (SE129). FIG. 9 illustrates a threshold voltage distribution of M1 in the case that the written data is a threshold voltage of 4 values. Before the sequence of SE129, the threshold voltage is distributed as shown by a solid line in FIG. 9. However, after SE129, the threshold voltage is partially increased by the capacitance coupling. Then, the threshold voltage is distributed with the distribution width is widened as shown by a broken line in FIG. 9. After that, according to the present embodiment, for example, the data including a page of the data of M1 rested in SE123 is transferred from the temporary storage device 1 through the data input/output buffer 45 (SE130) and by verify-writing the data of M1 additionally, as shown by a dashed line in FIG. 9, the minimum value of the distribution width of the threshold voltage is increased as the maximum value thereof is kept substantially at a certain value so that the distribution width thereof is narrowed (SE131). Hereby, it is possible to make the threshold voltage distribution when the adjoining memory cell is in the erasing state and the threshold voltage distribution after the data has been written in the adjoining memory cell substantially equal with respect to the writing threshold voltage.

Hereby, it is possible to increase the separation width of the threshold voltage distribution in the writing state, so that a voltage margin of the threshold voltage is capable of being secured. In this case, the change amount of the threshold voltage of a cell by the sequence of SE129 is changed from the state of "11" to the state of "01". Particularly, with respect to the erasing state of "01", it is difficult for the sense amplifier for measuring a positive threshold voltage to determine a threshold voltage at a negative side since an operational point thereof is changed, the change amount of the threshold voltage is spread to 2V or more. Therefore, although the change amount of the threshold voltage from the state of "11" to the state of "01" is large, i.e., at 4V or more, compared to this value, the change amount of a threshold voltage of a cell by the sequence of SE131 is small, i.e., nearly equal to a width of the threshold voltage distribution (<0.5 V). Therefore, it is possible to sufficiently suppress the influence due to the rise of the threshold voltage of M1' in SE131, i.e., not more than 0.5 V/4V to 0.125 times as the conventional example.

It is a matter of course that the temporary storage devices 1 and 2 shown herein may be provided at the outside of the semiconductor memory device. Further, it may be a data register formed in the I/O sense amplifier 46. However, if the temporary storage device is the data register formed in the I/O sense amplifier 46, it is possible to better shorten a time period taken for the data transfer and to better decrease electric power consumption necessary for activating the data line I/O.

Since the reading operation according to the present embodiment is the same as that according to the conventional example, the explanation thereof is herein omitted.

As described above, it is a matter of course that the reading operation and the writing operation can be used not only in the case that the adjoining cell is in a row direction, namely, the M1 cell with respect to M1', but also in the case that the adjoining cell is in a column direction, namely, M0' and M2' with respect to M1'. In this case, the M1 portion of the above described writing sequence may be read as M0' or M2 and BL2x may be read as WL1 and BL1x may be read as WL0 or WL2.

Alternatively, according to the present embodiment, the writing states of the adjoining cells are detected for each divided block, so that it is possible to arbitrarily determine the writing order for each divided block and further, it is possible to correct the threshold voltage.

According to the present second embodiment, it is possible to obtain the following advantages in addition to the advantages, which are obtained in common with the first embodiment.

(1) According to the present embodiment, the verify writing is performed with respect to all of the written data of the adjoining memory cells. Therefore, even after writing the data in the adjoining memory cells, it is possible to keep the threshold voltage distribution width smaller.

(2) According to the present embodiment, it is possible to make a reference threshold voltage to determine the read data into a fixed value independently of whether the data is written in the adjoining cell or not. Therefore, it is possible to perform this reading operation at a high speed as well as the conventional example.

(3) According to the present embodiment, the writing order storage memory cell array according to the first embodiment and a third embodiment to be described later is not needed, so that it is possible to realize a circuit constitution with a smaller circuit area.

(4) Compared to the third embodiment to be described later, the present embodiment is capable of being used in the case that the data of 2 values is stored in one memory cell.

Figure 5:
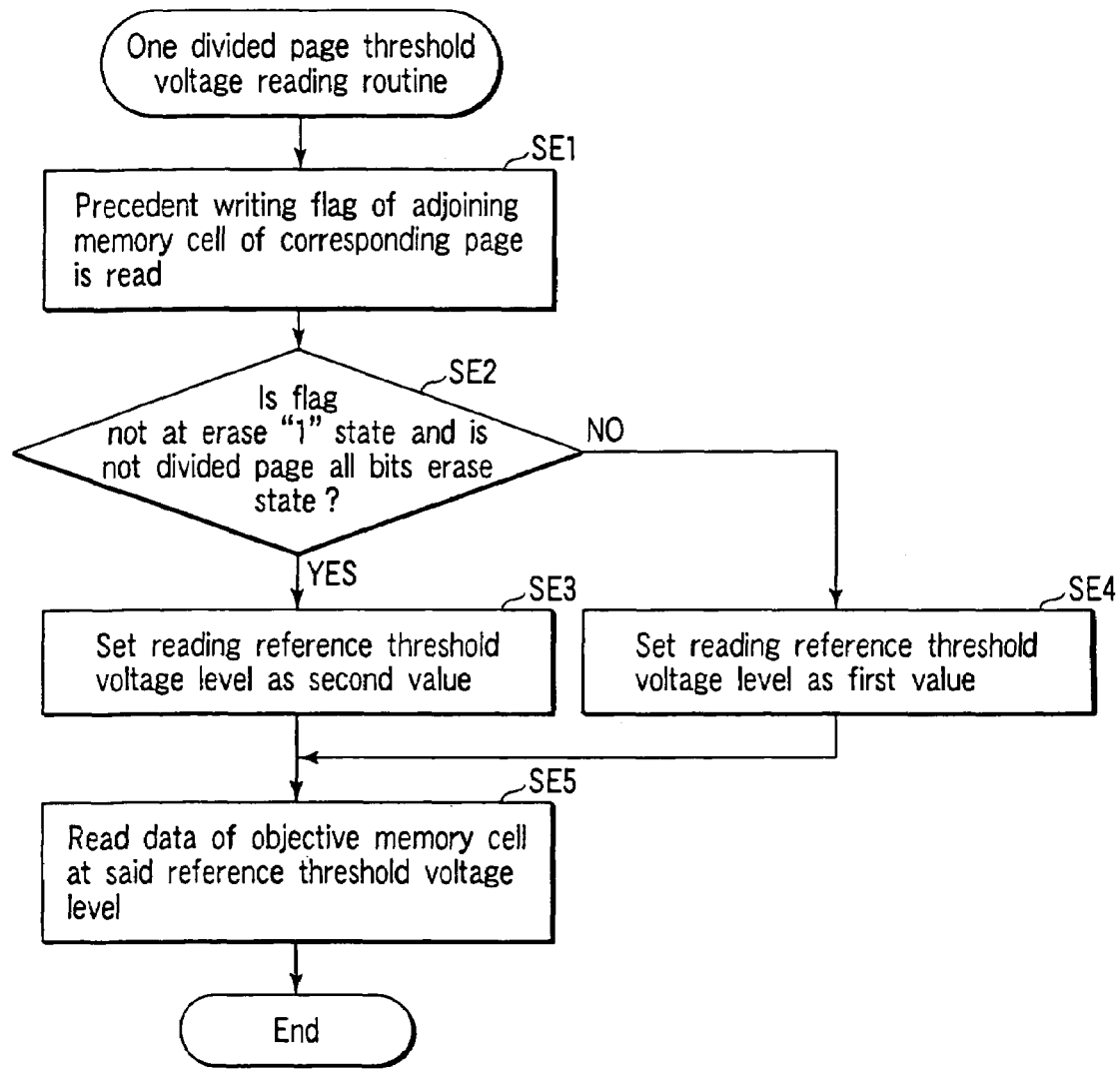
FIG. 5 is a flowchart showing the data reading operation of the semiconductor memory device according to the first embodiment of the present invention.
Figure 6:
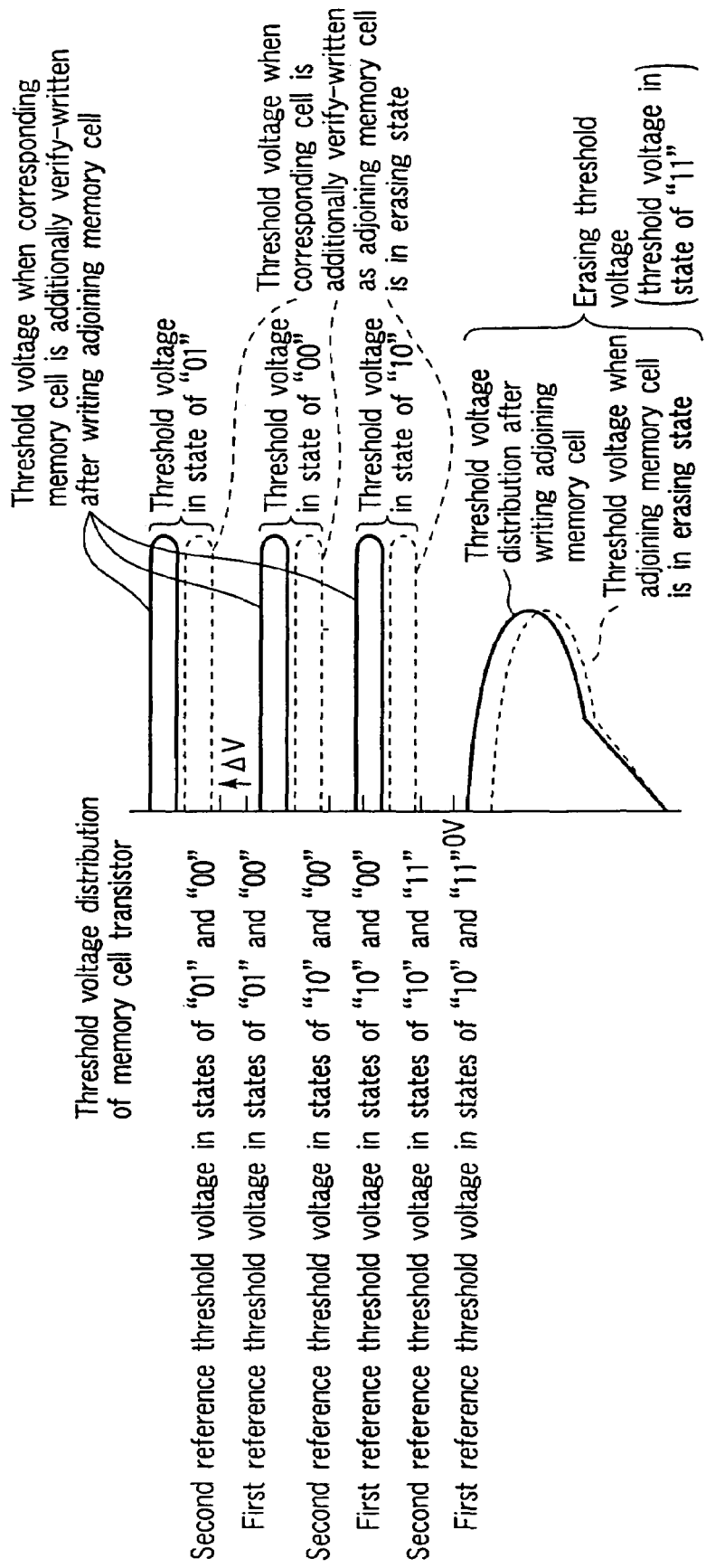
FIG. 6 is a diagram showing a threshold voltage distribution with respect to setting of the threshold voltage shown in FIG. 5.

In the circuit constitution according to the present embodiment, it is obvious that SE122 to SE131 can be replaced with SE10 to SE15 and the reading flow shown in FIG. 5 is used.

Further, in the circuit constitution according to the first embodiment, it is possible that SE122 to SE131 can be replaced with SE10 and SE122 to SE131 and the reading flow identical with that of the conventional example is used. In this case, the advantages of the constitution are the same as those of respective embodiments and the advantages of the reading operation and the writing operation are the same as those, which are explained with reference to the sequences, respectively.

Third Embodiment

Figure 10:
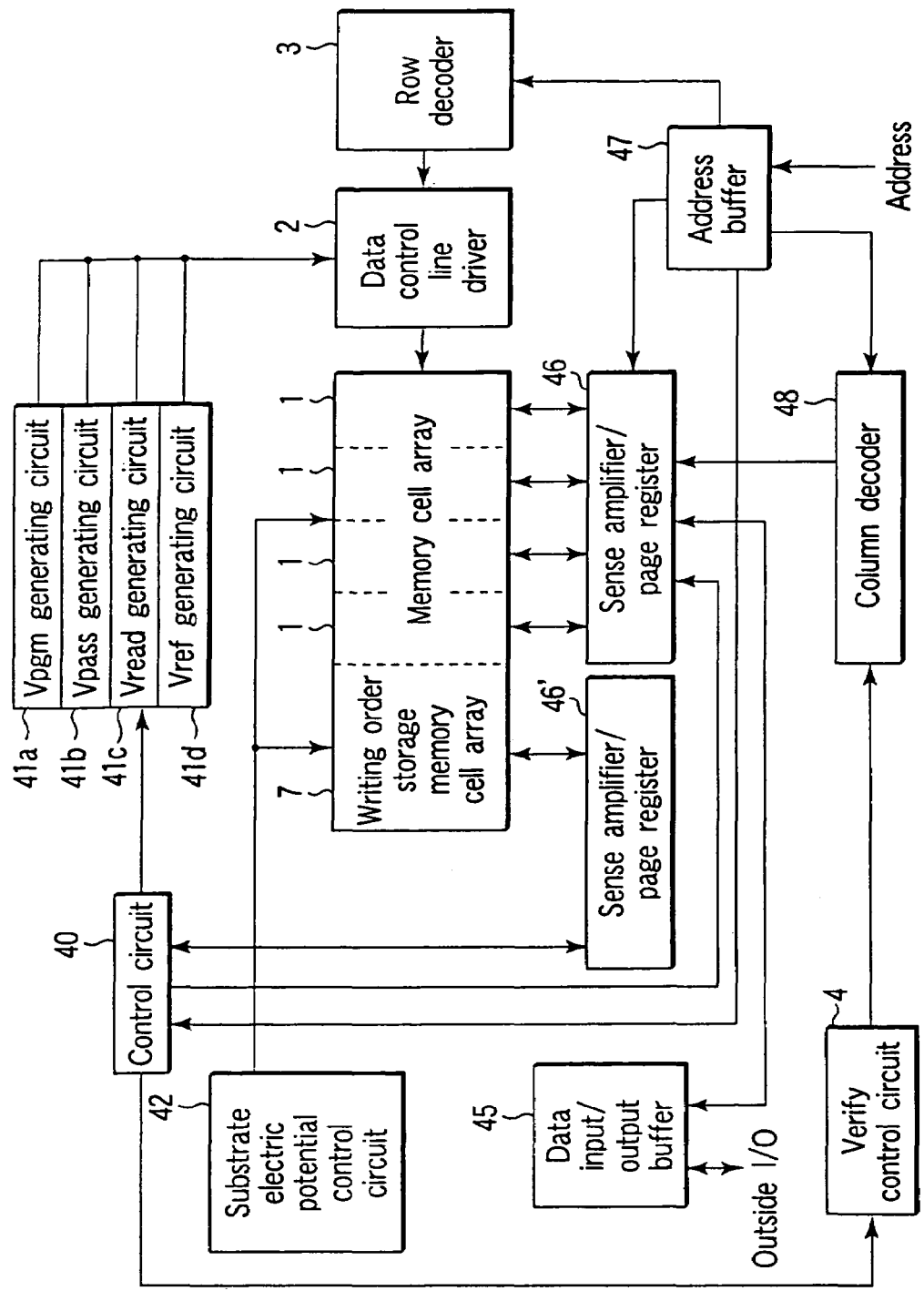
FIG. 10 is a block diagram showing a semiconductor memory device according to a third embodiment of the present invention.

FIG. 10 is a block diagram for illustrating a third embodiment according to the present invention.

The present embodiment is substantially the same as the first embodiment. However, the present embodiment is different from the first embodiment in that a Vref circuit 2 (41e) is not formed. Further, the sequences of the writing and the reading of the present embodiment are different from that of the first embodiment. Alternatively, according to the present embodiment, it is not always necessary that the divided sense amplifier selective signal is not provided from the verify control circuit 4 to a column decoder 48, so that the shared sense amplifier selective signal may be provided. Alternatively, the same portions as those of the first embodiment and the second embodiment and same voltage relations as those of the first embodiment and the second embodiment are provided with the same reference numerals and the detailed explanations thereof are herein omitted.

According to the present embodiment, a plurality of threshold voltages not less than 2 values, for example, 4 values are stored in one memory cell and a package of 2 bits to be stored is written one by one as verifying the memory cells which adjoin each other. Hereby, for example, the change of the threshold voltage by the capacitance coupling of the adjoining cells is compensated. Further, according to the present embodiment, a specific example of the sense amplifier circuit 46 will be disclosed.

Figure 11:
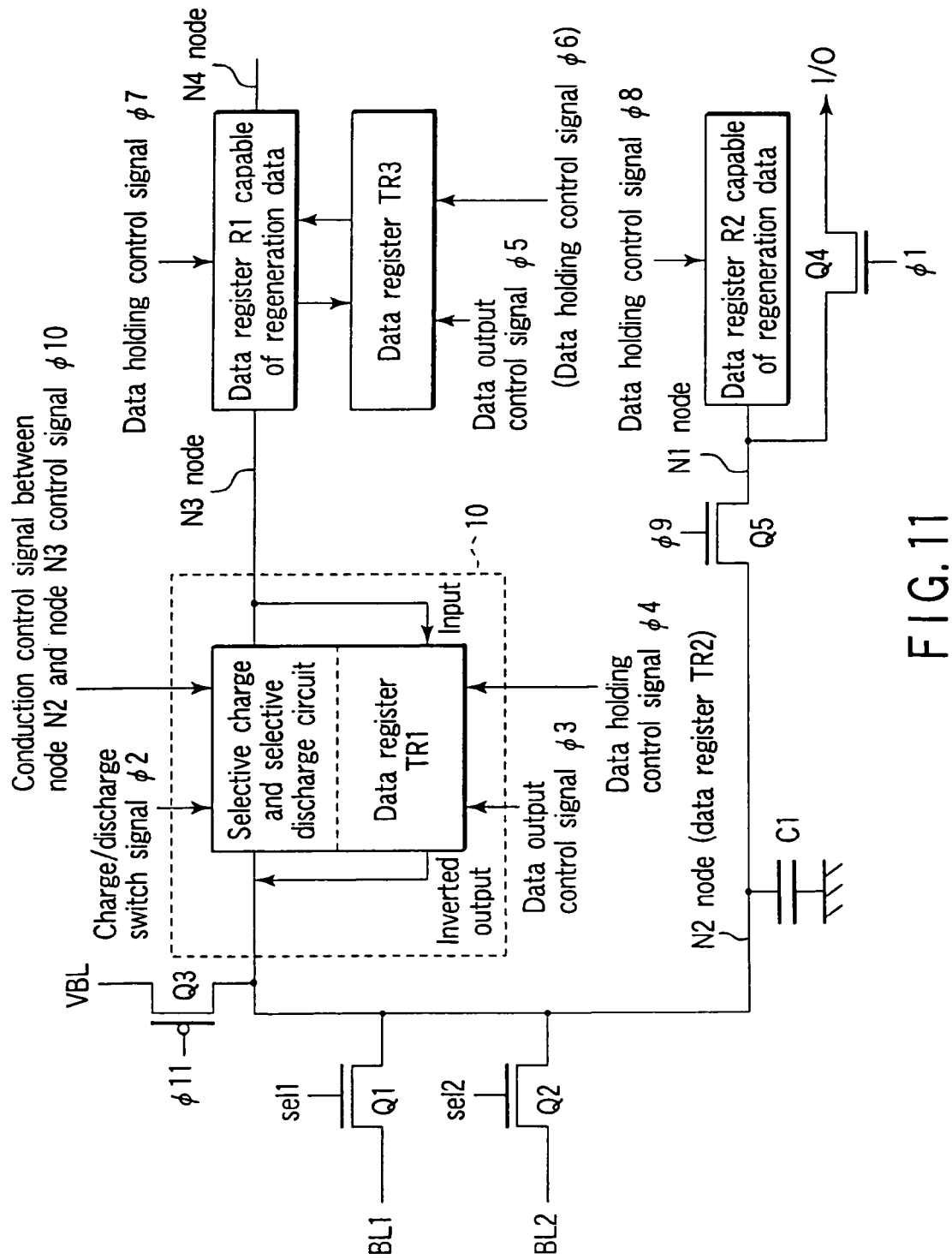
FIG. 11 is a block diagram showing a block example of a sense amplifier 46.

FIG. 11 illustrates a block example of the sense amplifier 46 according to the third embodiment.

As shown in FIG. 11, the present sense amplifier 46 is mainly constituted by a data registers R1, R2 capable of regeneration the data, a selective charge and selective discharge circuit, a data register TR1 and a data register TR3. In this case, the data registers R1, R2 capable of regeneration the data comprises a data register, which has at least two voltage stable points and has a function to draw back the voltage of an input/output node to one stable point even when the slightly deviant voltage is provided to the above input/output node from the above stable point. For example, such a data register may be formed by a flip flop formed by connecting input nodes and output nodes of two inverters in a cross-coupled manner shown in FIG. 12A to FIG. 12E. Further, a voltage node N3 forming a data input and a data output is formed in the data register R1 capable of regeneration the data. Alternatively, a voltage node N4 forming the reverse output of N3 may be formed. Additionally, a signal φ7 to control the data holding is connected to the data register R1. Further, an input terminal and an output terminal of the data register TR3 are connected to the data register R1 to be provided with a data output control signal φ5 of TR3. Alternatively, in the case that the input terminal and the output terminal of the data of TR3 are separated, a data holding control signal φ6 may be provided.

Further, a voltage node of the above N3 is connected to one input/output of the selective charge and selective discharge circuit. The selective charge and selective discharge circuit is connected to the data register TR1, so that the selective charge and selective discharge circuit is capable of holding the data of the node N3 in the data register TR1. Alternatively, a signal φ4 as a data holding control signal and a signal φ3 as a data output control signal of the data register TR1 are provided to the data register TR1. Further, by the holding data of the data register TR1, the selective charge of the voltage node N2 is controlled. In this case, a signal φ2 to switch the charge and the discharge and a signal φ10 to control the conduction and the non-conduction of the node N2 and node N3 are provided to the selective charge and selective discharge circuit. Additionally, inverting the signal φ2, the selective discharge of the voltage node N2 is controlled by the holding data of the data register TR1.

Further, a transistor Q3 for charging BL1 and BL2 through the node N2 and a signal φ11 for controlling this charging are connected to the node N2. Additionally, the N2 node is connected to a plurality of data transfer lines BL1 and BL2 through Q1 and Q2 to the N2 node. Alternatively, Q1 and Q2 shown in FIG. 11 comprise the same transistors as Q1x and Q2x (x=a, b, . . . , k). The number of the data transfer lines to be connected to the N2 node may be a plural number in order to prevent the influence by the capacitance coupling of the memory cells adjoining in the row direction. It is preferable that the number thereof may be $2^i$ (i is a positive integer number) for the address decoding.

Further, the N2 node is connected to the N1 node through Q5. A signal φ9 to control the conduction of the N node is connected to the Q5. Alternatively, the N2 node becomes in a floating state by making the transistor connected to sell, sel2, φ9, φ11, φ10, and φ3 into a cutoff state and then, the N2 node functions as the data register TR2 capable of temporarily save the data. In order to improve the data holding property, for example, a capacitor C1 having a capacitance in the range of 0.01 pF to 10 pF may be connected to the N2 node.

Further, the N1 node is connected to the input/output terminals of the data register R2 capable of regeneration the data. Alternatively, the N1 node is connected to a common data line I/O through Q4. This Q4 is the same as Qxa (x=a, b, . . . , k) shown in FIG. 2. The common data line I/O is extended in the data selection line direction to be shared by a plurality of sense amplifiers. In the above described circuits, it is preferable that signals φ2 to φ7, φ9 to φ11, sell, and sel2 are extended in the data selection line direction and they are shared by a plurality of sense amplifiers 46 and 46'. Hereby, it is possible to decrease the number of the signal lines for controlling a plurality of the sense amplifiers 46 and 46' and to make the circuit area smaller. Additionally, the input φ1 of Q4 is connected to a column decoder.

Next, FIG. 12A to FIG. 12E illustrate specific constitutional examples of the data registers R1 and R2. An example is shown below such that, in the case that φ7 is changed from "L" to "H", the data of N3 is held and the data holding has been continued for a time period of "H". It is obvious that, for example, an example to hold the data in the case that φ7 is changed from "H" to "L" can be easily effected by appropriately using a p-type transistor in place of a signal inverted circuit and an n-type transistor. Alternatively, the inverted signals are shown by adding a slash (/) before the names of the signals.

Figure 12A:
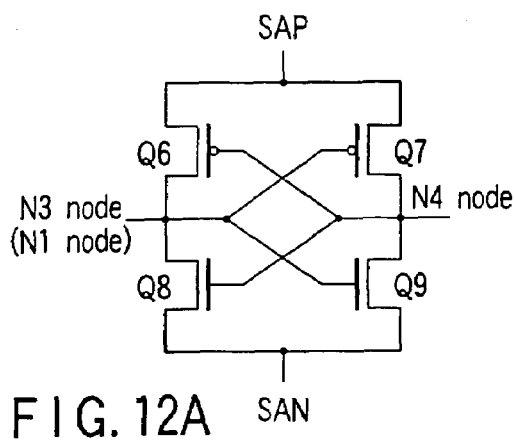
FIGS. 12A, 12B, 12C, 12D and 12E are circuit diagrams showing circuit examples of data registers R1 and R2.

Alternatively, in FIG. 12A to FIG. 12E, with respect to the data register R2, the N3 node may be replaced with the N1 node and the signal φ7 may be replaced with the signal 48. These circuits shown in FIG. 12A to FIG. 12E are flip-flops formed by connecting input nodes and output nodes of two inverters in a cross-coupled manner. In FIG. 12A, it is possible to latch the data by defining the φ7 as a SAP input and the inversion of the φ7 as a SAN input. In the example formed by a CMOS inverter shown in FIG. 12A, the number of transistors is the minimum, so that it is possible to make the circuit area smaller.

Figure 12B:
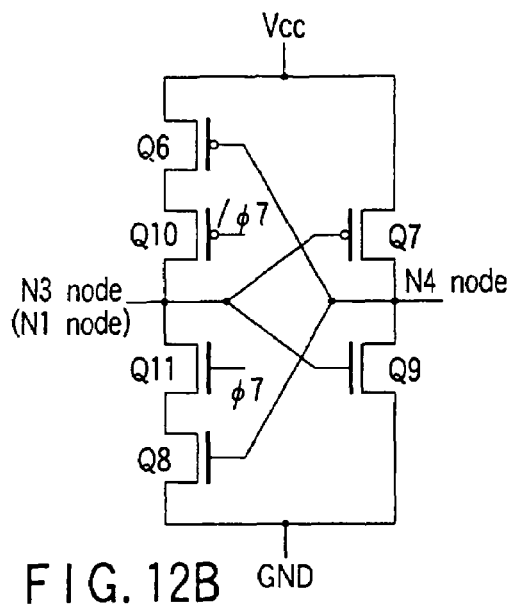

A constitutional example shown in FIG. 12B comprises an example by the use of a clocked inverter at the N3 side of the inverter and it has the following two advantages compared to the constitutional example shown in FIG. 12A.

(1) The φ7 only charges the gate capacitances of Q11 and Q10, so that it is possible to more decrease the charging current for activating a signal line of the φ7. As a result, it is possible to layout the constitution with a narrow signal line. Alternatively, the φ7 is connected to the gate input but it is not connected to the source/drain electrode to output the current and the voltage, so that the electric potential variance of the sense amplifier, which is connected to the φ7 in parallel, is not transmitted to other sense amplifier through the φ7 and the stable operation is capable of being realized.

(2) If the φ7 is defined as "L", the N3 node becomes in the floating state, so that it is possible to latch a value of the N3 node without depending on the voltage of the N4 node.

Figure 12C:
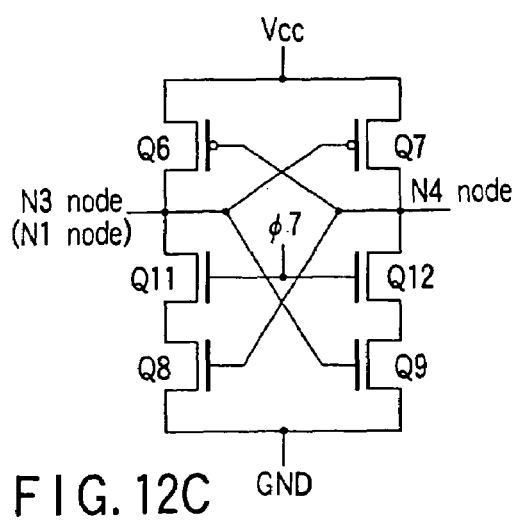

Further, according to a constitutional example shown in FIG. 12C, all of the transistors Q11 and Q12 connected to the φ7 are constituted by NMOS. Therefore, the constitutional example shown in FIG. 12C has an advantage capable of constituting a sense amplifier, of which are is smaller than the area of the large PMOS transistor, in addition to the advantage (1) in FIG. 12B. Alternatively, in the case that the φ7 is defined as "L", a direct current does not pass through from Vcc to GND, so that it is possible to decrease electric power consumption.

Figure 12D:
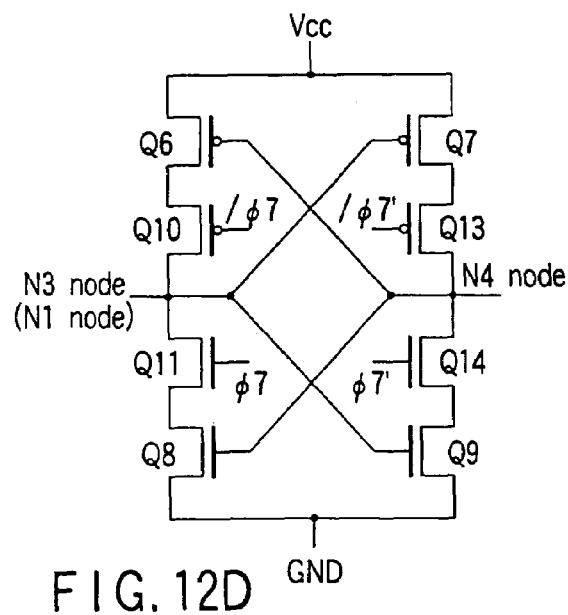

Further, in addition to the advantage in FIG. 12B, the constitutional example shown in FIG. 12D has an advantage such that a signal φ7' may be identified with the signal φ7, if the rising of the signal φ7' from "L" to "H" is made earlier compared to the φ7, the N3 node is made into the floating state and then, the input data of the N3 node can be latched and adversely, if the rising of the signal φ7 from "L" to "H" is made earlier compared to the φ7', the N4 node is made into the floating state and then, the input data of the N4 node can be latched. This circuit enables to make both of the N3 node and the N4 node into the floating state and to make them inputs. Therefore, by using this circuit together with the circuits shown in FIG. 13A, FIGS. 13H to 13K, this circuit enables to restore the data of TR3 stably. Alternatively, in the case that the φ7 and the φ7' are made into "L", the direct current does not pass through from Vcc to GND, so that it is possible to decrease the electric power consumption.

Figure 12E:
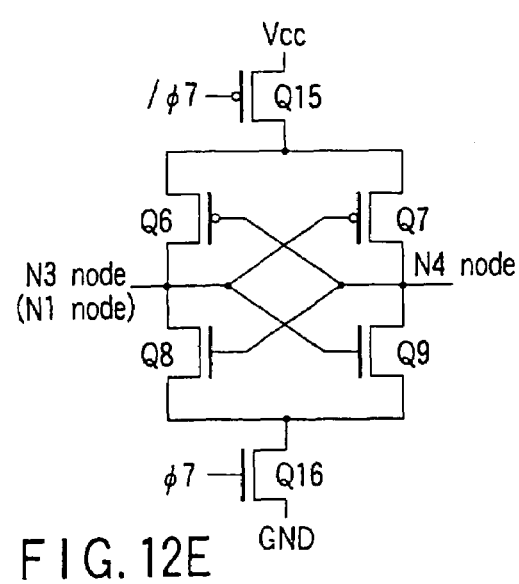

Further, in addition to the advantages in FIG. 12B, the constitutional example shown in FIG. 12E has an advantage capable of decreasing the electric power consumption since the direct current does not pass through from Vcc to GND if the φ7 is made into "L".

As described above, an example that the data registers R1 and R2 are formed by a CMOS inverter is described. However, it is a matter of course that the data registers R1 and R2 may be formed by an EE type inverter formed by NMOS and an inverter by the use of a high resistance load in place of PMOS. In this case, the operation is the same as the above described example, so that the explanation thereof is herein omitted.

Next, a specific constitutional example of a data register TR3 will be shown in FIG. 13A to FIG. 13K. An example is described below, such that the data register TR3 holds the data if φ6 is changed from "H" to "L" and the data holding has been continued for a period of "L". However, it is obvious that, an example may also be easily constituted, such that, by appropriately using a p-type transistor in place of the signal inverted circuit and the n-type transistor, the data is held, for example, if φ6 is changed from "H" to "L". Alternatively, an example is described below, such that the data register TR3 is in the floating state if the φ5 is in "L" and it outputs the data for a period of "H". However, it is obvious that, an example may also be easily constituted, such that, by appropriately using a p-type transistor in place of the signal inverted circuit and the n-type transistor, the data is held, for example, if φ6 is changed from "H" to "L".

Figure 13A:
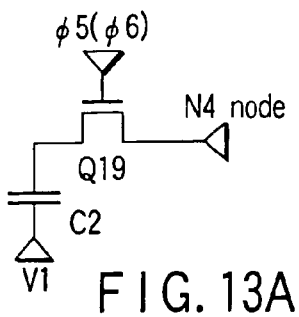
FIGS. 13A, 13B, 13C, 13D, 13E, 13F, 13G, 13H, 13I, 13J and 13K are circuit diagrams showing circuit examples of a data register TR3.
Figure 13B:
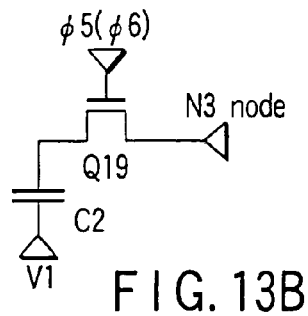
Figure 13C:
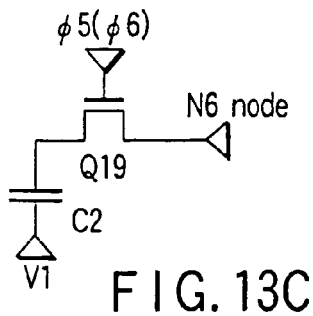
Figure 13D:
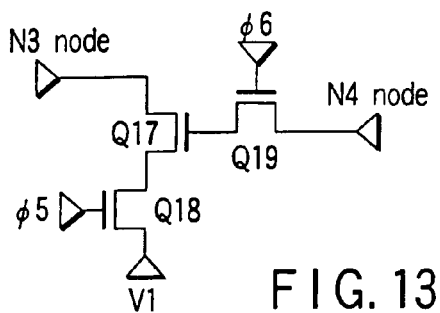
Figure 13E:
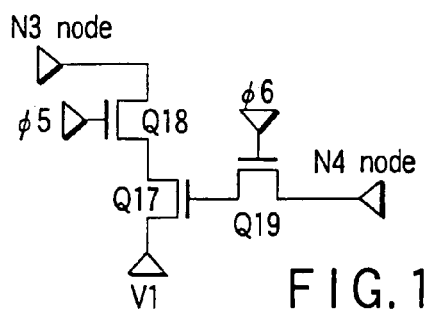
Figure 13F:
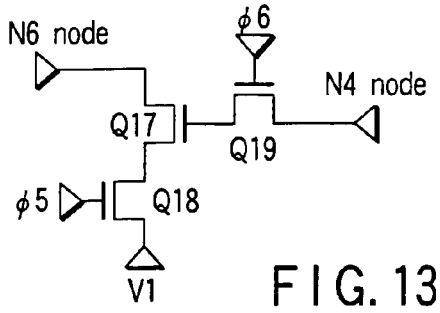
Figure 13G:
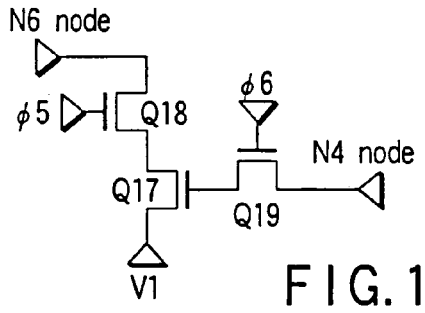
Figure 13H:
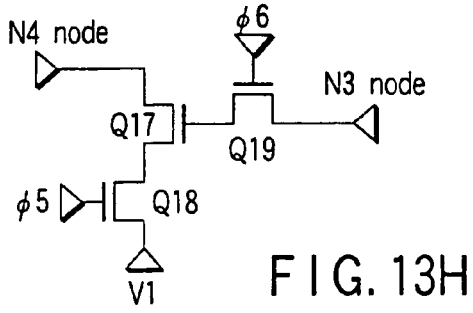
Figure 13I:
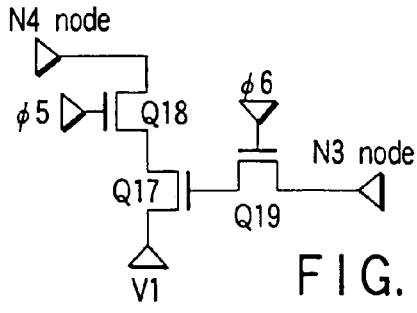
Figure 13J:
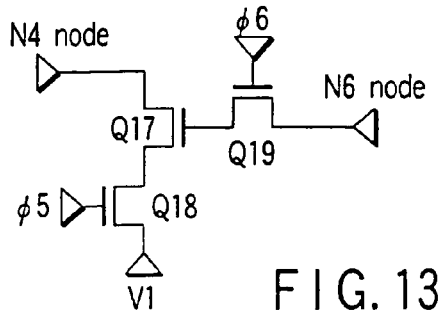
Figure 13K:
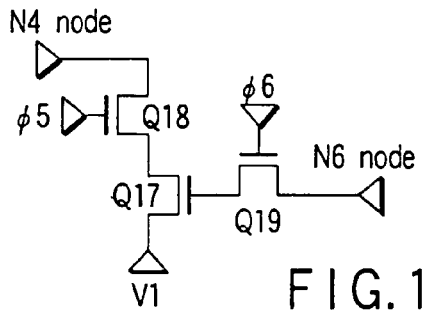

The constitutional examples shown in FIG. 13A to FIG. 13C are data store circuits as same as a dynamic type memory. In FIGS. 13A to 13C, φ5 is in common with φ6. In these drawings, for example, a reference numeral V1 denotes a voltage node having a voltage between VDD and GND. In these circuits, the data is held as the electric charge amount of a capacitor C2. The number of signal lines and constitutional elements are small in these circuits, so that it is possible to realize a circuit with a small area.

The constitutional examples shown in FIG. 13D to FIG. 13K are circuits, which have the electric charge amount, accumulated in a gate electrode of Q17 as the data and outputs its inverted output through Q17 and Q18. In these drawings, for example, a reference numeral V1 denotes a voltage node of which voltage is GND or Vcc. In this circuit constitution, it is possible to separate the input of the data from the output of the data, so that the data reading is not brought to destruction. Therefore, data refresh is not required and it becomes easy to adjust timing of the input and the output. Alternatively, even when a signal electric charge is faded in the case that the hold data is "H", if a node of a gate electrode of Q17 is kept not less than a threshold voltage of Q17, making Q5 into "H" and reading it, it is possible to keep the output node and the V1 node in a conductive state, so that a larger signal margin is capable of being obtained.

It is a matter of course that TR3 may be constituted be a data register circuit capable of regeneration the data shown in FIGS. 12A to 12E. However, it is possible to realize a smaller circuit by the use of the circuits shown in FIGS. 13A to 13K since the number of constitutional transistors is 3 or less and one power supply source, i.e., V1 is sufficient.

Next, FIGS. 14A to 14F illustrates a specific example of a selective charge and selective discharge circuit and a data register TR1, namely, a selective discharge/charge circuit 10. An example is shown below such that the data is held in the case that φ4 and φ12 are changed from "H" to "L" and the data holding has been continued for an "L" period. However, it is obvious that, for example, an example to hold the data in the case that φ4 and φ12 are changed from "H" to "L" can be easily effected by appropriately using a p-type transistor in place of a signal inverted circuit and an n-type transistor. Alternatively, an example will be described below such that the data is outputted in the case that φ3 is "H", and the N2 node is in a floating state in the case that φ3 is "L". However, it is obvious that, for example, an example to hold the data in the case that φ3 is changed from "H" to "L" can be easily effected by appropriately using a p-type transistor in place of a signal inverted circuit and an n-type transistor. Further, a case is shown such that, in the case that φ2 is "L", the N2 node is selectively discharged and in the case that φ2 is "H", the N2 node is selectively charged. In this case, in order to decrease the lowering amount of a threshold voltage Vth by Q20 and charge the voltage of the N2 node up to Vcc–Vth, it is preferable that a voltage of φ3 is Vcc+Vth or more in the case that φ3 is "H".

Alternatively, with respect to φ10, φ3, and φ4, it is obvious that, for example, an example to hold the data in the caseφ10, φ3, and φ4 are changed from "H" to "L" can be easily used by appropriately using a p-type transistor in place of a signal inverted circuit and an n-type transistor.

According to the present circuit, at first, an initial state is considered such that φ3, φ4, φ10, φ12, φ13, and φ14 are "L". Additionally, it is assumed that VBL is Vcc. In the constitutional examples shown in FIG. 14A to FIG. 14D, an "H" pulse is applied to φ4 and in the constitutional examples shown in FIG. 14E and FIG. 14F, an "H" pulse is applied to φ4 and φ14. Then, the data of the N3 node is transmitted to a gate electrode of Q21. After that, φ4 and φ14 are made into "L". Further, in the constitutional examples shown in FIG. 14C and FIG. 14D, an "H" pulse is applied to φ12 and in the constitutional examples shown in FIG. 14E and FIG. 14F, an "H" pulse is applied to φ4 and φ13. Further, it is possible to transfer the data of the N2 node to a gate electrode of Q21 without depending on the N3 node. Then, φ12 and φ13 are made into "L". Consequently, the N2 node is charged up to Vcc, for example, via Q3 and then, Q3 is turned off, N2 is made in the floating state with keeping φ10 as "L" and TR2 is made into the data holding state. Further, owing to changing φ3 from "L" to "H" with keeping φ10 as "L" and keeping φ2 as 0V or Vcc, the electric charge amount held in the gate electrode of Q21 is defined as the input data and on the basis of this data, charge and discharge of the N2 node is performed. This operation is referred to as selective discharge and selective charge.

FIGS. 15A and 15B illustrate logic tables of the selective discharge operation and the selective charge operation of the present circuit. Alternatively, a portion encircled by a heavy line shows that the inversion of the initial data saved in the gate electrode of Q21 is obtained by the N2 node output. In other words, by performing the selective discharge operation, the inversion of the data is obtained by a sequence shown in FIG. 16. Further, according to the sequence shown in FIG. 16, as described in the explanation of the first embodiment, in the case that an order of logical values of threshold voltages with 4 values are decided by a gray code, the threshold voltages are "11", "10", "00" and "01" from a lower value, so that it is needed to invert the threshold voltage order with respect to the lower bits "0" and "1". By using the selective charge circuit according to the present embodiment, it is possible to perform the data inversion, which has been difficult to be performed according to the conventional example, in the sense amplifier 46 at a high speed, with a very simple circuit constitution. Therefore, it is possible to shorten time taken for transferring the data to the outside buffer through the data input/output buffer 45 in order to invert the data and to decrease electric power consumption necessary for activating the data line I/O.

From the above description, it has been obvious that it is possible to hold the data of N2 or N3 in the gate electrode of Q21 by using the selective discharge/charge circuit 10 and to selectively charge/discharge the N2 node on the basis of its input data. Further, it is obvious that it is possible to make the N2 node and the N3 node into the conductive state by adding an "H" pulse to φ10 in FIG. 14A to FIG. 14D and adding "H" pulse to φ13 and φ14 in FIG. 14E and FIG. 14F.

In order to simplify the explanation, the operation of the selective discharge/charge circuit 10 shown in FIG. 14A having the minimum number of elements will be described below. For example, FIG. 14B can realize the same circuit as that shown in FIG. 14A and FIG. 14C and FIG. 14D include the circuits shown in FIG. 14A and FIG. 14B, so that it is obvious that it is possible to operate the selective discharge/charge circuit 10 shown in FIG. 14A to FIG. 14D in the same way with making φ12 into "L". Further, it is obvious that it is possible to the operate selective discharge/charge circuit 10 shown in FIG. 14E and FIG. 14F in the same way by keeping φ14 as "H" and adding the same signal as φ10 to φ13.

Figure 16:
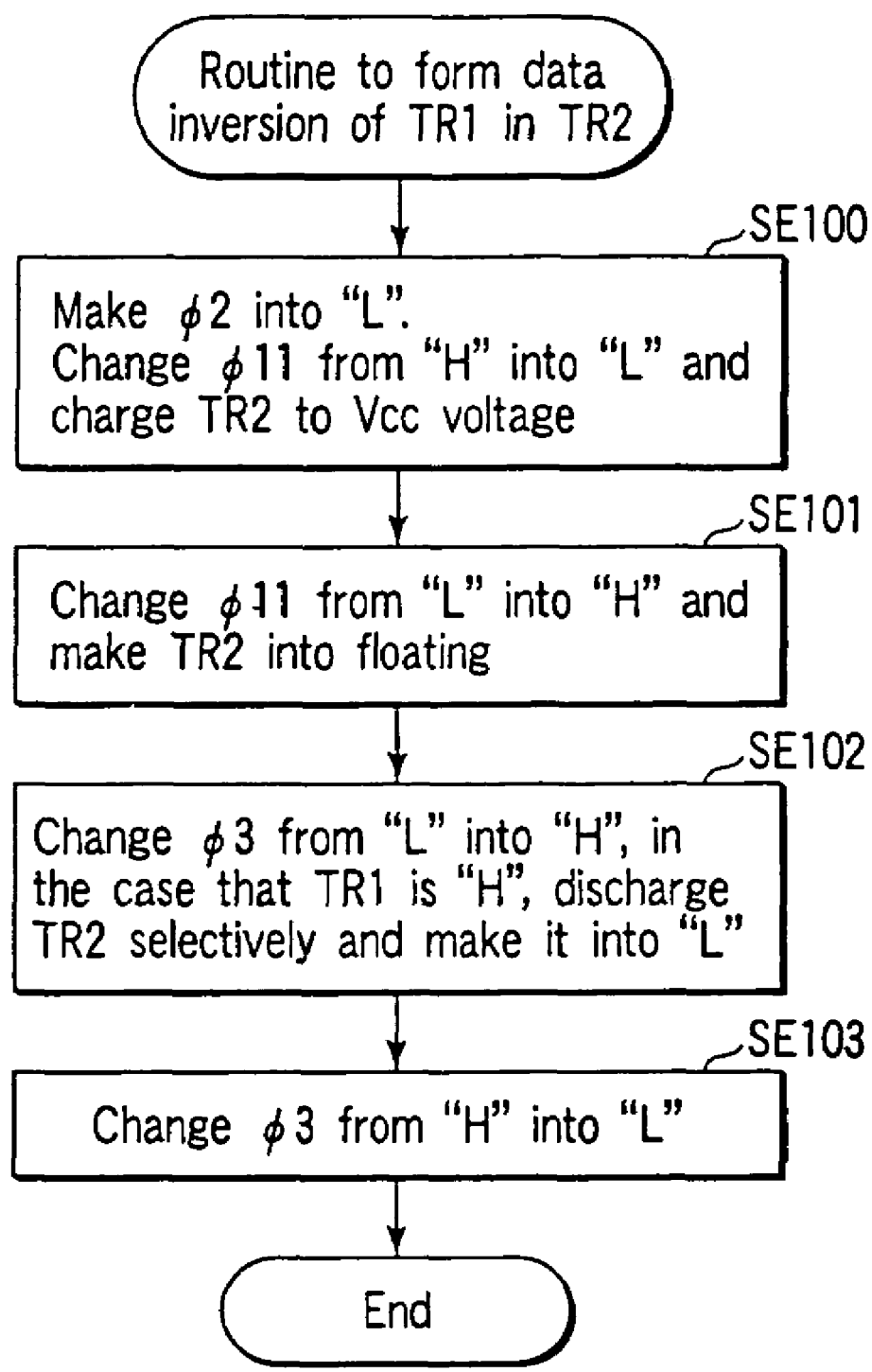
FIG. 16 is a flowchart showing the data inversion operation of the semiconductor memory device according to the third embodiment of the present invention.
Figure 17:
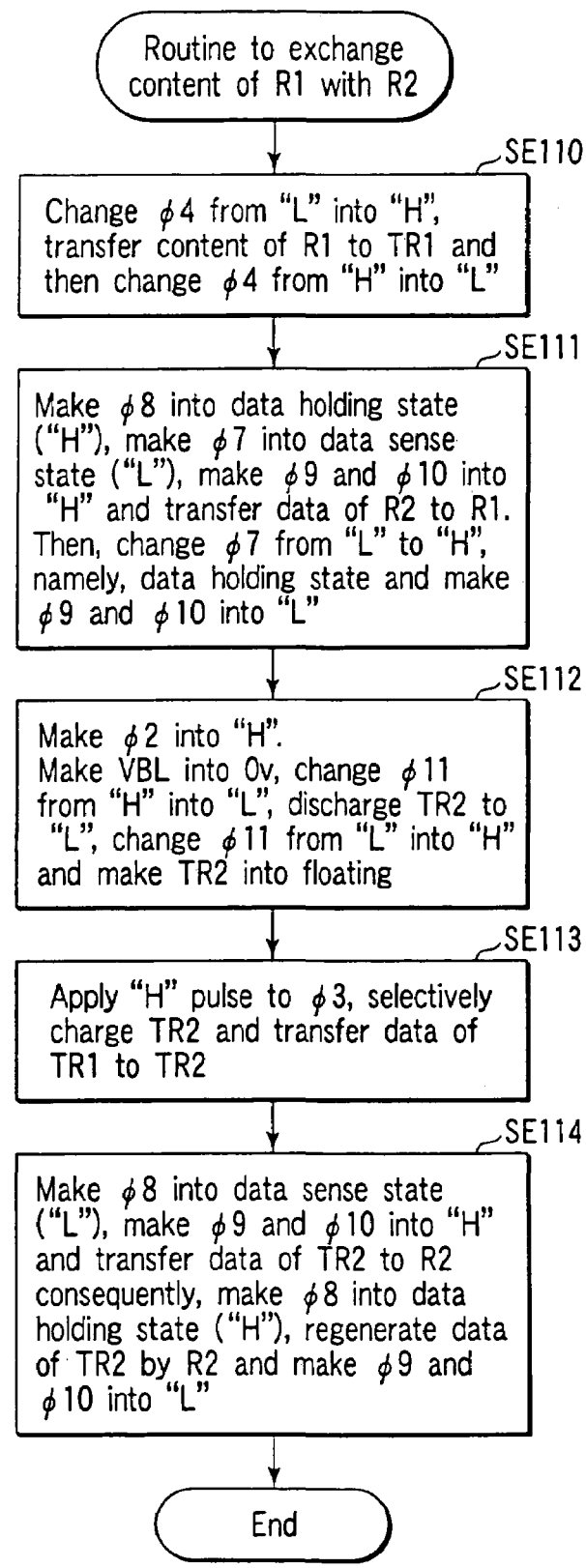
FIG. 17 is a flowchart showing a data exchange example of the data register R1 capable of regeneration data and the data register R2 capable of regeneration data.

Next, FIG. 17 shows a flow example to exchange the data content of the data register R1 with the data content of the data register R2. In the following explanation, restoring the data means to draw back the voltage of an input/output node to one stable point even if the slightly deviant voltage is provided to the above input/output node from the above stable point so that a logical signal is restored. Alternatively, the data restoring is performed by R1 and R2 according to the present embodiment. The data register circuits shown in FIG. 13A to FIG. 13K and FIG. 14A to FIG. 14F cannot reproduce the data of 2 values since they have one power supply voltage node. All of the sequences shown in FIG. 16 and FIG. 17 are capable of being effected without bringing the held data of TR3 into destruction.

A description that "the data is restored in TR3 to R1" is used below. This means that the data is reproduced by R1 in the case that TR3 supplies the output with a voltage, of which logical amplitude voltage is lowered by leakage of the electric charge and an array noise, and the data is held in R1. It is assumed that this means a sequence for holding the data of TR3 by changing φ7 from "L" into "H", for example, after making φ7 into "L" into the data sense state and making φ5 into "H". Alternatively, the data transfer from R1 to TR3 indicates a sequence such that the data is transferred, for example, by changing φ6 from "L" into "H" in the case that R1 is in the data holding state, namely, in the state that φ7 is made into "H" and then, R1 and TR3 can store the data independently by changing φ6 from "H" into "L". Further, the data transfer from R1 to TR1 indicates a sequence such that φ4 is changed from "L" to "H" in the case that R1 is in the data holding state, namely, in the state that φ7 is made into "H" and φ4 is changed from "H" into "L" after the electric potential of TR1 becomes the same as the output potential of R1. The data transfer from R1 to TR2 indicates a sequence such that φ10 is changed from "L" into "H" in the case that R1 is in the data holding state, namely, in the state that φ7 is made into "H" and φ7 is changed from "H" into "L" after the electric potential of TR2 becomes the same as the output potential of R1. The data transfer from TR2 to R1 indicates a sequence such that φ10 is changed from "L" into "H" in the case that R1 is in the data holding state, namely, in the state that φ7 is made into "L" and the data of TR2 is transferred to the N3 node and then, the data is made into the holding state by changing φ7 from "L" into "H".

Next, the data reading operation according to the present embodiment will be explained with reference to FIG. 18 and FIG. 19 below.

According to the present embodiment, it is assumed that a plurality of threshold voltage 2 values or more, for example, 4 values are stored in one memory cell and a package of 2 bits to be stored is written for each bit while verifying the memory cells adjoining each other. Therefore, as shown in FIG. 19, after erasing, the data of a logical address 1 to be written in a divided block at first (first bit) is stored in two adjoining cells in association with 2 values of a state of "11" and a state of "00" and a physical address and a matching table of a logical address are stored together. Then, in the case that there is request for writing the data (second bit) in a logical address 2, the data is additionally written in the threshold voltage of the above cell. In this case, the data is separately written depending on additional bits in such a manner that "11" is written as "11" and "10" and "00" is written as "00" and "01", so that the data having 4 values is obtained. Alternatively, in order to promote better understanding, in the following description, the data having 4 values is assumed and the data to be written in k1 among two bits to be written at once is defined as a lower bit and the data to be written in k2 among two bits to be written at once is defined as a higher bit. Alternatively, according to the third embodiment, the data content of the writing order storage memory cell array 7 is set in such a manner that it becomes "11" (non-writing state) in the case that the data is written in the logical address 1 in advance and it becomes "00" (writing state) in the case that the data is written in the logical address 2 in advance. Hereinafter, an address to convert the above physical address and the logical address is represented by adda. These logical address rewriting flags can be realized as same as the first embodiment, for example, by a cell layout shown in FIG. 2. They are sufficient if they can stored 2 values of "11" and "00". It is obvious that they can perform writing reading and erasing as well as a memory cell in which the divided page and the column store the same data. Alternatively, a flag (an initial writing flag) to indicate whether the data is written after erasing the block with the same cell circuit constitution as that of the logical address rewriting flag is formed. This flag is set in such a manner that it becomes "11" (non-writing state) in the case that the data is not written in any of the adjoining cells of the corresponding divided block and it becomes "00" (writing state) in the case that the data has been already written in any of the adjoining cells of the corresponding divided block. These flags can store the information for one divided block only by adding one data transfer line with the same constitution of the memory cell array 1 if, for example, the logical address rewriting flag is allocated to the memory cell array 7 to be read at the same time as the lower bit and the initial writing flag is allocated to the memory cell array 7 to be read at the same time as the higher bit. Therefore, a new memory cell and a new wiring design are not needed, so that it is possible to realize a circuit constitution with a small circuit area.

Alternatively, the reading and the writing individual data and timing of the verifying operation are publicly known, for example, by Jpn. Pat. Appln. KOKAI Publication No. 7-182886 (U.S. Pat. No. 5,452,249), so that the description thereof is herein omitted. According to the present embodiment, R1 is used as the sense amplifier operation and the selective discharge/charge circuit 10 is used for the verifying operation, so that the contents of R1 and TR2 are destroyed by the data reading operation and a content of TR1 is destroyed by the verifying operation. However, it should be noted that the data contents of TR3 and R2 are not destroyed.

Further, k1 and k2 shown in FIG. 18 to FIG. 27 are the memory cells adjoining each other and they are memory cells to store a package of two bits for each bit. In this case, the adjoining direction may be either a column direction or a row direction.

Figure 18:
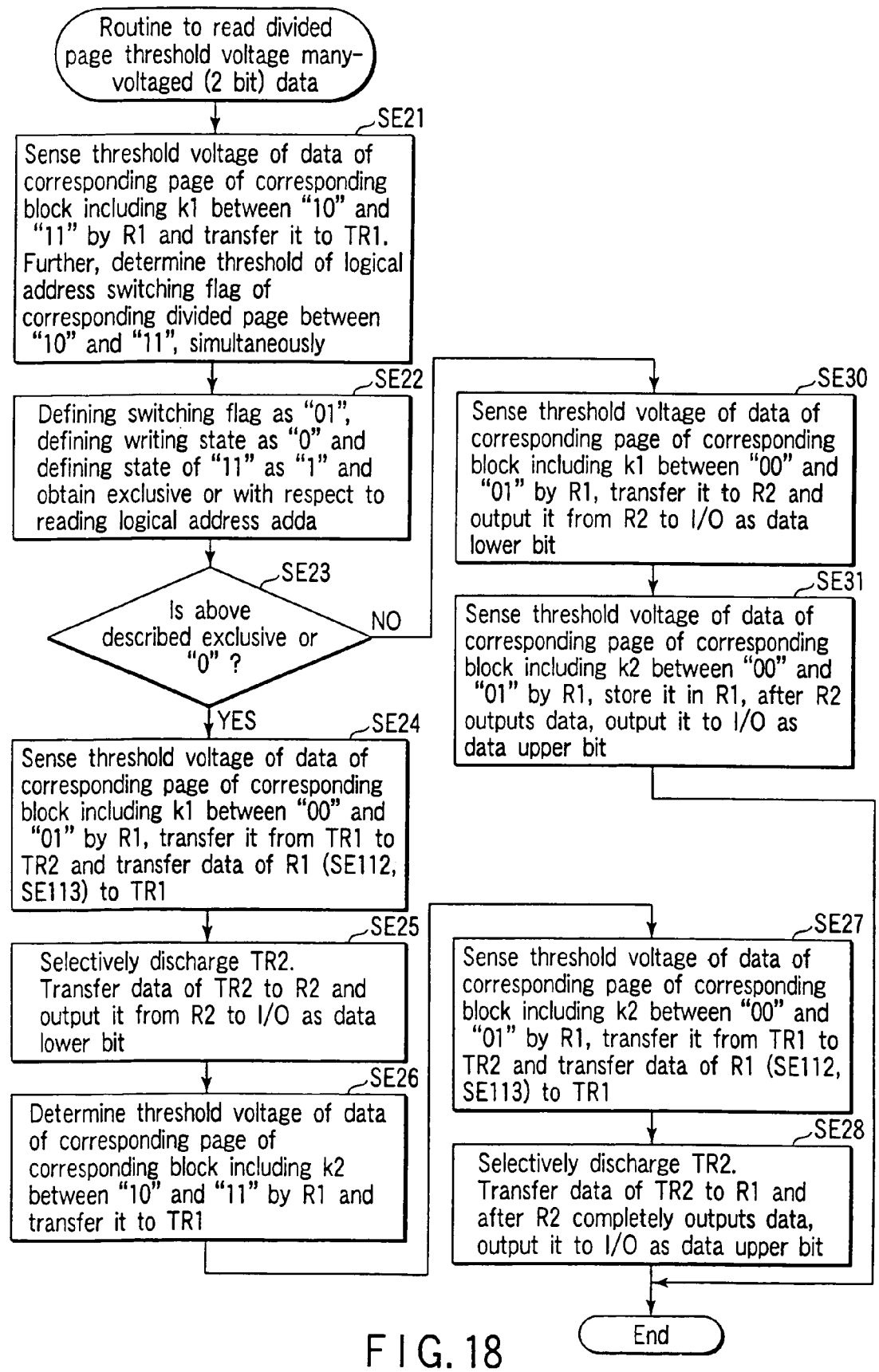
FIG. 18 is a flowchart showing the data reading operation of the semiconductor memory device according to the third embodiment of the present invention.

At first, according to a sequence shown by SE21 of FIG. 18, the data of k1 is read by a threshold voltage determination value between the threshold voltage "11" and the threshold voltage "10". In this case, as shown in FIG. 19, for example, a reference threshold voltage to discriminate the read data may be higher than a upper limit of the threshold voltage "11" and lower than a lower limit of the threshold voltage "10". However, it is preferable that the reference threshold voltage to discriminate the read data may be at the about midpoint of the upper limit of the threshold voltage in the state of "11" and the upper limit of the threshold voltage in the state of "10" since a margin can be secured most easily. As a result, "H" is held in R1 in the case that the memory cell has a threshold voltage higher than the reference threshold voltage to discriminate the read data and "L" is held in R1 in the case that the memory cell has a threshold voltage lower than the reference threshold voltage to discriminate the read data.

Consequently, an exclusive OR with respect to the reading logical address adda is formed by the sense amplifier 46' or the control circuit 40. This circuit will be described later with reference to FIG. 29. Hereby, in the case that k1 and k2 are in the erasing state, the data is written in the logical address 1 in advance and the reading address is 1 and in the case that the data is written in the logical address 2 in advance and the reading address is 2, the exclusive OR becomes "1" ("L"), so that, among 4 values, "11" or "10" may be read as "1" and "00" or "01" may be read as "0". This is easily done by determining the threshold voltage between "00" and "01" in the sequences of SE30 and SE31 with respect to k2 following k1. Alternatively, in the case that the data is written in the logical address 1 in advance on the contrary, the reading address is 2 and in the case that the data is written in the logical address 2 in advance and the reading address is 1, the exclusive OR becomes "0" ("H"), so that, among 4 values, "11" or "01" may be read as "1" and "10" or "00" may be read as "0". In this case, the threshold voltage between "10" and "00" becomes the mid point of the threshold voltage between "11" and "01". Therefore, after the data read in SE21 is held in TR2 and the data read in SE24 is held in TR1, if these data are selectively discharging as shown in SE25, it is possible to draw out the state of "1" ("L") to TR2 in the case of "11" or "01" of the read memory cell data and to draw out the state of "H" to TR2 in the case of "10" or "00" of the read memory cell data. SE21, SE24 and SE25 are the sequences for drawing out the data with respect to k1 and SE26 to SE28 are the equivalent sequences for drawing out the data with respect to k2. These data are held in R1 and R2 to be outputted to the I/O through Q4 in sequence.

If Q5 is turned off, it is possible to perform the data output from R2 in SE25 and effect the sequences from SE26 to SE27 simultaneously, so that it is possible to decrease the data reading time to the outside. Particularly, assuming that a period taken for reading the data is defined as tR and a period taken for transferring the data to the outside is defined as tt2, the maximum period to read one block becomes a longer period among (4×tR+1×tt2) or (2×tR+2×tt2).

Next, data writing sequences according to the present embodiment will be described with reference to FIG. 20 to FIG. 27 below.

At first, the writing data is transferred to TR3 and R2 in SE32 (SE32). Alternatively, in order to clarify the terms, assuming the case that the data has been already written in the cell, the data transferred in SE32 is referred to "the additional writing data" below. Hereby, the writing data transfer can be performed from the first sequence of the writing, differently from the first and second embodiments. As a result, it is possible to shorten a period from the start of the writing operation to the data transmission. Further, in SE33, SE33', SE34 and SE35, the exclusive OR becomes "1" ("L") in the case that the data is an initial value after erasing, in the case that the logical address of the additional writing data is 1 when the data is written in the logical address 1 prior to the logical address 2, and in the case that the logical address of the additional writing data is 2 when the data is written in the logical address 2 prior to the logical address 1. In any case, dividing the data column in two, namely, k1 and k2, the verify writing may be performed with defining "0" as "00" and defining "1" as "11". The detailed flow is shown in SE36. As shown in SE36, after writing the data in the adjoining cells k1 and k2, k1 and k2 are verify-read, respectively and the data is rewritten in k1 and k2, respectively. As a result, even if the threshold voltage is changed by the capacitance between the adjoining cells, it is possible to correct the difference between the threshold voltages of the adjoining cells and make this difference smaller. Additionally, in the case that the data is written after erasing and in the case that the capacitance coupling of the adjoining divided block is so small that it can be ignored, the threshold voltage is changed due to the capacitance coupling of the adjoining cells only in the cell in which the data is written. Therefore, by making the verify voltage step smaller, it is possible to correct the difference between the threshold voltages of the adjoining cells and make this difference smaller up to the verify voltage step.

On the other hand, the exclusive OR becomes "0" ("H") in the case that the logical address of the additional writing data is 2 when the data is written in the logical address 1 prior to the logical address 2, and in the case that the logical address of the additional writing data is 1 when the data is written in the logical address 2 prior to the logical address 1. In this time, a flag to confirm the initial writing with respect to the corresponding divide block is checked. Then, if it is the initial writing, dividing the data column in two, namely, k1 and k2, the verify writing may be performed with defining "0" as "00" and defining "1" as "11". In other case, dividing the data column in two, namely, k1 and k2, if the threshold voltage of the cell in which the data is written is "11", the data is written so that "11" is made into "10" and "11" in accordance with the additional writing data "0" and "1". Further, if the threshold voltage of the cell in which the data is written is "00", the data is written so that "00" is made into "00" and "01" in accordance with the additional writing data "0" and "1". As opposed to the maximum rise of the threshold voltage according to the conventional value is {(threshold voltage in the case that the adjoining cell is "01")−(threshold voltage in the case that the adjoining cell is "11")}×(proportionality factor), according to the present embodiment, it is possible to suppress the rise of the threshold voltage up to {(threshold voltage in the case that the adjoining cell is "10")−(threshold voltage in the case that the adjoining cell is "11")}×(proportionality factor) at the most.

Alternatively, as shown in from SE37 to SE42, by verify-writing k2 after the k1 data of the adjoining cell has been written once, it is possible to correct the rise amount of the threshold voltage by SE38 and SE40 in SE38 and SE41. Therefore, it is possible to make the variation of the threshold voltages smaller compared to a case that k1 is verify-written and then, k2 is verify-written. Additionally, by using flows shown in FIG. 20 to FIG. 27, it is possible to suppress the rise of the threshold voltage by the capacitance coupling of the adjoining cell with a constitution shown in FIG. 11.

Further, by applying the present embodiment in the memory cells in which k1 and k2 are adjoining in a column direction in a NAND constitution like M0 and M1, it is possible to more decrease the miswriting of the data compared to a conventional case. A reason for this will be described below. Assuming that there is a memory cell having a threshold voltage of "11", which is the conventional lowest threshold voltage, a case is considered such that a threshold voltage of two memory cells adjoining this memory cell is Vthr. In this case, a case is considered such that, upon programming, the data selection line of the threshold voltage of Vthr is boosted with a voltage of Vpass and the data selection line of the threshold voltage of "1" is boosted with a voltage of Vpgm higher than Vpass, so that the cell having the threshold voltage of "11" is kept in the non-writing state. In this case, in the cell having the threshold voltage of Vthr, the rise of the electric potential due to the capacitance coupling between the data selection line and the channel electric potential is in proportion to a voltage difference from the electric charge is lead into the channel until the voltage is boosted up to Vpass, so that this rise due to the capacitance coupling is in proportion to (Vpass–Vthr). Therefore, the more Vthr is raised, the more the channel potential of the non-selected cell is lowered. Particularly, if a cell in which Vthr is "10" is formed at the opposite sides of the cell in "11", there was a possibility such that the miswriting occurs when Vpgm is provided to the data selection line of the cell with a threshold voltage of "11". On the contrary, according to the present invention, k1 and k2 are written at one continuous sequence, so that it is possible to suppress a probability such that the threshold voltage of one adjoining cell before writing becomes "01" not more than ½ of a conventional ratio. Therefore, compared to a threshold voltage writing method according to the conventional example, a method thereof according to the present invention enables the miswriting of the cell to be kept in the non-writing state when the data selection line is boosted up to vpgm.

Figure 28:
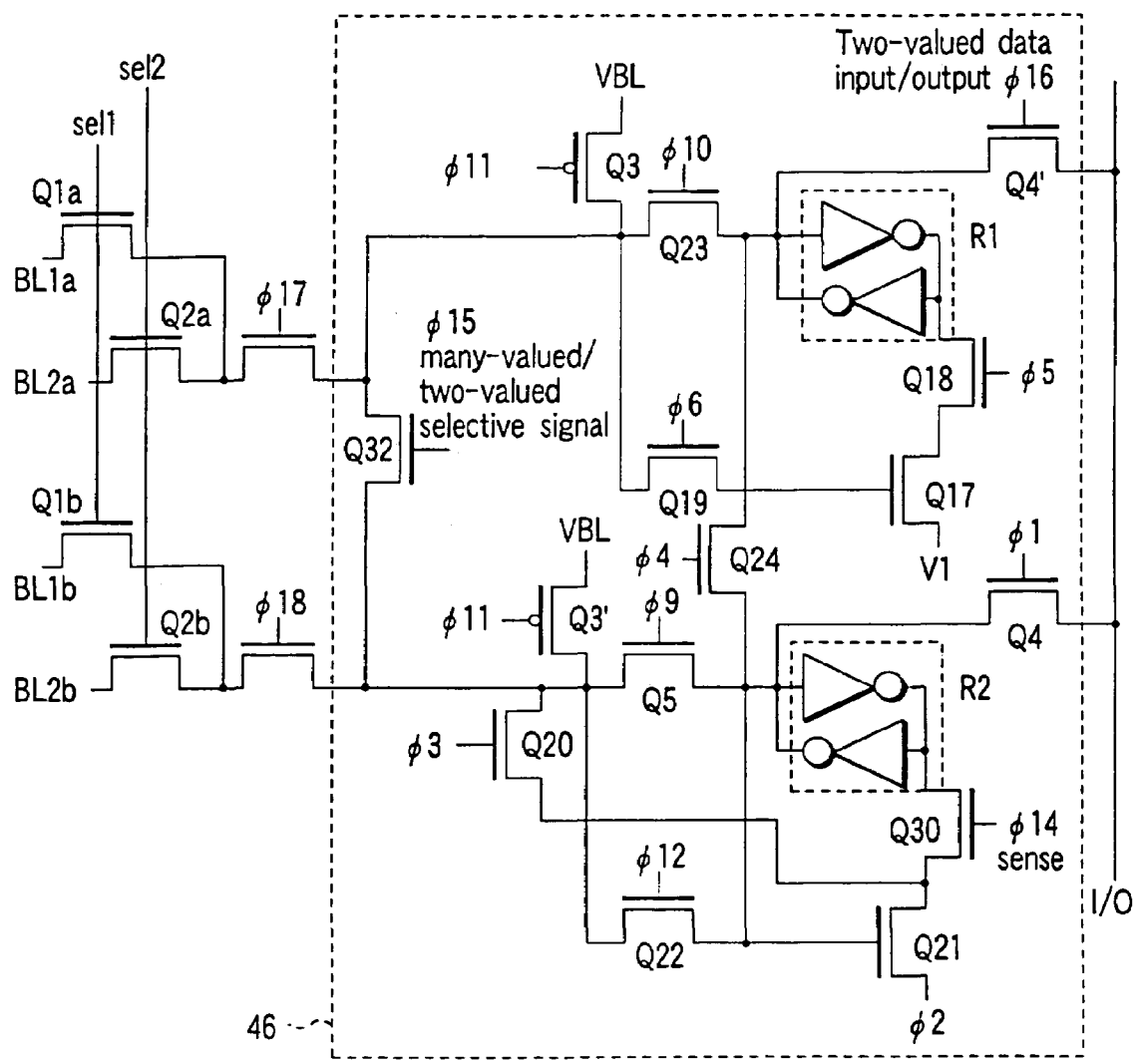
FIG. 28 is a circuit diagram showing a circuit example of a sense amplifier 46.

FIG. 28 shows a circuit example of the entirety of the sense amplifier 46 according to the present embodiment. The present circuit is different from the conventional circuit in that the node of TR2 is divided into two by Q32, two data transfer lines are connected to the divided TR2, respectively, the transistor Q4' is also formed in R1 for the input/output with respect to the I/O and further, φ14 is formed between R2 and Q21. In this case, assuming that φ17 and φ18 are set to "H", φ3, φ4 and φ15 are set to "L", φ12 and φ6 are set to "H" and φ14 are set to the same signal as φ5, and φ16 is set to the same signal as φ1 in accordance with a signal of the column decoder, the present circuit becomes substantially equal with the circuit constitution such that two sense amplifier circuits capable of verifying for each bit, which is publicly known by Jpn. Pat. Appln. KOKAI Publication No. 7-182886 (U.S. Pat. No. 5,452,249), are arranged in parallel. As a result, according to the present circuit, it is possible to simultaneously perform the writing, the reading and the erasing the data of 2 values in BLxa and BLxb (x=1, 2), respectively.

On the other hand, by making φ14 and φ16 into "L", making φ15 into "H", making one of φ17 and φ18 into "H" and other one thereof into "L" in accordance with the data transfer line to be read, as described above, the data with 4 values is capable of being read and written in the two data transfer lines in accordance with the present embodiment. Then, it is possible to easily realize a semiconductor storage circuit with 4 values, in which the threshold voltage variation due to the capacitance coupling of the adjoining cell is decreased by adding just six transistors, namely, Q32, Q19, Q22, a transistor connected by φ17, and a transistor connected by φ18 and Q24, to the circuit constitution according to Jpn. Pat Appln. KOKAI Publication No. 7-182886 (U.S. Pat. No. 5,452,249).

Alternatively, FIG. 29 illustrates a specific circuit example of the sense amplifier 46' connected to the writing order storage cell array 7 according to the present embodiment. Since the determination result of the writing order according to the present embodiment is sensed by the data register R1, as shown in FIG. 29, the output of N3 and the output of N4 obtaining the reverse output of N3 of R1 are controlled by Q40 and Q41 in accordance with the signals from the control circuit 40, the exclusive OR is formed with respect to a value of adda from the address buffer 47 and then, the output is inputted in the control circuit 40. In this way, be adding at least six transistors to the sense amplifier 46, the sense amplifier 46' is capable of outputting the exclusive OR, so that it is possible to realize the sense amplifier 46' with a very small area. Further, the same circuit as that of the sense amplifier 46 is used as constitutional elements of the sense amplifier 46', so that a timing design of the circuit can be easily made, the control line except for φ1 of the sense amplifiers 46 and 46' can be commonly used and the wiring area can be decreased.

Alternatively, a constitution of the sense amplifier 46' shown in FIG. 11 enables to read the data of R1 and R2 to the I/O line independently as maintaining the data of R1, R2 and TR3. Here, it is possible to branch all of the states explained with reference to FIG. 18 to FIG. 27 in accordance with the data stored in R1 of the sense amplifier 46'. Therefore, even if the control lines of the sense amplifier except for input and output to the I/O lines are common among the sense amplifiers 46 and 46', the sense amplifiers 46 and 46' are capable of being activated with a common signal by controlling Q40 and Q41 by the control circuit 40, so that it is possible to make the timing generating circuit smaller and to decrease the wiring area.

Figure 30A:
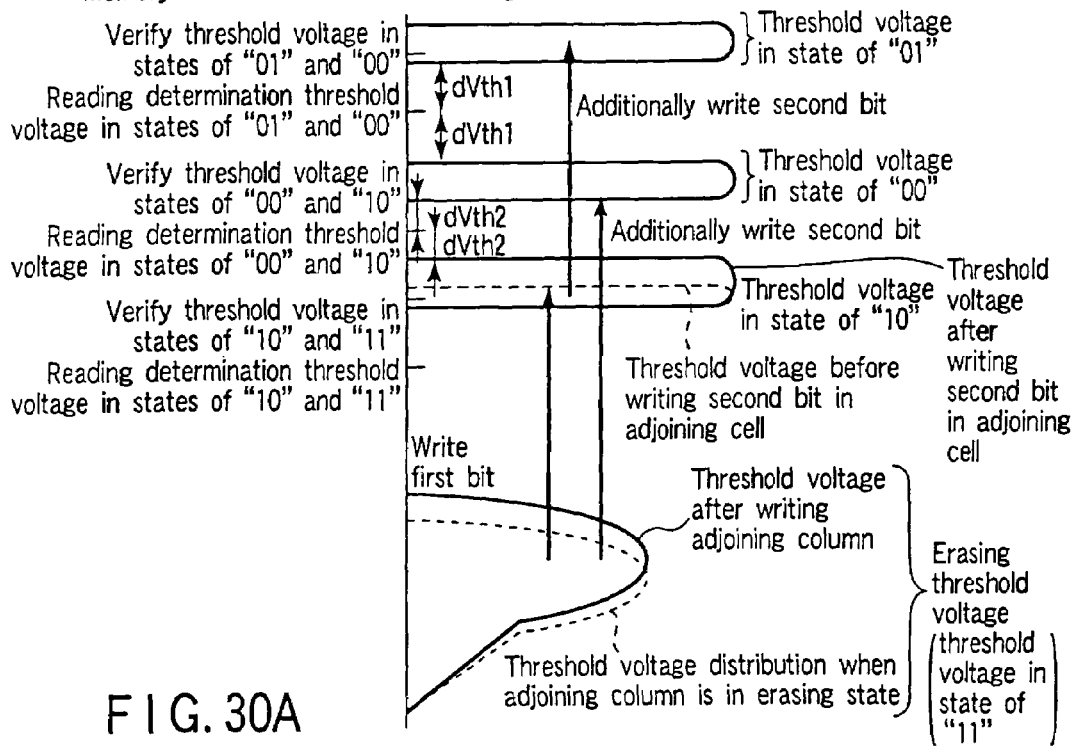
FIGS. 30A and 30B are diagram showing examples of setting of a threshold voltage.
Figure 30B:
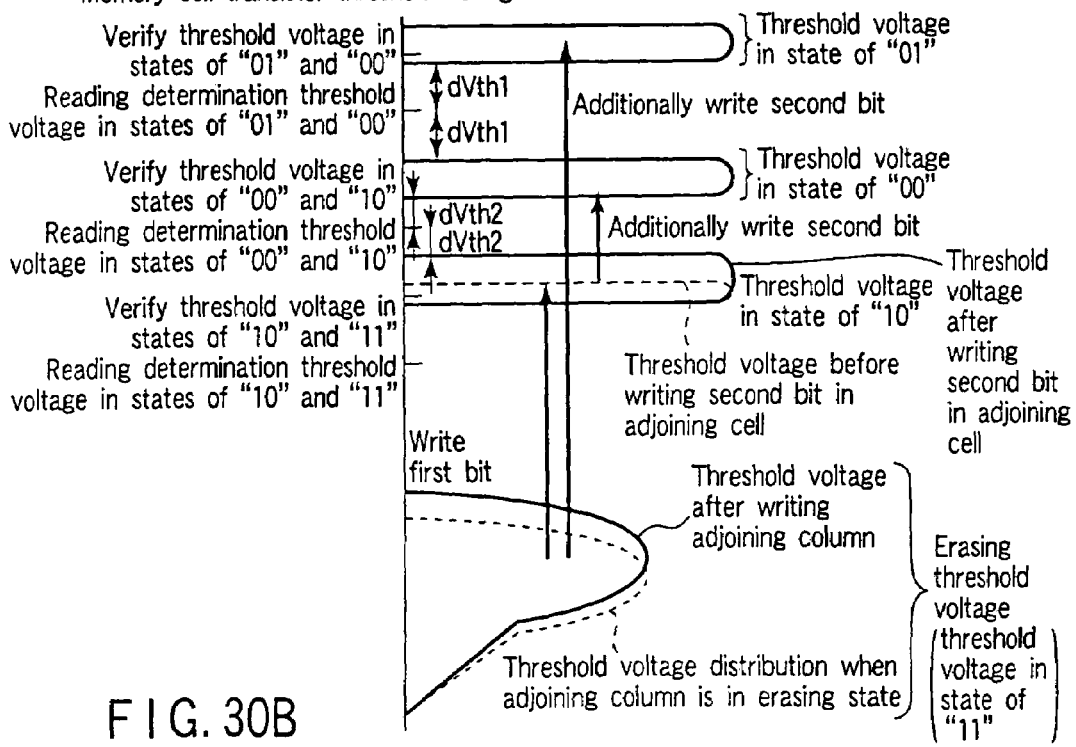

Alternatively, according to the present embodiment, an example is shown such that, after: erasing, the data of the logical address 1 to be written in the divided block at first (first bit) is associated with 2 values of a state of "11" and a state of "00" to be stored in the adjoining two cells. However, for example, a method as shown in FIG. 30A for associating a second bit to "11" and "00", "10" and "01" respectively in such a manner that the data to be written at first (first bit) is associated with 2 values of a state of "11" and a state of "10" to be stored in the adjoining two cells. Further, a method as shown in FIG. 30B for associating a second bit to "11" and "01", "10" and "00" respectively in such a manner that the data to be written at first (first bit) is associated with 2 values of a state of "11" and a state of "10" to be stored in the adjoining two cells may be applicable. In FIG. 30A and FIG. 30B, the maximum threshold voltage of the first bit is lower than "00", i.e., "10". Therefore, particularly, by applying the present embodiment in the memory cells in which k1 and k2 are adjoining in a column direction in a NAND constitution like M0 and M1, it is possible to more decrease the miswriting of the data.

Figure 19:
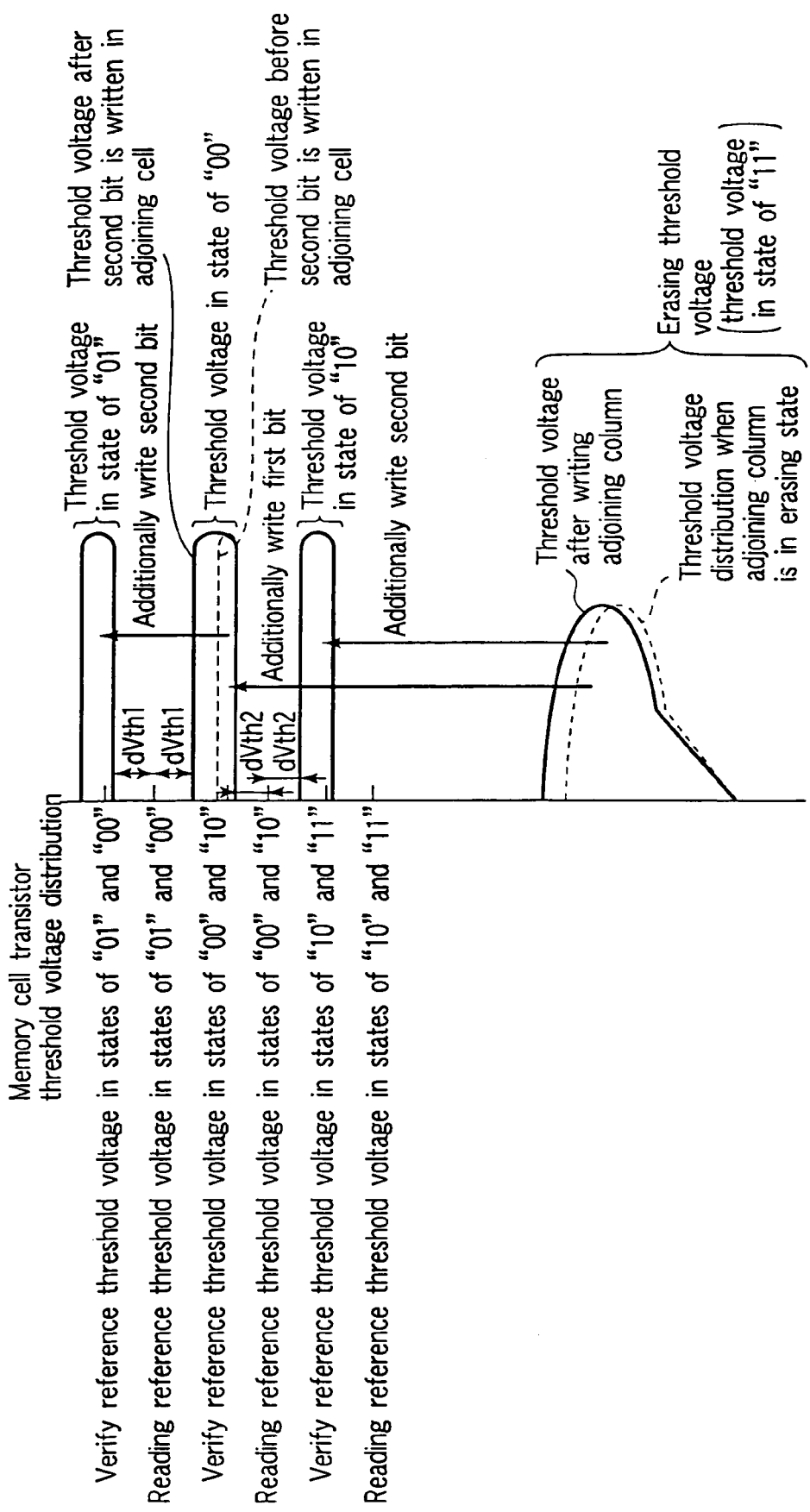
FIG. 19 is a diagram showing a threshold voltage distribution with respect to setting of the threshold voltage shown in FIG. 18.
Figure 20:
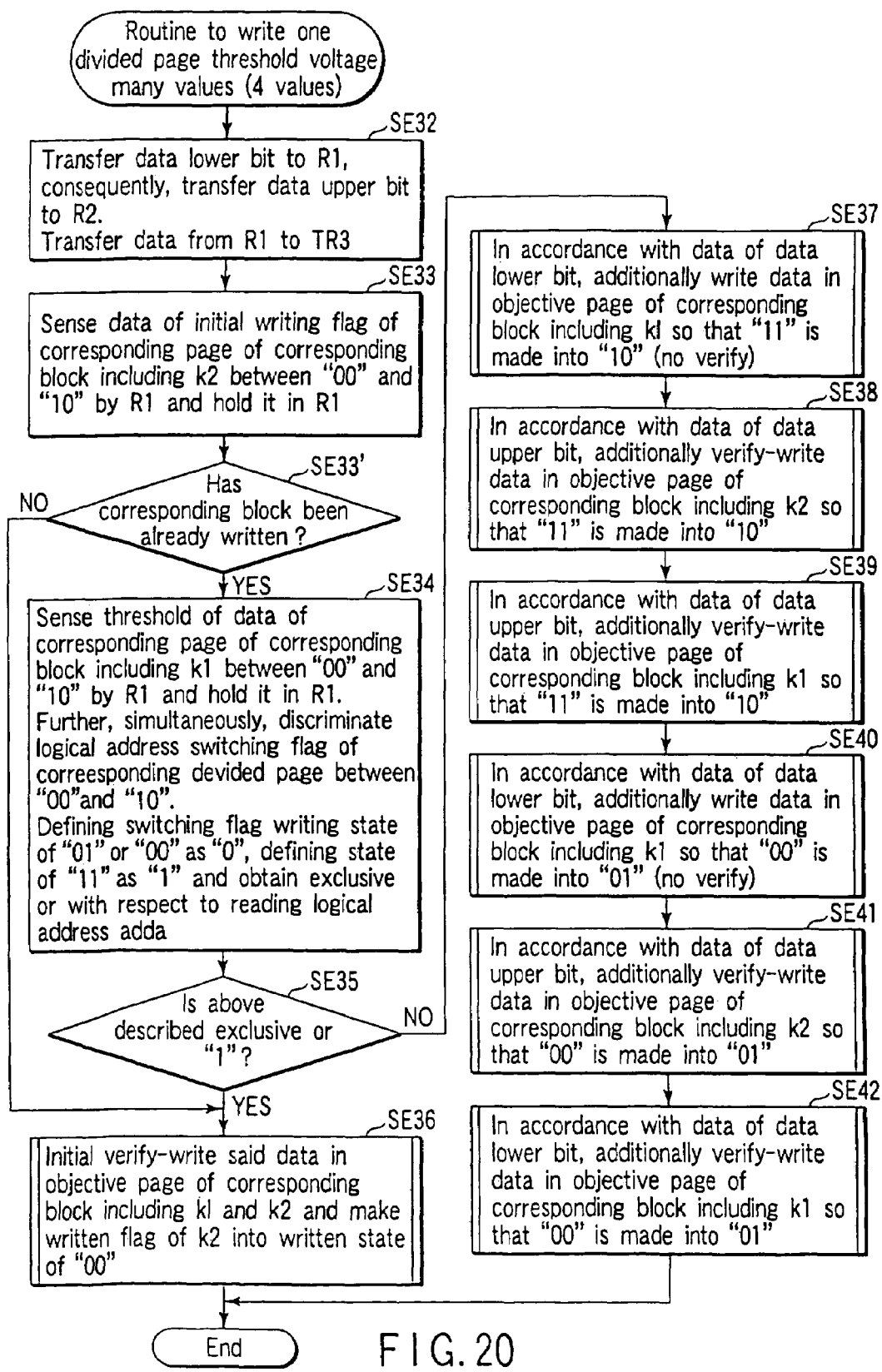
FIG. 20 is a flowchart showing the data writing operation of the semiconductor memory device according to the third embodiment of the present invention.
Figure 21:
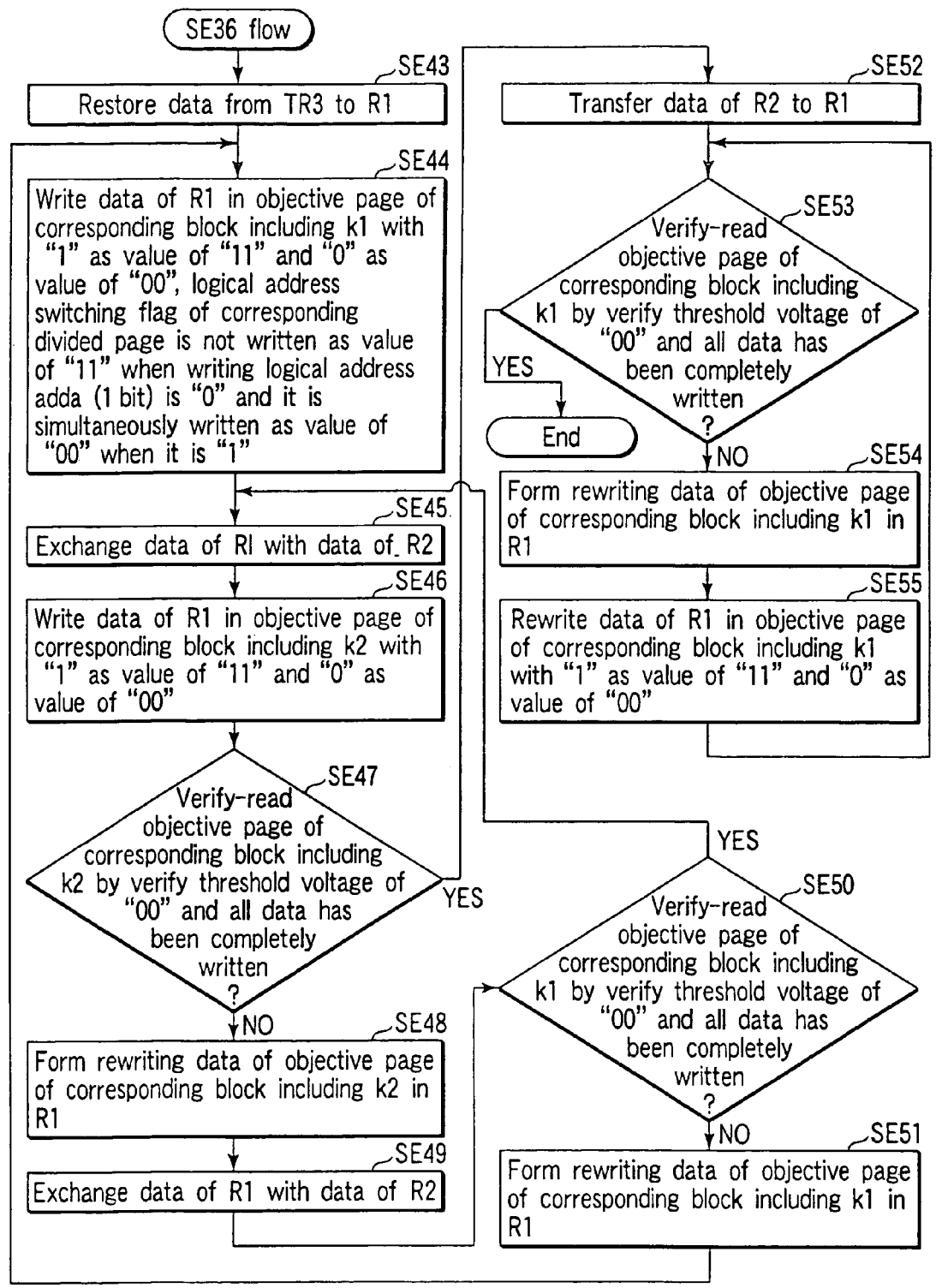
FIG. 21 is a flowchart of SE36 shown in FIG. 20.
Figure 22:
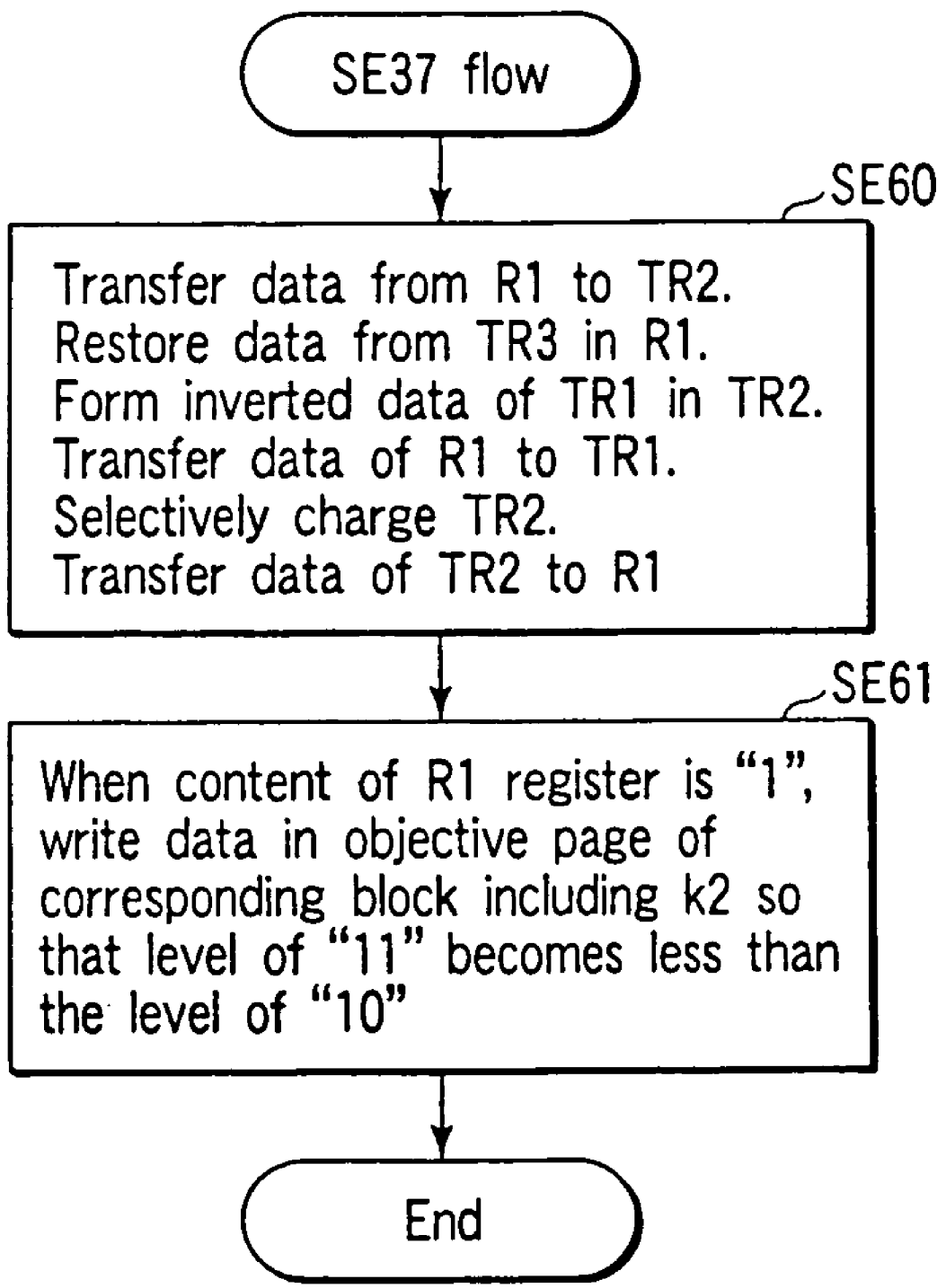
FIG. 22 is a flowchart of SE37 shown in FIG. 20.
Figure 23:
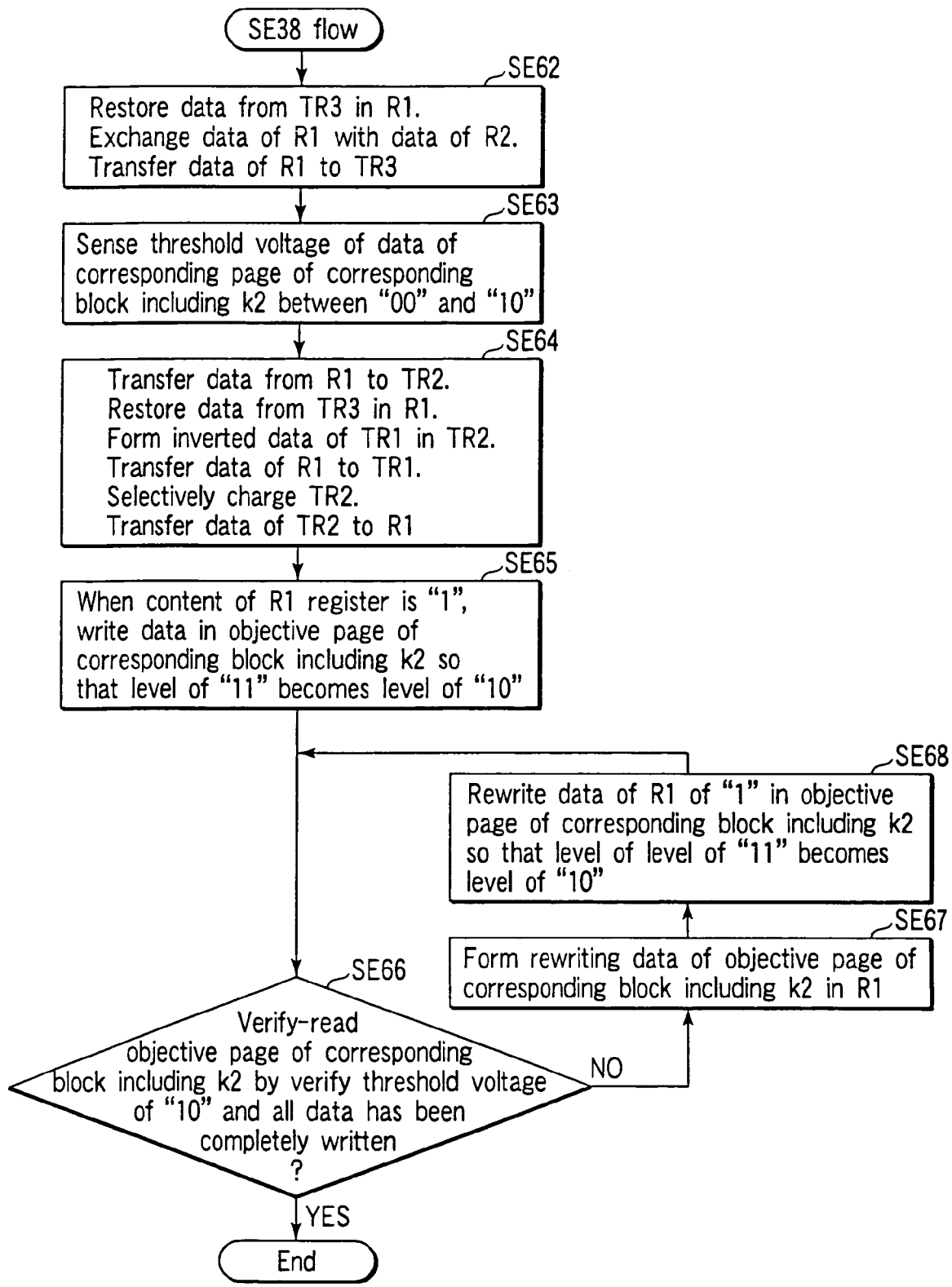
FIG. 23 is a flowchart of SE38 shown in FIG. 20.
Figure 24:
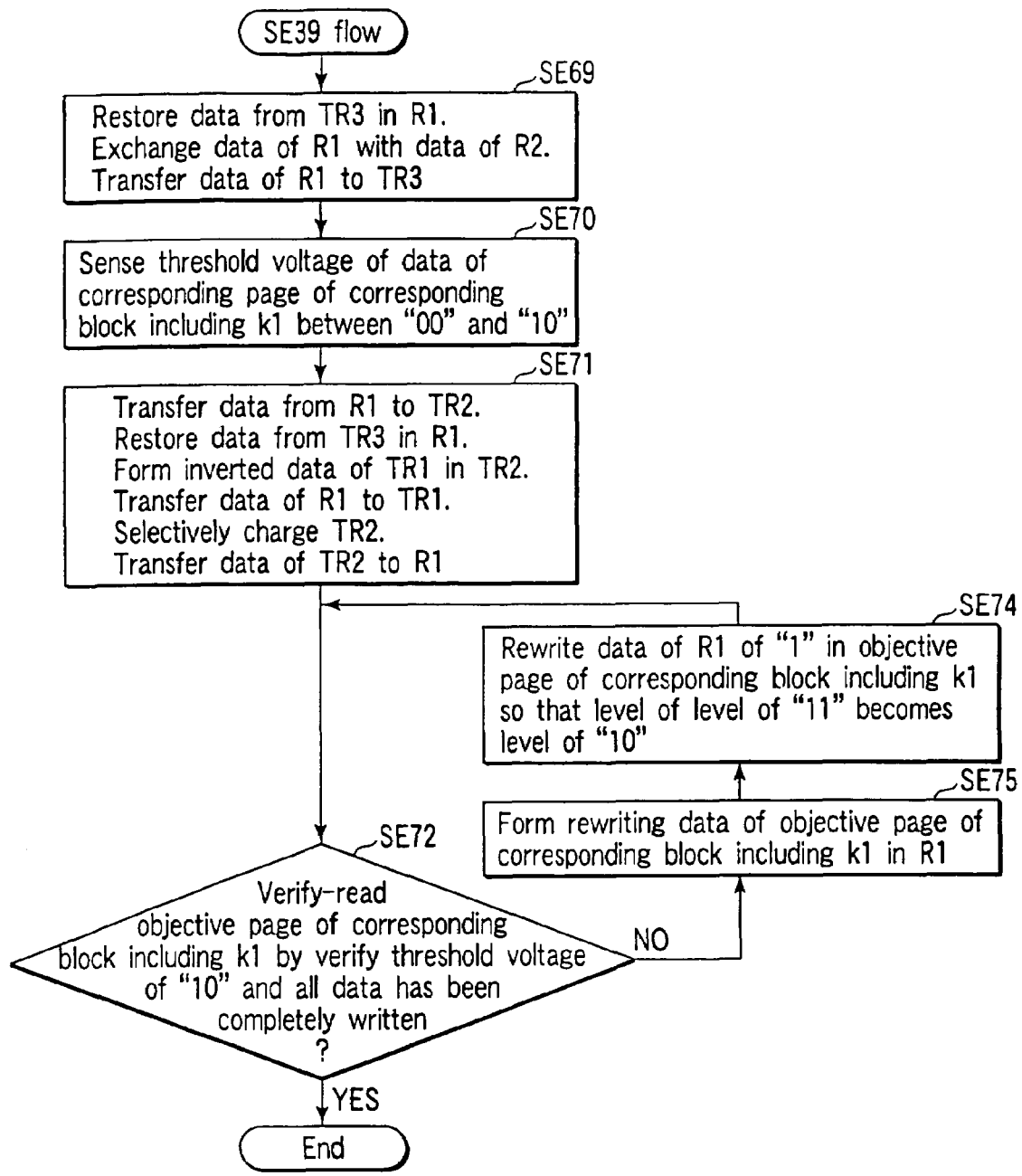
FIG. 24 is a flowchart of SE39 shown in FIG. 20.
Figure 25:
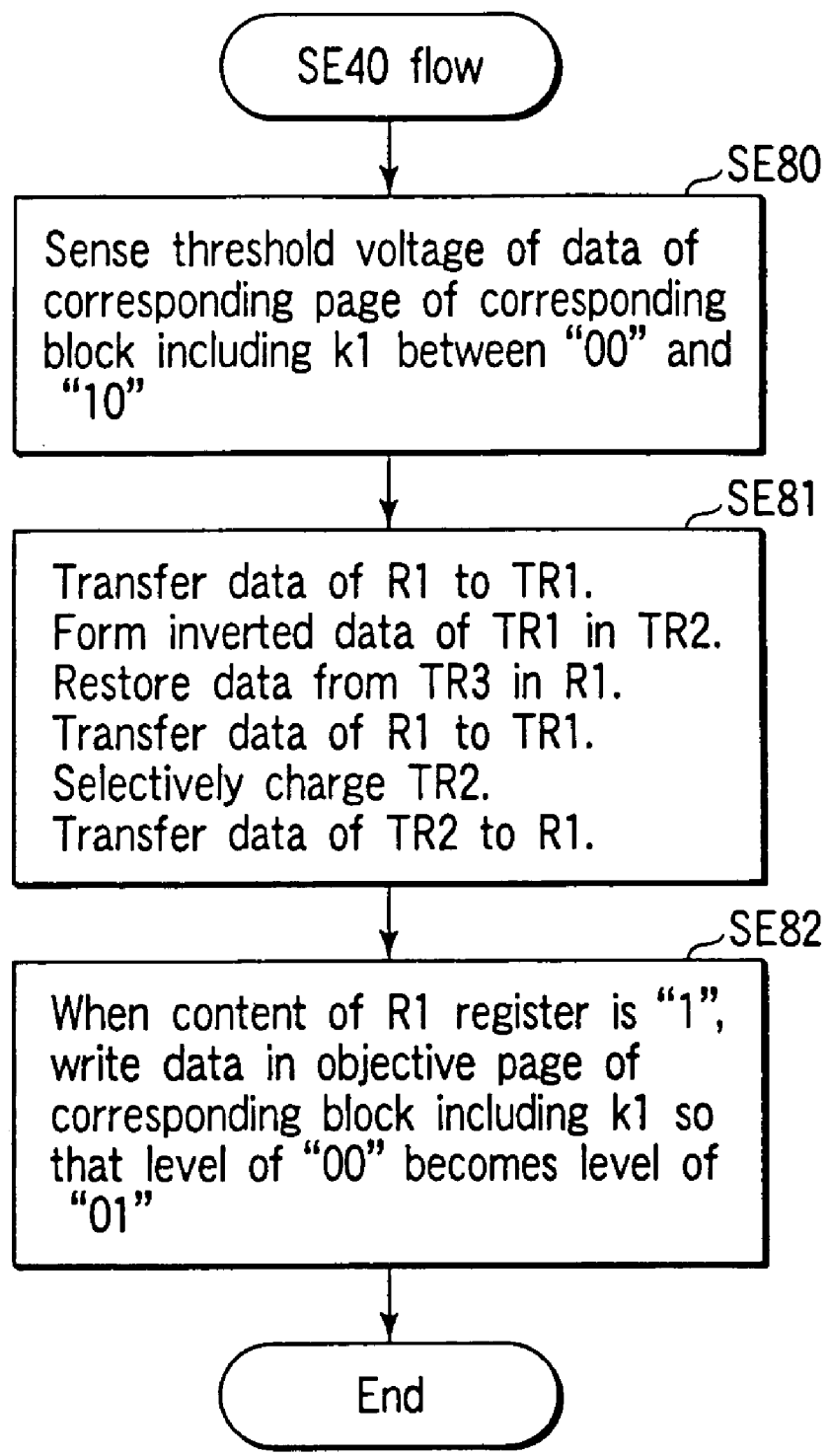
FIG. 25 is a flowchart of SE40 shown in FIG. 20.
Figure 26:
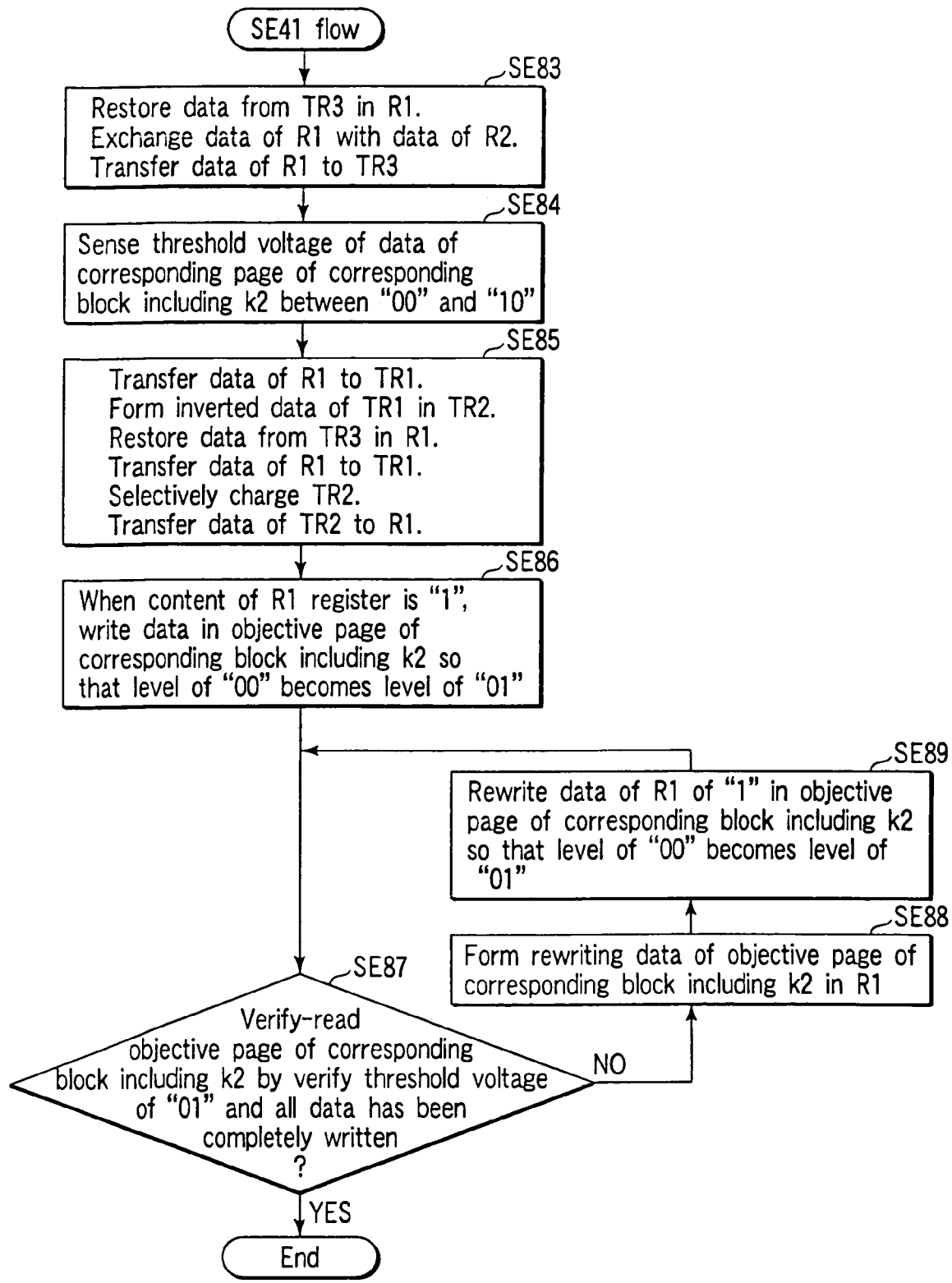
FIG. 26 is a flowchart of SE41 shown in FIG. 20.
Figure 27:
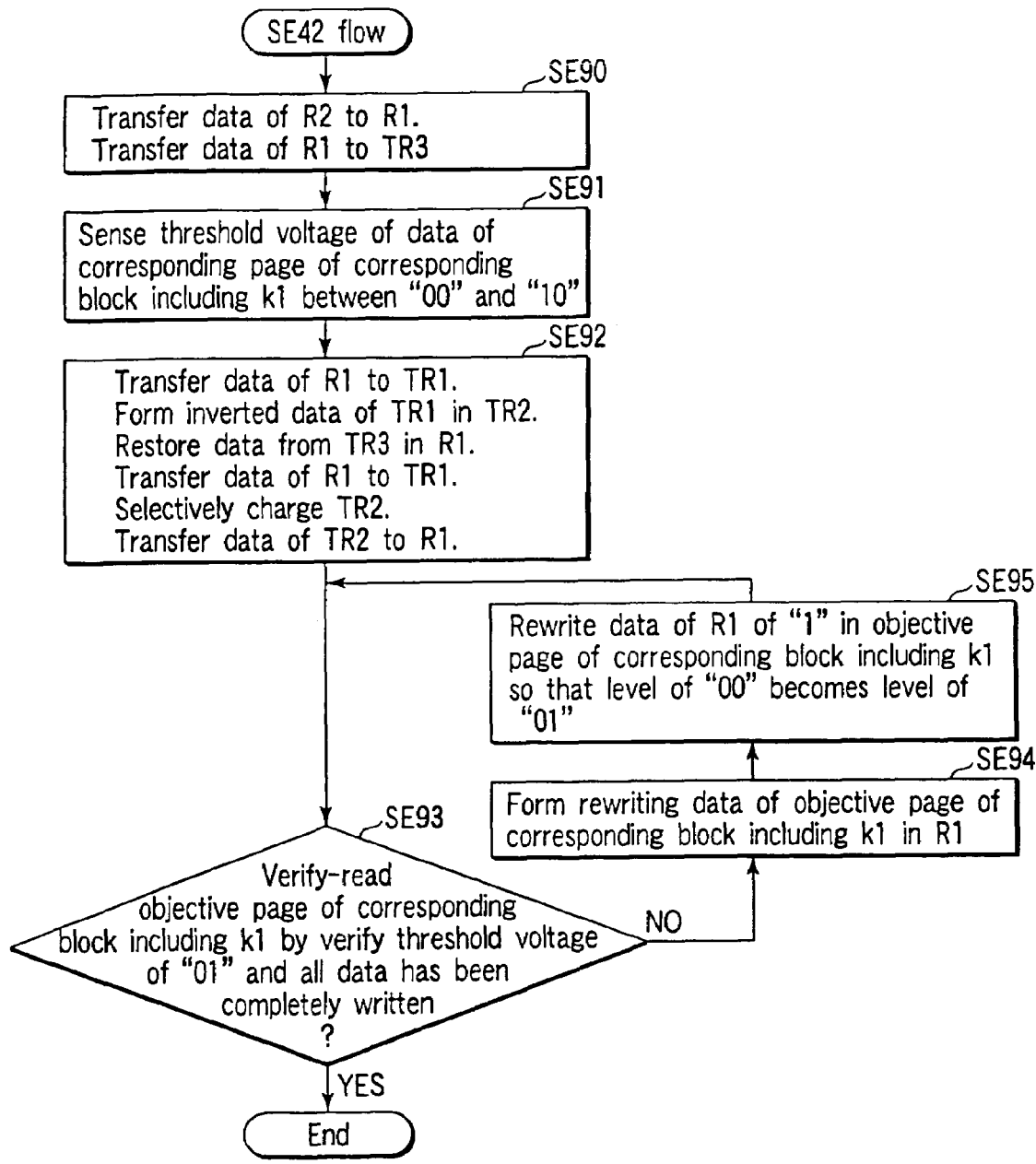
FIG. 27 is a flowchart of SE42 shown in FIG. 20.

FIG. 19, FIG. 30A and FIG. 30B illustrate relations of distributions of a setting value of a reference threshold voltage to discriminate the read data and the threshold voltage. For example, in FIG. 19, the width of the threshold voltage of "00" is more widened than the threshold voltages of "11" and the threshold voltages of "01" since the threshold voltage rise due to the capacitance coupling of the adjoining cells is highest in the threshold voltage of "00". Therefore, it is preferable that the separation width of the threshold voltage of "00" and the threshold voltage of "01" is kept larger than the separation widths of the threshold voltage of "10" and the threshold voltage of "00".

Additionally, in FIG. 30A and FIG. 30B, the width of the threshold voltage of "10" is more widened than the threshold voltages of "00" and the threshold voltages of "01" since the threshold voltage rise due to the capacitance coupling of the adjoining cells is highest in the threshold voltage of "10". Therefore, it is preferable that the separation width of the threshold voltage of "10" and the threshold voltage of "00"

is kept larger than the separation widths of the threshold voltage of "00" and the threshold voltage of "01".

Alternatively, according to the present embodiment, after erasing all blocks and writing the data in a memory block in which adda is 0, if the data of a memory block, of which address is the same as that of the foregoing memory block and of which address bit equivalent to adda is only different, is read, the data as same as the written data is read even after the blocks are erased. Therefore, without providing adda, it is possible to read the data stored at first after erasing.

Further, it is also obvious that the present embodiment has the advantages of (2), (4) and (6) according to the first embodiment and the advantages in common to the first and second embodiments.

Fourth Embodiment

Figure 33A:
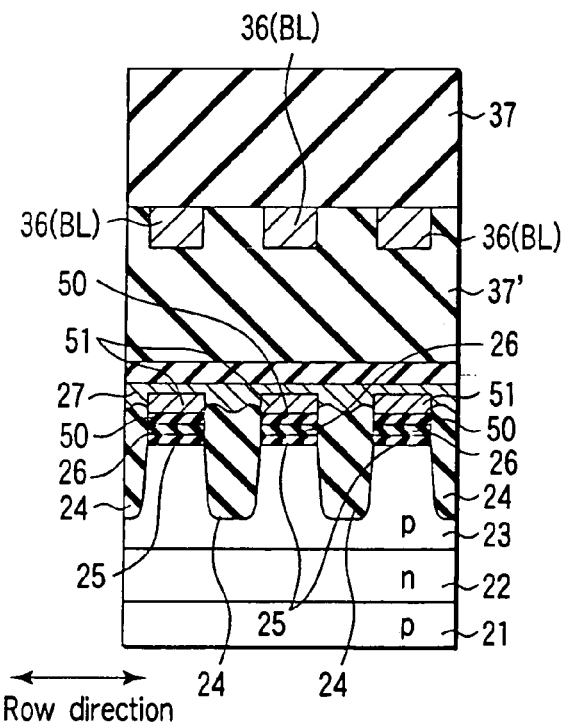
FIGS. 33A and 33B are cross sectional views showing a example of a memory cell to be used for a semiconductor memory device according to a fourth embodiment of the present invention.
Figure 33B:
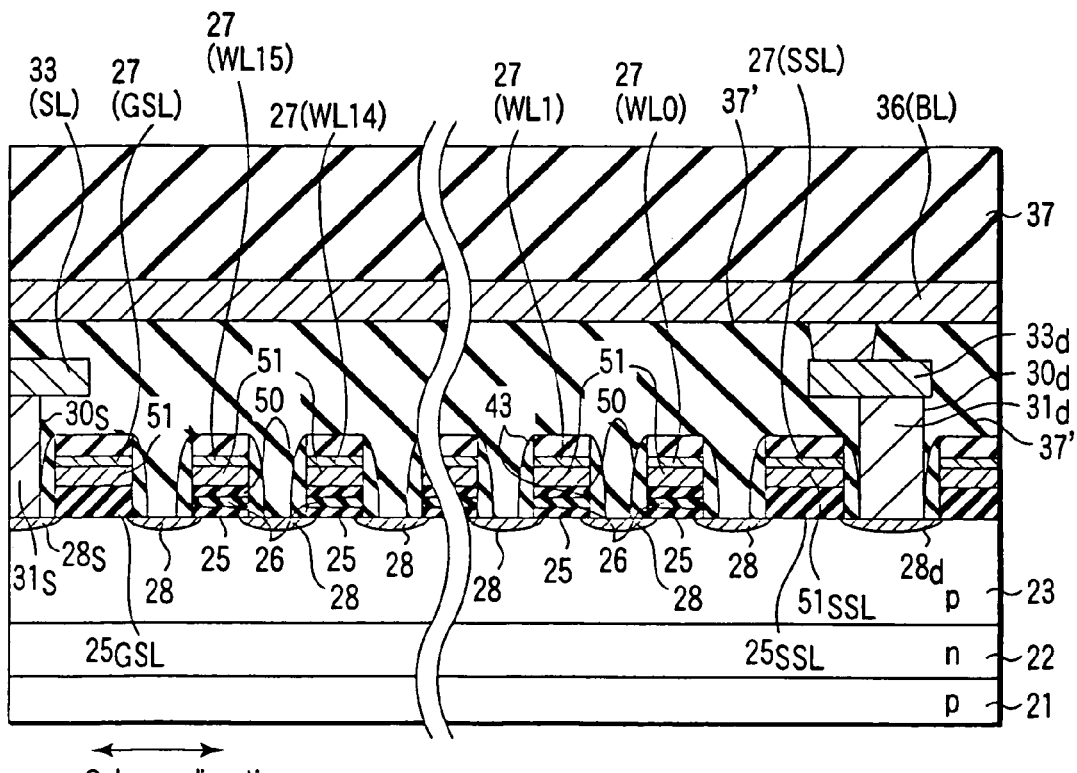

FIG. 33A and FIG. 33B illustrate a memory cell constitution according to the fourth embodiment of the present invention.

According to the present embodiment, the NAND cell block 49 by the use of a floating type gate according to the first, second and third embodiments is changed into a NAND cell block by the use of MONOS type gate.

The cross sections shown in FIG. 33A and FIG. 33B correspond to the cross sectional view taken along the line A—A of the NAND cell block shown in FIG. 32A and the cross sectional view taken along the line B—B of the NAND cell block shown in FIG. 32B, respectively. Additionally, a plane view is the same as FIG. 31B, so that it is herein omitted.

As shown in FIG. 33A and FIG. 33B, for example, nonvolatile memory cells M0 to M15 comprising a MOS transistor having an charge accumulation layer 26 composed of SiN and SiON are connected in series. One end is connected to a data transfer line represented by BL through the block selection transistor S1 and the other end thereof is connected to a common source line represented by SL through the block selection transistor S2. Alternatively, respective transistors are formed on the same well. In FIG. 33A and FIG. 33B, for example, an charge accumulation layer 26 composed of SiN and SiON with a thickness of 3 nm to 56 nm is formed, for example, on a p-type silicon area (semiconductor area) 23 with boron impurity density being in the range of $10^{14}$ cm$^{-3}$ to $10^{19}$ cm$^{-3}$ for example, through a tunnel gate insulation film composed of a silicon oxide film or an oxynitride film with a thickness of 0.5 nm to 10 nm. For example, the control gate 27 with a thickness of 10 nm to 500 nm comprising a stack constitution of polycrystalline silicon, WSi (tungsten silicide) and polycrystalline silicon or a stack constitution of NiSi, MoSi, TiSi, CoSi and polycrystalline silicon is formed on this charge accumulation layer 26, for example, through the inter-layer insulation film 50 composed of a silicon oxide film with a thickness of 2 nm to 30 nm. This control gate 27 is formed up to a block boundary in a horizontal direction of a page space in such a manner that it is connected to the adjoining memory cell block in FIG. 31B and the control gate 27 forms the data selection lines WL0 to WL15 and the selective gate control wires SSL and GSL. Alternatively, it is preferable that the p-type silicon region 23 is capable of being applied with a voltage by an n-type silicon area 22 independently of the p-type substrate 21 for decreasing a boosting circuit load upon erasing the data and suppressing the electric power consumption. According to a gate shape of the present embodiment, since the side-wall of the p-type silicon region 23 is covered with the insulation film 24, this side-wall is not exposed by the etching before this side-wall forms the floating gate electrode 26 is formed. As a result, it is possible to prevent the gate electrode 26 from being lower than the p-type silicon region 23. Therefore, a parasitic transistor, of which gate electric field concentration and threshold voltage are lowered, is hardly generated in a border between the p-type silicon region 23 and the insulation film 24. Further, a phenomenon such that the decrease of writing threshold voltage arising from the electric field concentration, namely, so-called sidewalk phenomenon is hardly generated, so that it is possible to form a transistor with higher reliability.

At the opposite sides of these gate electrodes, for example, an n-type diffused layer 28 as a source or a drain electrode is formed with interposing a side-wall insulation film 43 composed of a silicon nitride film or a silicon oxide film with a thickness of 5 nm to 200 nm. By these n-type diffused layers 28, the charge accumulation layer 26 and the control gate 27, an M—ONO—S type nonvolatile EEPROM cell is formed and a gate length of the charge accumulation layer 26 is defined in the range of 0.01 μm or more and 0.5 μm or less. The n-type diffused layers 28 as the source or the drain electrode are formed at the depth in the range of 10 nm to 500 nm so that, for example, a surface density of phosphor, arsenic and antimony becomes $10^{17}$ cm$^{-3}$ to $10^{21}$ cm$^{-3}$. Further, these n-type diffused layers 28 are shared by the adjoining memory cells, so that the NAND connection is realized. Further, in the drawing, reference numerals 27SSL and 27GSL denote the gate electrodes, which are connected to the block selection line and are equivalent to SSL and GSL, respectively. These gate electrodes 27SSL and 27GSL are formed by the same layer as the floating gate electrode of the above described floating gate type EEPROM. The gate electrode lies opposite to the p-type silicon region 23, for example, through the gate insulation films 25SSL and 25GSL composed of a silicon oxide film or an oxynitride film with a thickness of 3 nm to 15 nm, so that it forms a MOS transistor. In this case, the gate lengths of the gate electrodes 27SSL and 27GSL are longer than the gate length of the gate electrode of the memory cell. If the gate lengths thereof are defined in the range of 0.02 μm or more and 1 μm or less, it is possible to obtain a sufficient on/off ratio between the case that the block is selected and the case that it is not selected largely and it is possible to prevent miswriting and misreading.

Alternatively, a source formed at one side of 27SSL, or the n-type diffused layer 28*d* as a drain electrode are connected to a data transfer line 36 (BL) composed of, for example, tungsten, tungsten silicide, titanium, titanium nitride, or aluminum via a contact 31*d*. In this case, the data transfer line 36 (BL) is formed up to a block boundary in a vertical direction of a page space in such a manner that it is connected to the adjoining memory cell block in FIG. 31B. On the other hand, an n-type diffused layer 28S formed at one side of 27GSL as a source or a drain electrode is connected to SL as a source line via a contact 31*s*. This source line SL is formed up to a block boundary in a horizontal direction of a page space in such a manner that it is connected to the adjoining memory cell block in FIG. 31B. It is a matter of course that the n-type diffused layer 28S is formed up to a block boundary in a horizontal direction of a page space to form a source line. As these BL contact and SL contact, for example, a conductive material such as polycrystalline silicon, tungsten, tungsten silicide, Al, TiN and Ti or the like, which are doped in an n-type or a p-type, are used and these conductive materials are filled in a contact hole to form a conductive body area. Further, the space between these SL and BL and the above described transistor is filled by, for example, the interlayer insulation film 37' composed of $SiO_2$ and SiN. Alternatively, on the upper portion of this BL, for example, an insulation film protective film 37 composed of $SiO_2$, SiN or polyimide and an upper wire composed of W, Al and Cu (not shown) are formed.

According to the present embodiment, a MONOS type cell is used in addition to the advantages of the floating gate type cell shown in FIG. 32A, and FIG. 32B, so that it is possible to lower a writing voltage and an erasing voltage than those of the floating gate type EEPROM cell and it is possible to prevent dielectric breakdown even if the separation distances between the elements are narrowed and the gate insulation film is made thinner. Therefore, it is possible to reduce an area of a circuit, to which a high voltage is applied, so that a chip area is capable of being contracted.

Further, compared to the floating gate type cell, it is possible to reduce a thickness of the electric charge accumulation electrode 26, for example, to not more than 20 nm, to reduce an aspect upon forming a gate, a processing shape of a gate electrode is improved and embedding between the gates of the interlayer insulation film 37' is also improved, so that it is possible to more improve the dielectric breakdown voltage. Alternatively, a process for forming the floating gate electrode and a process for forming a slit are not necessary, so that it is possible to more shorten a process step. Additionally, the electric charge accumulation electrode 26 is an insulation material and the electric charge is captured by each electric charge trap, so that the electric charge is hardly escaped against a radiation ray irradiation. Further, even if the side-wall insulation film 43 of the electric charge accumulation electrode 26 becomes thinner, the electric charge captures by the electric charge accumulation electrode 26 is not entirely escaped, so that it is possible to maintain a good electric charge holding property. Further, it is possible to form the electric charge accumulation electrode 26 without displacement with respect to the p-type silicon region 23, so that it is possible to obtain more uniformed capacitances of the electric charge accumulation electrode 26 and the p-type silicon region 23. As a result, it is possible to reduce the variance of the capacitances between the memory cells.

In the memory cells of the semiconductor memory devices according to the above described first, second and third embodiment, it is possible to use the MONOS type cell as described according to the present embodiment in addition to the floating gate type cell.

Fifth Embodiment

Figure 34A:
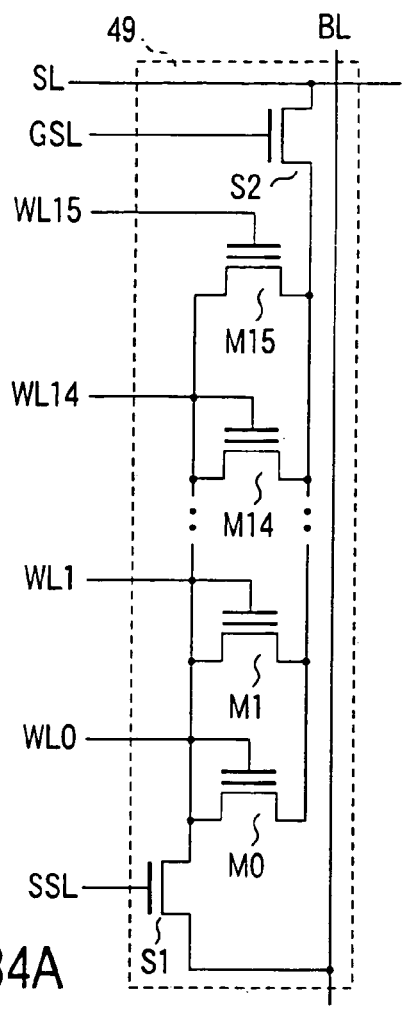
FIG. 34A is an equivalent circuit diagram showing a example of a memory cell to be used for a semiconductor memory devices according to a fifth embodiment of the present invention.
Figure 34B:
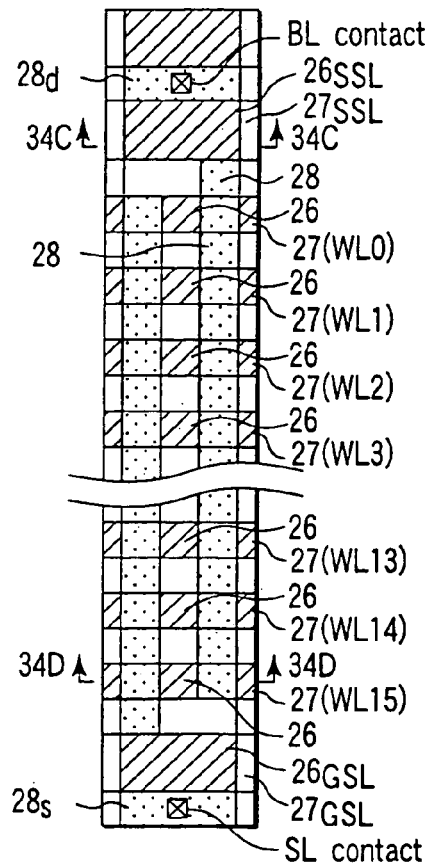
FIG. 34B is a plan view showing an example of a memory cell to be used for the semiconductor memory device according to the fifth embodiment of the present invention.
Figure 34C:
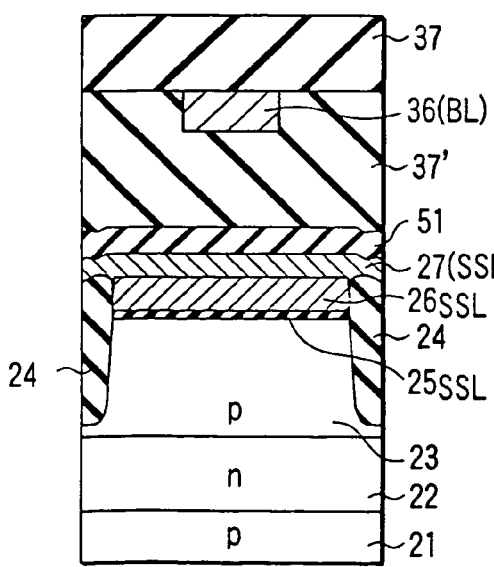
FIG. 34C is a cross sectional view taken along the line 34C—34C shown in FIG. 34B.
Figure 34D:
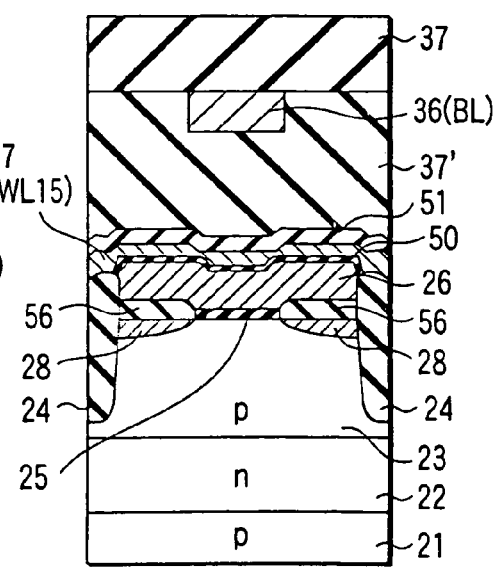
FIG. 34D is a cross sectional view taken along the line 34D—34D shown in FIG. 34B.

FIG. 34A and FIG. 34D illustrate memory cell constitutions according to the fifth embodiment of the present invention.

According to the present embodiment, the NAND cell block 49 described according to the first to fourth embodiments is changed into an AND cell block. Alternatively, in the following explanation, the same reference numerals are given to the same portions and the same voltage relations as those in the first to fourth embodiments and a double explanation is herein omitted.

FIG. 34A is a circuit view of an AND cell block corresponding to the memory cell blocks 49 and 49'. A reference numeral 49 shown in FIG. 34A denotes an AND cell block 49 to store the data. In the AND cell block 49, nonvolatile memory cells M0 to M15 comprising a MOS transistor having a floating gate electrode are connected in parallel and one end thereof is connected to a data transfer line denoted as BL via a block selection transistor S1 and the other end thereof is connected to a common source line denoted as SL via a block selection transistor S2. Alternatively, respective transistors are formed on the same well. If n is defined as a block index (natural number), the control electrodes of respective memory cells M0 to M15 are connected to data selection lines represented by WL0 to WL15. Further, one memory cell block is selected among a plurality of memory cell blocks along the data transfer line to be connected to the data transfer line, so that the control electrode of the block selection transistor S1 is connected to the block selection line SSL. Alternatively, the control electrode of the block selection transistor S2 is connected to the block selection line GSL to form so-called AND type memory cell block 49 (an area encircled by a dotted line). According to the present embodiment, an example is shown such that $16=2^4$ pieces of memory cells are connected to the memory cell block 49. However, the number of the memory cells to be connected to the data transfer line and the data selection line may be a plural number and it is preferable that the number thereof is $2^n$ (n is a positive integer number) for the address decoding.

FIG. 34B is a plane view of the AND cell block, FIG. 34C is a cross sectional view taken along the line 34C—34C shown in FIG. 34B and FIG. 34D is a cross sectional view taken along the 34D—34D shown in FIG. 34B. Particularly, in order to promote a better understanding of a cell constitution, FIG. 34B illustrates only a constitution lower than the gate electrode 27. In FIG. 34C and FIG. 34D, for example, the charge accumulation layers 26 composed of polycrystalline silicon added with $10^{18}$ $cm^{-3}$ to $10^{21}$ $cm^{-3}$ of phosphor or arsenic is formed with a thickness of 10 nm to 500 nm for example, via a tunnel gate insulation film with a thickness of 3 nm to 15 nm formed by silicon oxide films or oxynitride films 25, 25SSL, 25GSL. These charge accumulation layers are formed, for example, on an area in which an element isolation insulation film 24 composed of silicon oxide film is not formed, with being self-alignment to a p-type silicon region 23.

On the charge accumulation layers 26, for example, the block insulation film 50 is formed, which is composed of a silicon oxide film or an oxynitride film, or a silicon oxide film, a silicon nitride film and a silicon oxide film, with a thickness in the range of 5 nm to 30 nm. These block insulation films 50 are formed, for example, on an area in which an element isolation insulation film 24 composed of silicon oxide film is not formed, with being self-alignment to the p-type silicon region 23. For example, these block insulation films 50 can be formed in such a manner that the silicon oxide or oxynitride film 25 and the charge accumulation layer 26 are patterned after being accumulated entirely on the p-type silicon region 23 and further, the film 25 and the layer 26 are etched to, for example, the depth of 0.05 $\mu$m to 0.5 $\mu$m and the insulation film 24 is embedded in the etched portion. Thus, it is possible to form the silicon oxide or oxynitride film 25 and the charge accumulation layer 26 of the memory cell portion on a flat face without a step, so that it is possible to form a film, of which uniformity is improved and of which property is uniformed. Alternatively, it is possible to form an interlayer insulation film 56 and n-type diffused layers 28 with being self-alignment in such a manner that, before forming the tunnel insulation film 25, for example, a mask material composed of polycrystalline silicon is formed on a portion forming the tunnel insulation film 25 in advance, after forming the n-type diffused layers 28 by implanting ion, the interlayer insulation film 56 is entirely deposited and a portion of the above mask material corresponding to the tunnel insulation film 25 is selectively removed by CMP and etch back.

Further, the control gate 27 with a thickness of 10 nm to 500 nm comprising a stack constitution of polycrystalline silicon, WSi (tungsten silicide) and polycrystalline silicon or a stack constitution of CoSi and polycrystalline silicon is formed. This control gate 27 is formed up to a block boundary in a horizontal direction of a page space in such a manner that it is connected to the adjoining memory cell block in FIG. 34B and the control gate 27 forms the data selection lines WL0 to WL15 and the selective gate control wires SSL and GSL. Alternatively, it is preferable that the p-type silicon region 23 is capable of being applied with a voltage by an n-type silicon area 22 independently of the p-type substrate 21 for decreasing a boosting circuit load upon erasing the data and suppressing the electric power consumption.

As shown in FIG. 34D, on the D—D section corresponding to the memory cell, under these gate electrodes, for example, the n-type diffused layer 28 as a source or a drain electrode is formed with interposing the interlayer insulation film 56 composed of a silicon oxide film or an oxynitride film with a thickness of 5 nm to 200 nm. By these n-type diffused layer 28, the charge accumulation layer 26 and the control gate 27, the floating gate type EEPROM cell is formed. A gate length of the floating gate type EEPROM cell is defined in the range of 0.01 $\mu$m or more and 0.5 $\mu$m or less. As shown in FIG. 34D, it is preferable that the interlayer insulation film 56 is also formed on the channel in such a manner that it covers the n-type diffused layers 28 as a source or a drain electrode in order to prevent the abnormal writing due to the concentration of the electric fields at a source/drain end. These n-type diffused layers 28 are formed at a depth in the range of 10 nm to 500 nm so that, for example, a surface density of phosphor, arsenic and antimony becomes $10^{17}$ cm$^{-3}$ to $10^{21}$ cm$^{-3}$. Further, these n-type diffused layers 28 are shared by the adjoining memory cells in the BL direction, so that the AND connection is realized.

Alternatively, in the drawing, the reference numerals 27SSL and 27GSL correspond to SSL and GSL, respectively and 27SSL and 27GSL are gate electrodes connected to the block selection line. At a wiring portion of the block selective portion, the block insulation film 50 between the charge accumulation layer 26 and the control gate 27 is removed, so that 27SSL and 27GSL are formed by the same layers as the control electrodes WL0 to WL15 of EEPROM. In this case, as shown in FIG. 34B and FIG. 34C, the block selection transistor S1 is formed as MOSFET having the diffused layers 28 and 28d as a source/drain electrode and 27SSL as a gate electrode and the block selection transistor S2 is formed as MOSFET having the diffused layers 28 and 28s as a source/drain electrode and 27GSL as a gate electrode. Here, by setting gate lengths of the gate electrodes 27SSL and 27GSL longer than the gate length of the memory cell gate electrode, for example, in the range of not more than 1 $\mu$m and not less than 0.02 $\mu$m, it is possible to obtain the sufficient on/off ratios in the block selection and the block non-selection, so that it is possible to prevent the miswriting and the misreading.

According to the present embodiment, as shown in FIG. 34D to FIG. 34D, an AND type cell is used, so that it is possible to set series resistance of the memory cell block to a small fixed value. Therefore, the present embodiment is suitable for making a many-valued threshold voltage stable.

As a memory cell of a semiconductor memory device according to the above described first, second and third embodiments, it is possible to use the AND type cell as described according to the present embodiment in addition to the NAND type cell.

Sixth Embodiment

FIG. 35A to FIG. 35D illustrate memory cell constitutions according to the sixth embodiment of the present invention.

According to the present embodiment, the AND cell block 49 by the use of a floating gate type cell described according to the fifth embodiment is changed into a NAND cell block by the use of a MONOS type cell.

FIG. 35A to FIG. 35D correspond to FIG. 34A to FIG. 34D and they show a circuit diagram, a plane view, a cross sectional view of a block selective gate portion and a cross sectional view of a memory cell portion of the AND cell block, respectively.

Figure 35A:
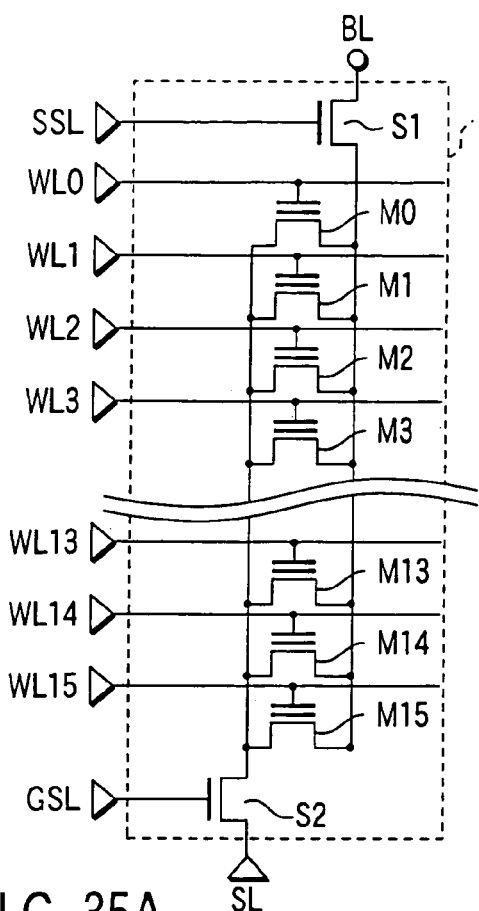
FIG. 35A is an equivalent circuit diagram showing an example of a memory cell to be used for a semiconductor memory devices according to a sixth embodiment of the present invention.

As shown in FIG. 35A, nonvolatile memory cells M0 to M15 comprising a MOS transistor-having an charge accumulation layer electrode are connected in parallel and one end thereof is connected to a data transfer line denoted as BL via a block selection transistor S1 and the other end thereof is connected to a common source line denoted as SL via a block selection transistor S2. Alternatively, respective transistors are formed on the same well. If n is defined as a block index (natural number), the control electrodes of respective memory cells M0 to M15 are connected to data selection lines represented by WL0 to WL15. Further, one memory cell block is selected among a plurality of memory cell blocks along the data transfer line to be connected to the data transfer line, so that the control electrode of the block selection transistor S1 is connected to the block selection line SSL. Alternatively, the control electrode of the block selection transistor S2 is connected to the block selective line GSL to form so-called AND type memory cell block 45 (an area encircled by a dotted line). In this case, according to the present embodiment, the control wires SSL and GSL of the block selective gate are formed by the same layers as the control lines WL0 to WL15 of the memory cell. Alternatively, at least not less than one block selection line is sufficient for the memory cell block 49 and it is preferable that the block selection line is formed in the same direction as the data selection line for a high density. According to the present embodiment, an example is shown such that $16=2^4$ pieces of memory cells are connected to the memory cell block 49. However, the number of the memory cells to be connected to the data transfer line and the data selection line may be a plural number and it is preferable that the number thereof is $2^n$ (n is a positive integer number) for the address decoding.

Figure 35B:
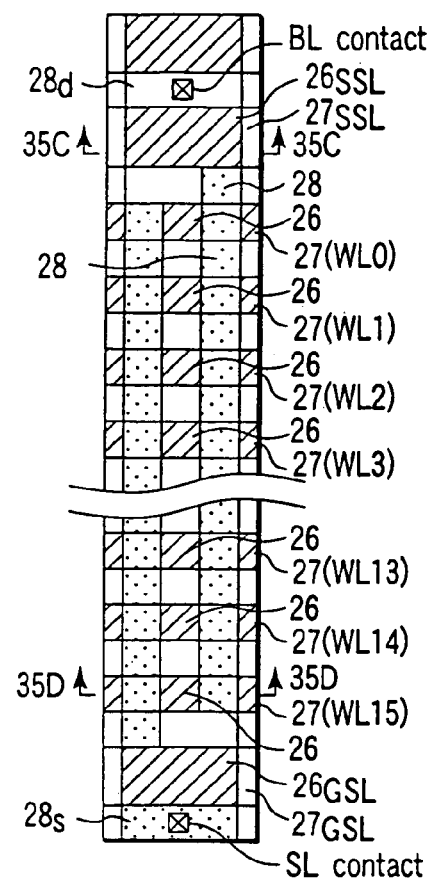
FIG. 35B is a plan view showing an example of a memory cell to be used for the semiconductor memory device according to the sixth embodiment of the present invention.
Figure 35C:
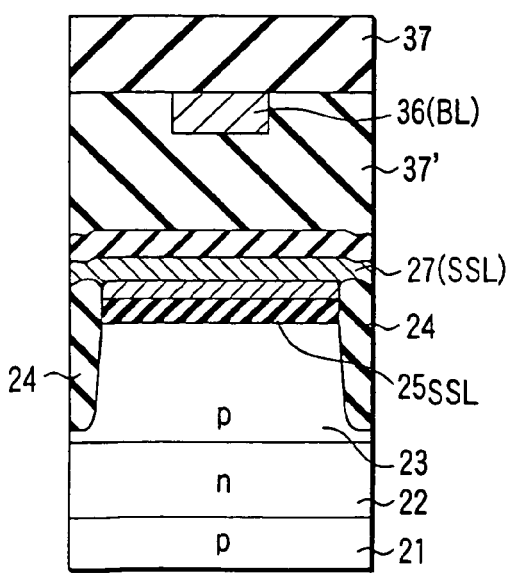
FIG. 35C is a cross sectional view taken along the line 35C—35C shown in FIG. 35B.
Figure 35D:
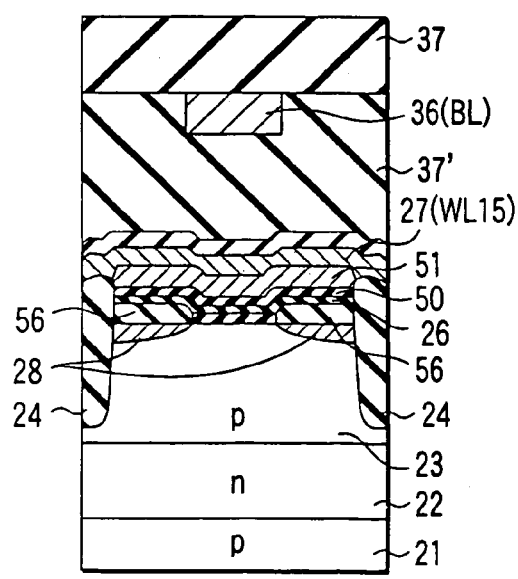
FIG. 35D is a cross sectional view taken along the line 35D—35D shown in FIG. 35B.

FIG. 35B is a plane view of the AND cell block 49, FIG. 35C is a cross sectional view taken along the line 35C—35C shown in FIG. 35B and FIG. 35D is a cross sectional view taken along the line 35D—35D shown in FIG. 35B. Particularly, in order to promote a better understanding of a cell constitution, FIG. 35B illustrates only a constitution lower than the gate electrode 27. In FIG. 35C and FIG. 35D, for example, the charge accumulation layers 26 composed of a silicon nitride film with a thickness of 4 nm to 50 nm, for example, via a tunnel gate insulation film with a thickness of 0.5 nm to 10 nm formed by silicon oxide films or oxynitride films 25, 25SSL, 25GSL. On the charge accumulation layers 26, for example, via the block insulation film 50 composed of a silicon oxide film or an oxynitride film, with a thickness in the range of 2 nm to 30 nm, for example, a polycrystalline silicon layer 26 is formed with a thickness in the range of 10 nm to 500 nm. These polycrystalline silicon layers 26 are formed, for example, on an area in which an element isolation insulation film 24 composed of silicon oxide film is not formed, with being self-alignment to a p-type silicon region 23. For example, these polycrystalline silicon layers 26 are capable of being formed in such a manner that 24, 26, 40 and 41 are patterned after being accumulated entirely on the p-type silicon region 23 and further, 24, 26, 40 and 41 are etched to, for example, the depth of 0.05 $\mu$m to 0.5 $\mu$m and the insulation film 24 is embedded in the etched portion. Thus, it is possible to form 25, 26 and 40 on a flat face without a step, so that it is possible to form a film, of which uniformity is improved. Alternatively, it is possible to form an interlayer insulation film 56 and an n-type diffused layers 28 with being self-alignment in such a manner that, before forming the tunnel insulation film 25, for example, a mask material composed of polycrystalline silicon is formed on a portion forming the tunnel insulation film 25 in advance, after forming the n-type diffused layer 28 by implanting ion, the interlayer insulation film 56 is entirely deposited and a portion of the above mask material corresponding to the tunnel insulation film 25 is selectively removed by CMP and etch back.

Further, the control gate 27 with a thickness of 10 nm to 500 nm comprising a stack constitution of polycrystalline silicon, WSi (tungsten silicide) and polycrystalline silicon or a stack constitution of CoSi and polycrystalline silicon is formed. This control gate 27 is formed up to a block boundary in a horizontal direction of a page space in such a manner that it is connected to the adjoining memory cell block in FIG. 35B and the control gate 27 forms the data selection lines WL0 to WL15 and the selective gate control wires SSL and GSL. Alternatively, it is preferable that the p-type silicon region 23 is capable of being applied with a voltage by an n-type silicon area 22 independently of the p-type substrate 21 for decreasing a boosting circuit load upon erasing the data and suppressing the electric power consumption.

As shown in FIG. 35D, on the D—D section corresponding to the memory cell, under these gate electrodes, for example, the n-type diffused layers 28 as a source or a drain electrode are formed with interposing the interlayer insulation film 56 composed of a silicon oxide film or an oxynitride film with a thickness of 5 nm to 200 nm. By these n-type diffused layers 28, the charge accumulation layer 26 and the control gate 27, the MONOS type EEPROM cell is formed. A gate length of the MONOS type EEPROM cell is defined in the range of 0.01 $\mu$m or more and 0.5 $\mu$m or less. As shown in FIG. 35D, it is preferable that the interlayer insulation film 56 is also formed on the channel in such a manner that it covers the n-type diffused layer 28 as a source or a drain electrode in order to prevent the abnormal writing due to the concentration of the electric fields at a source/drain end. These n-type diffused layers 28 are formed at a depth in the range of 10 nm to 500 nm so that, for example, a surface density of phosphor, arsenic and antimony becomes $10^{17}$ cm$^{-3}$ to $10^{21}$ cm$^{-3}$. Further, these n-type diffused layers 28 are shared by the adjoining memory cells in the BL direction, so that the AND connection is realized.

Alternatively, in the drawing, the reference numerals 27SSL and 27GSL correspond to SSL and GSL, respectively and 27SSL and 27GSL are gate electrodes connected to the block selection line and they are formed by the same layers as the control electrodes WL0 to WL15 of the above described MONOS type EEPROM. In this case, as shown in FIG. 35B and FIG. 35C, the block selection transistor S1 is formed as a MOS type MOSFET having the diffused layers 28 and 28s as a source/drain electrode and 27SSL as a gate electrode and the block selection transistor S2 is formed as a MOS type MOSFET having the diffused layers 28 and 28s as a source/drain electrode and 27GSL as a gate electrode. Here, by setting gate lengths of the gate electrodes 27SSL and 27GSL longer than the gate length of the memory cell gate electrode, for example, in the range of not more than 1 $\mu$m and not less than 0.02 $\mu$m, it is possible to obtain the sufficient on/off ratios in the block selection and the block non-selection, so that it is possible to prevent the miswriting and the misreading.

The present embodiment has the advantage of the fifth embodiment, namely, by the use of the AND type cell, it is possible to set series resistance of the memory cell block to a small fixed value. Therefore, the present embodiment is suitable for making a many-valued threshold voltage stable. By using the MONOS type cell in addition to this advantage, it is possible to lower a writing voltage and an erasing voltage than those of the floating gate type EEPROM cell according to the fifth embodiment and it is possible to prevent dielectric breakdown even if the separation distances between the elements are narrowed and the gate insulation film is made thinner. Therefore, it is possible to reduce an area of a circuit, to which a high voltage is applied, so that a chip area is capable of being contracted.

Further, compared to the fifth embodiment, it is possible to reduce a thickness of the electric charge accumulation electrode 26, for example, to not more than 20 nm, to reduce an aspect upon forming a gate, a processing shape of a gate electrode is improved and embedding between the gates of the interlayer insulation film 37' is also improved, so that it is possible to more improve the dielectric breakdown voltage. Alternatively, a process for forming the floating gate electrode and a process for forming a slit are not necessary, so that it is possible to more shorten a process step. Additionally, the electric charge accumulation electrode 26 is an insulation material and the electric charge is captured by each electric charge trap, so that the electric charge is hardly escaped against a radiation ray irradiation. Further, even if the side-wall insulation film 43 of the electric charge accumulation electrode 26 becomes thinner, the electric charge captures by the electric charge accumulation electrode 26 is not entirely escaped, so that it is possible to maintain a good electric charge holding property. Further, it is possible to form the electric charge accumulation electrode 26 without misalignment with respect to the p-type silicon region 23, so that it is possible to obtain more uniformed capacitances of the electric charge accumulation electrode 26 and the p-type silicon region 23. As a result, it is possible to reduce the variance of the capacitances between the memory cells.

In the memory cells of the semiconductor memory devices according to the above described first, second and third embodiment, it is possible to use the AND type cell block by the use of the MONOS type cell as described according to the present embodiment in addition to the AND type cell block by the use of the floating gate type cell.

Seventh Embodiment

Figure 36A:
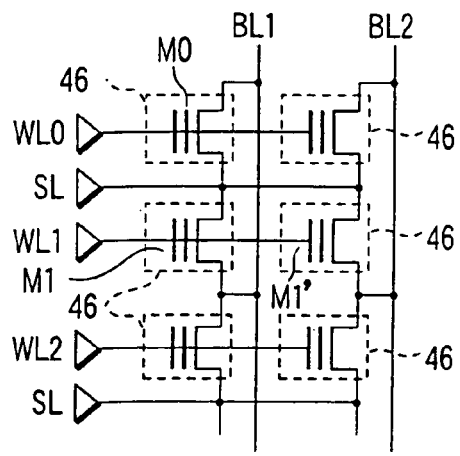
FIG. 36A is an equivalent circuit diagram showing an example of a memory cell to be used for a semiconductor memory devices according to a seventh embodiment of the present invention.
Figure 36B:
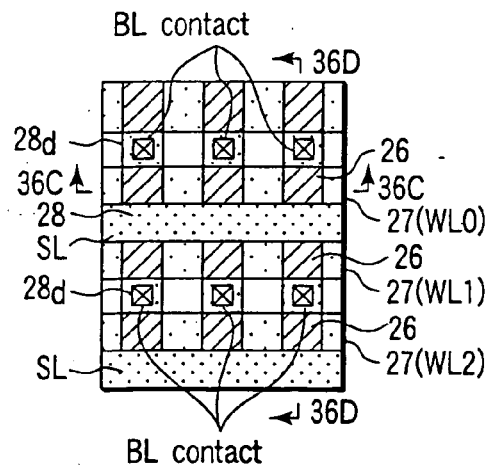
FIG. 36B is a plane view showing an example of a memory cell to be used for the semiconductor memory device according to the seventh embodiment of the present invention.
Figure 36C:
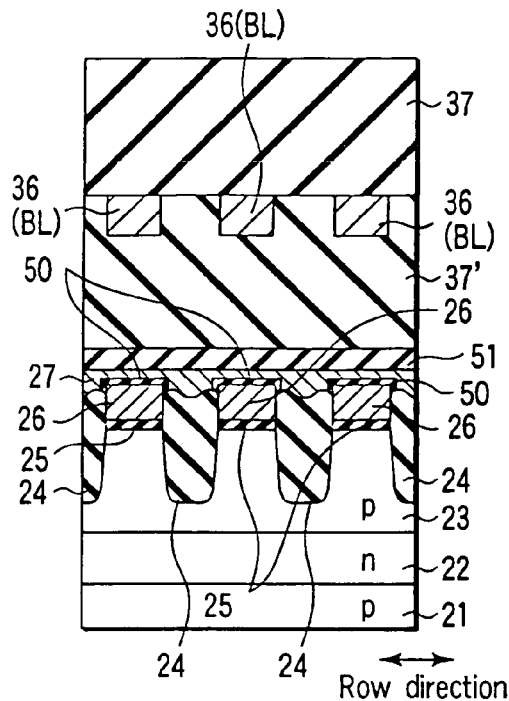
FIG. 36C is a cross sectional view taken along the line 36C—36C shown in FIG. 36B.
Figure 36D:
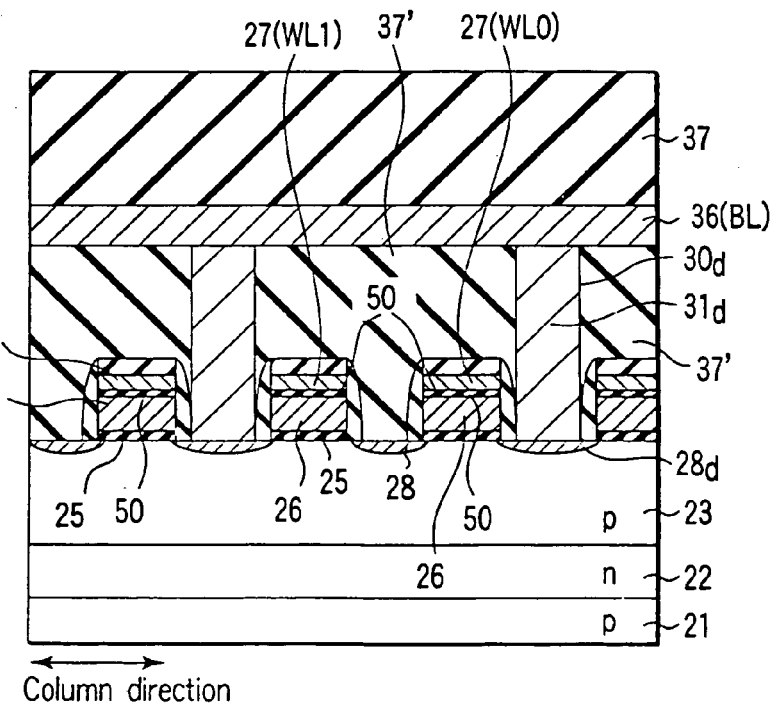
FIG. 36D is a cross sectional view taken along the line 36D—36D shown in FIG. 36B.
Figure 37:
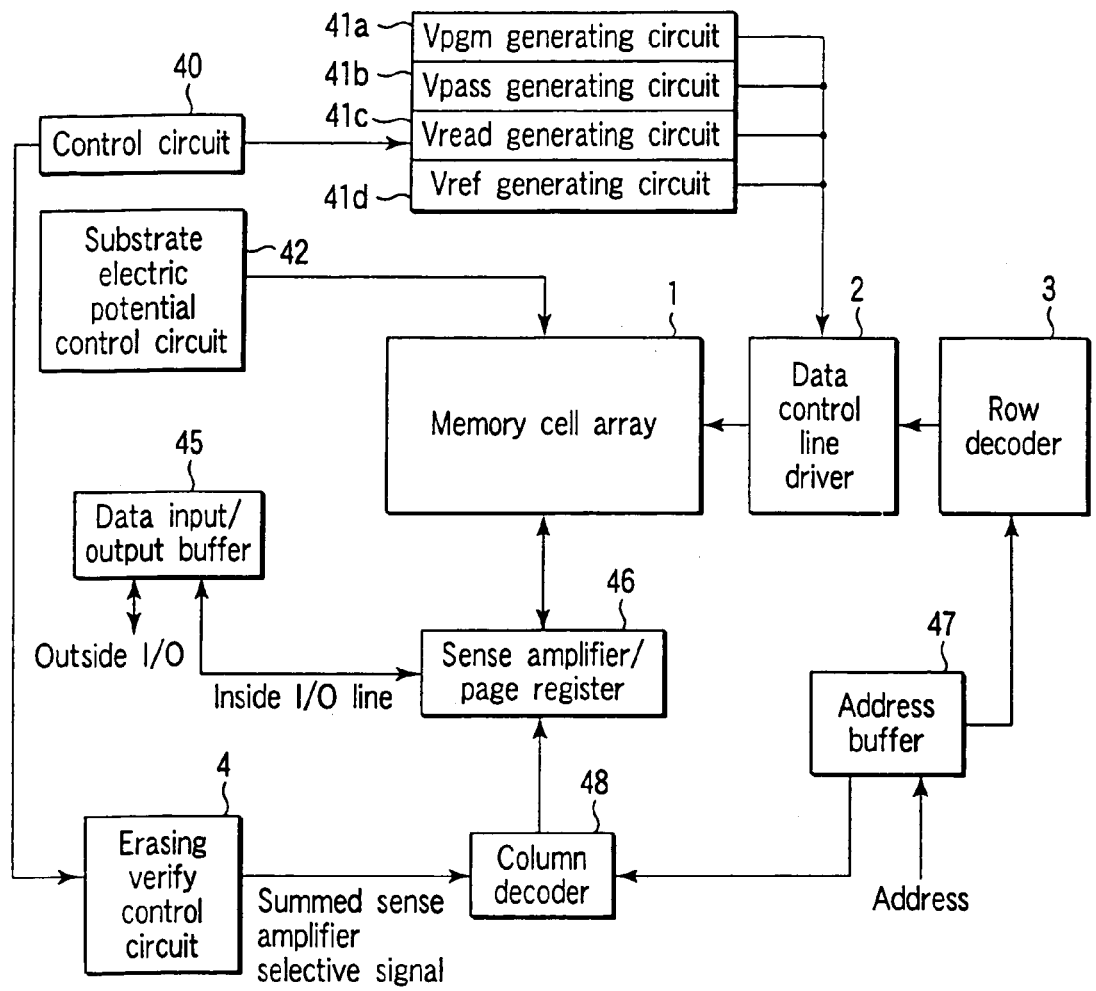
FIG. 37 is a block diagram showing a conventional semiconductor memory device.
Figure 39:
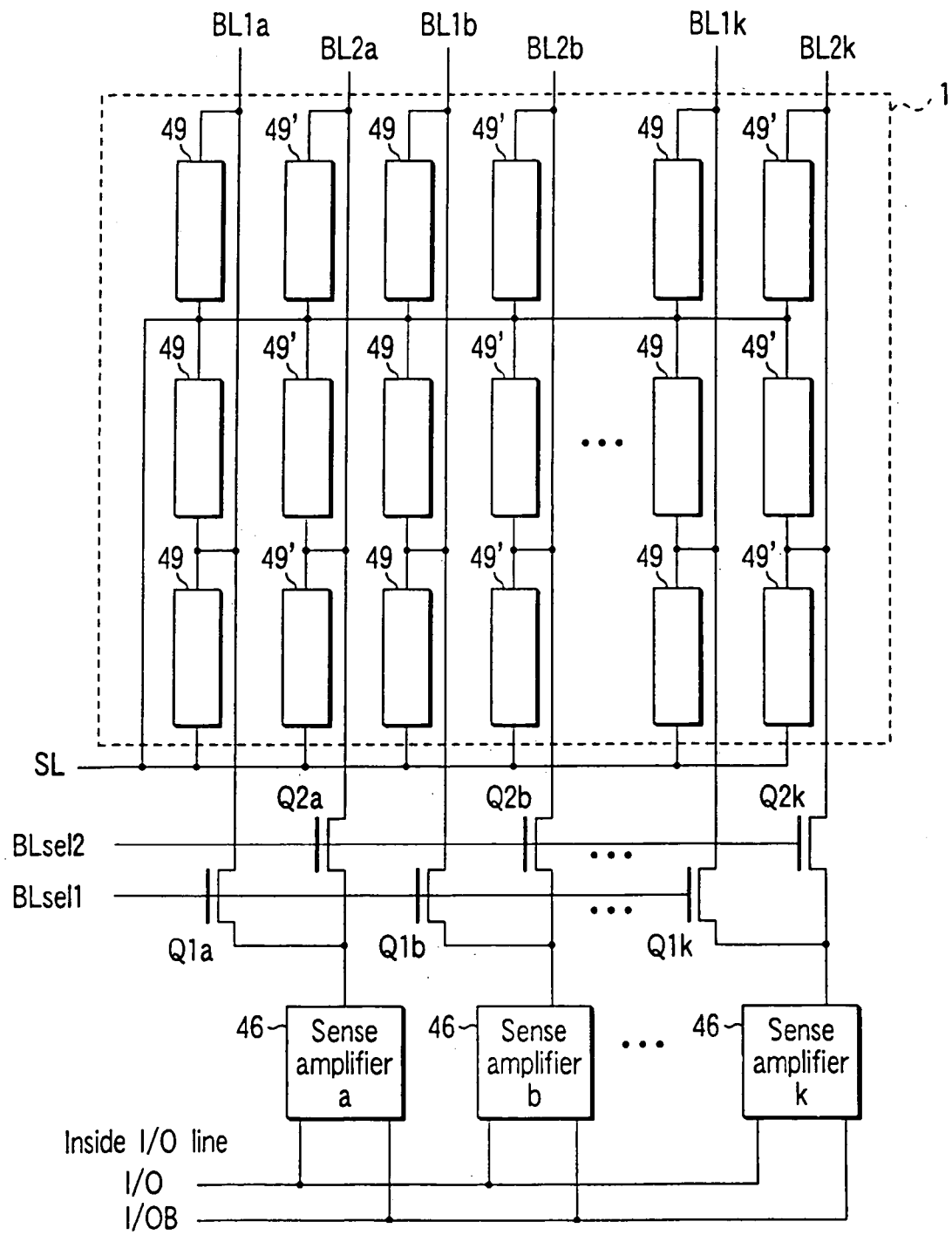
FIG. 39 is a layout diagram showing a layout example of a conventional cell array and a conventional sense amplifier circuit.
Figure 40:
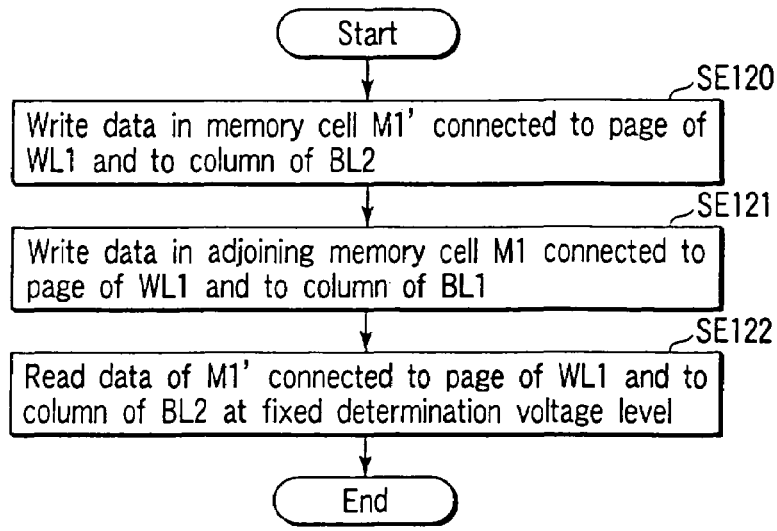
FIG. 40 is a flowchart showing a sequence in which a conventional problem occurs.
Figure 41:
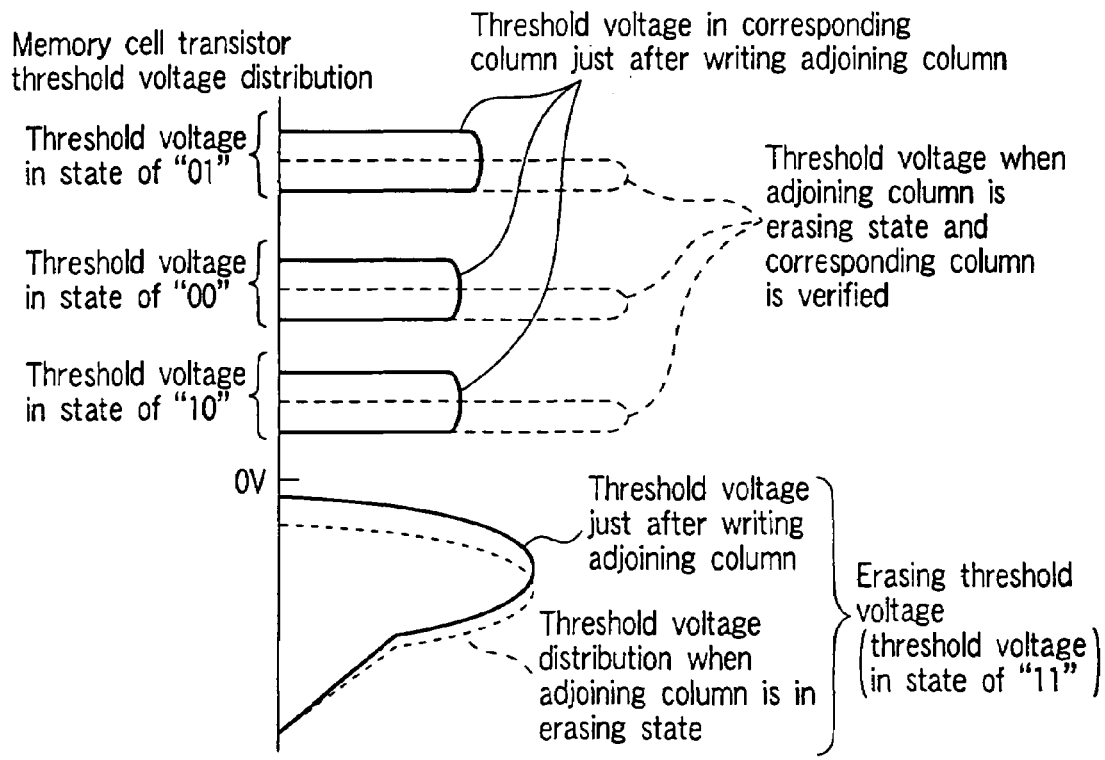
FIG. 41 is a diagram showing a problem to occur in a conventional threshold voltage distribution.
Figure 42:
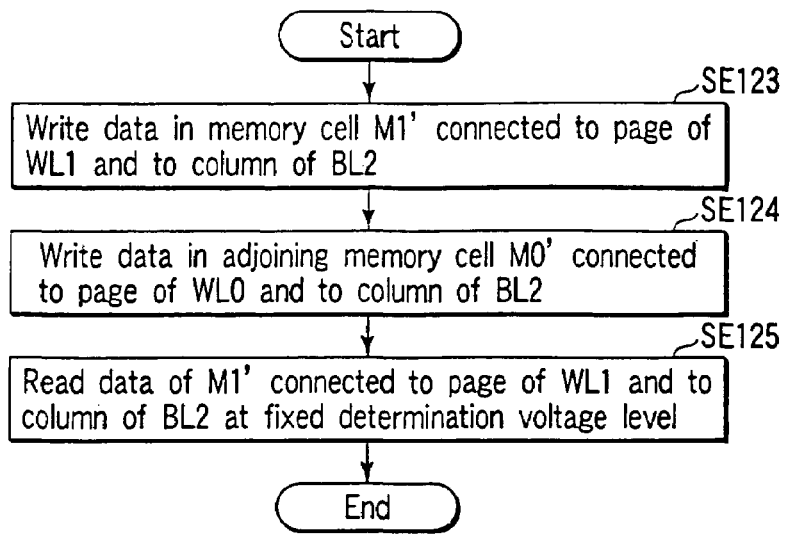
FIG. 42 is a flowchart showing a sequence in which a conventional problem occurs.
Figure 43:
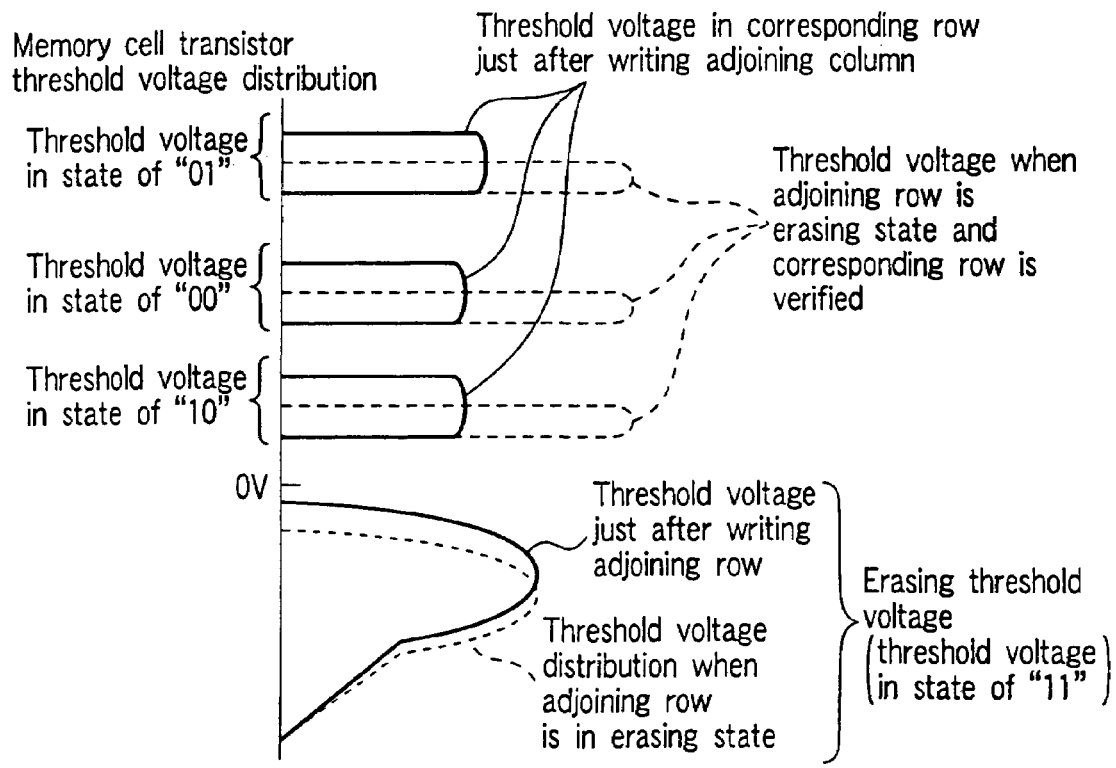
FIG. 43 is a diagram showing a problem to occur in a conventional threshold voltage distribution.

FIG. 36A and FIG. 36D illustrate memory cell constitutions according to the seventh embodiment of the present invention.

According to the present embodiment, the NAND cell block 49 described according to the first to fourth embodiments is changed into a NOR cell block.

FIG. 36A is a circuit view of a NOR cell block.

As shown in FIG. 36A, nonvolatile memory cells M0 to M1 comprising a MOS transistor having an charge accumulation layer electrode are connected in parallel and one end thereof is connected to a data transfer line denoted as BL and the other end thereof is connected to a common source line denoted as SL. In the NOR memory cell, the memory cell block 49 is formed by one transistor. Alternatively, respective transistors are formed on the same well. The control electrodes of respective memory cells M0 to M1 are connected to data selection lines represented by WL0 to WL1.

FIG. 36B is a plane view of the NOR cell block, FIG. 36C is a cross sectional view taken along the line 36C—36C shown in FIG. 36B and FIG. 36D is a cross sectional view taken along the line 36D—36D shown in FIG. 36B. Particularly, in order to promote a better understanding of a cell constitution, FIG. 36B illustrates only a constitution lower than the gate electrode 27. In FIG. 36C and FIG. 36D, for example, the charge accumulation layers 26 composed of polycrystalline silicon added with $10^{18}$ cm$^{-3}$ to $10^{21}$ cm$^{-3}$ of phosphor or arsenic is formed with a thickness of 10 nm to 500 nm for example, via a tunnel gate insulation film with a thickness of 3 nm to 15 nm formed by a silicon oxide film or oxynitride film 25. These charge accumulation layers are formed, for example, on a p-type silicon region 23 on an area in which an element isolation insulation film 24 composed of silicon oxide film is not formed.

On the charge accumulation layers 26, for example, the block insulation film 50 is formed, which is composed of a silicon oxide film or an oxynitride film, or a stacked structure of silicon oxide film, a silicon nitride film and a silicon oxide film, with a thickness in the range of 5 nm to 30 nm. These block insulation films 50 are formed, for example, on the p-type silicon region 23 on an area in which an element isolation insulation film 24 composed of silicon oxide film is not formed.

Further, the control gate 27 with a thickness of 10 nm to 500 nm comprising a stack constitution of polycrystalline silicon, WSi (tungsten silicide) and polycrystalline silicon or a stack constitution of CoSi and polycrystalline silicon is formed. This control gate 27 is formed up to a block boundary in a horizontal direction of a page space in such a manner that it is connected to the adjoining memory cell block in FIG. 36B and the control gate 27 forms the data selection lines WL0 to WL15. Alternatively, it is preferable that the p-type silicon region 23 is capable of being applied with a voltage by an n-type silicon area 22 independently of the p-type substrate 21 for decreasing a boosting circuit load upon erasing the data and suppressing the electric power consumption.

As shown in FIG. 36D, on the D—D section corresponding to the memory cell, under these gate electrodes, for example, the n-type diffused layers 28 as a source or a drain electrode are formed with interposing the interlayer insulation film 37' composed of a silicon oxide film or an oxynitride film with a thickness of 5 nm to 200 nm. By these n-type diffused layers 28, the charge accumulation layer 26 and the control gate 27, the floating gate type EEPROM cell is formed. A gate length of the floating gate type EEPROM cell is defined in the range of 0.01 μm or more and 0.5 μm or less. As shown in FIG. 36B and FIG. 36D, the n-type diffused layer 28, which is paired with the n-type diffused layer 28d connected to BL, comprises the source line SL, which is extended in a horizontal direction of a page space and is connected to the adjoining cell. Even in such a NOR type cell, the betweenness of the charge accumulation layers of the cells adjoining in the data transfer line direction interposing SL is formed by the insulation film, so that the variation of the threshold voltage is generated due to the capacitance coupling between the charge accumulation layers. Therefore, for example, with respect to two adjoining cells interposing a source line such as M0 and M1 in FIG. 36A, a plurality of threshold voltages not less than 2 values, for example, 4 values, are stored in one memory cell. Then, writing a package of two bits to be stored for each bit while verifying the memory cells adjoining each other, it is possible to compensate the change due to the capacitance coupling of the adjoining cells of the threshold voltages by the method according to the third embodiment.

It is a matter of course that the variation of the threshold voltage is generated due to the capacitance coupling between the charge accumulation layers, since the betweenness of two memory cells adjoining in a row direction is embedded by the insulation film. Therefore, as M1 and M1' shown in FIG. 33A, with respect to two cells adjoining in the row direction, a plurality of threshold voltages not less than 2 values, for example, 4 values, are stored in one memory cell. Then, writing a package of two bits to be stored for each bit while verifying the memory cells adjoining each other, it is possible to compensate the change due to the capacitance coupling of the adjoining cells of the threshold voltages by the method according to the third embodiment.

By using the constitutions of the above described first to seventh embodiments, it is possible to realize a narrow distribution of a threshold voltage even after the data is written in the adjoining memory cell. Therefore, even if the same maximum distribution of a threshold voltage is used, the separation voltage width between the distributions of the threshold voltage corresponding to the data is capable of being enlarges. Therefore, even if the threshold voltage shift due to the deterioration of the electric charge holding property and the change of a temperature, it is possible to reduce the data destruction arising from a fact that the distributions of the threshold voltages of the different data are overlapped.

Alternatively, it is possible to set the maximum value of the threshold voltage distribution of the cell lower than a conventional case. Therefore, the self electric field of the accumulation electric charge is made small and a holding property of the electric charge can be kept in a good state. Further, in the NAND type memory cell block formed by connecting the memory cells in series, with respect to a memory cell connected to a cell to read the data in series, although it is needed that a higher voltage than the maximum value of the threshold voltage distribution is applied to a gate, it is possible to lower this applied voltage. Therefore, by repeating the reading operation, a problem occurs such that a negative electric charge is injected in the charge accumulation layer so that the threshold voltage is raised. However, it is possible to suppress this problem and particularly, it is possible to keep the threshold voltage separation width of the threshold voltage of "11" in the erasing state and the threshold voltage of "10" in a good state.

Further, it is possible to keep a separation between reference threshold voltage to discriminate the read data and the threshold voltage corresponding to the data larger, so that the frequency of the misreading is capable of being decreased and it is possible to keep the gate activating voltage for determining the data reading large. Therefore, as keeping the current flowing through the data cell at a fixed value in the case that the threshold voltage corresponding to the data is higher than the reference threshold voltage to discriminate the read data, it is possible to increase the current flowing through the data cell in the case that the threshold voltage corresponding to the data is lower than the reference threshold voltage and to increase the reading speed.

Alternatively, even if the capacitances between the charge accumulation layers are scattered by the structural variation and the voltage variation, it is possible to keep the threshold voltage variation within a fixed threshold voltage range, since the verify-rewriting is performed in the adjoining memory cell to receive the change of the threshold voltage.

Alternatively, the constitutions of the present invention include constitutional elements of a conventional nonvolatile storage device to store 2 values just as they are, so that it is possible to realize the conventional nonvolatile storage device to store 2 values without reducing the functions thereof.

Additionally, according to the first and third embodiments, it is enough that a memory cell and a sense amplifier, which form a memory cell array in a row direction, may be added to a memory cell array for a divided page. Alternatively, according to the second embodiment, it is not necessary that a memory cell is more added compared to a conventional example. Therefore, all embodiments do not need to add a memory cell in a direction that the data transfer extends, so that it is possible to constitute a circuit without increasing of an area in a direction that the data selection line extends.

Further, according to the third embodiment, a plurality of circuits to temporarily hold the written data are formed in respective sense amplifiers, so that the writing operation of the circuit according to the third embodiment is performed at a higher speed compared to a case that the data is occasionally transferred from an outside data buffer to a sense amplifier upon writing the data and the wiring thereof is shorter. Therefore, it is possible to decrease the electric power consumption.

As described above, the present invention has been explained according to the first to seventh embodiments. However, the present invention should not be limited to these embodiments. For example, an example shown in the above described embodiments corresponds to the divided pages, however, it is a matter of course that the divided page may be one. Alternatively, an embodiment is shown such that a threshold voltage is corrected independently of a cell adjoining in a row direction and a cell adjoining in a column direction, however, it is a matter of course that both of the threshold voltages in the row direction and the column direction may be corrected.

Alternatively, according to the above described embodiment, as a switch element, an n-type MISFET is mainly used, however, if a gate input is reversed, a p-type and an n-type may be replaceable.

Further, according to the above described embodiment, a nonvolatile semiconductor element comprising EEPROM is exemplified. However, a constitution of the present invention is a memory matrix comprising a plurality of data selection lines and a plurality of data transfer lines and it is obvious that a constitution may be effective such that the information of a cell is interfered by the information stored in the adjoining cell between the memory cells, of which information storage areas adjoin each other. For example, in a ferroelectric memory to store the information by the amount of polarization or inversion in place of accumulating the information in the charge accumulation layer, an electric field is also generated in the adjoining cell in accordance with a direction of polarization, so that the present method can be applied. Further, by a direction of magnetization or a strength thereof, in a ferromagnetic memory, an magnetic field is also generated in the adjoining cell in accordance with a direction of magnetization, so that the present method can be applied.

Alternatively, as a method for forming an element separation film and an insulation film, a method other than a method to convert silicon into a silicon oxide film and a silicon nitride film, for example, a method to implant oxygen ion into deposited silicon and a method to oxidize deposited silicon may be employed. Additionally, as the charge accumulation layer 26, $TiO_2$ and $Al_2O_3$ or a tantalum film, a titanic acid strontium and a titanic acid barium, a titanic acid zirconium lead and an accumulation film thereof may be employed.

Alternatively, according to the embodiments, as a semiconductor substrate 21, a p-type silicon substrate is assumed. However, other than this, a single crystal semiconductor substrate containing silicon, such as an n-type silicon substrate and a SOI silicon layer of a SOI substrate, or a SiGe mix crystal, a SiGeC mix crystal or the like may be employed.

Further, an example is described such that an n-type MOSFET is formed on a p-type silicon region 23 above. However, a p-type MOSFET may be formed on the n-type MOSFET. In this case, in the above described embodiments, the n-type is read as the p-type, the p-type is read as the n-type and further, As, P, Sb of a doping impurity seed is changed into any of In, B.

Alternatively, as a gate electrode 27, it is possible to use a Si semiconductor, a SiGe crystal, a SiGeC crystal, silicide and polycide such as TiSi, NiSi, CoSi, TaSi, WSi, MoSi or the like, a metal such as Ti, Al, Cu, TiN, W or the like and polycrystal thereof and an accumulation constitution thereof may be employed. Further, the charge accumulation layer 26 may be formed in a dot shape and it is a matter of course that the present method may be applied to the charge accumulation layer 26 in a dot shape.

The present invention may be embodied in other specific forms without departing from the spirit or essential characteristics thereof.

Further, it is possible to effect the above described embodiments independently or in appropriate combination thereof.

Alternatively, the above described embodiments include the inventions at various steps, so that it is also possible to extract the inventions at various steps by appropriately combining of a plurality of constitutional matters, which are disclosed in respective embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A data writing method for a semiconductor memory device having a first memory cell block capable of rewriting data and having at least one first memory cell; and a second memory cell block capable of rewriting data and having at least one second memory cell adjoining said first memory cell, said method comprising:

writing data into said first memory cell;

rewriting the data into said first memory cell when an insufficiency of the data of said first memory cell is determined as a result of verifying the data of said first memory cell at one first reference threshold voltage;

writing data into said second memory cell following writing the data into said first memory cell; and rewriting the data into said first memory cell following writing the data into said second memory cell when an insufficiency of the data of said first memory cell is determined as a result of verifying the data of said first memory cell at one second reference threshold voltage, and said first reference threshold voltage is set to be different from said second reference threshold voltage.

2. The method according to claim 1, wherein said first and second memory cells have a charge accumulation layer, respectively, in which the electric charge is injected or discharged in association with the data to be stored and store the data of 2 values or more as an electric charge amount.

3. The method according to claim 1, wherein said first and second memory cells have a charge accumulation layer, respectively, in which the electric charge is injected or discharged in association with the data to be stored, store the data of 2 values or more as an electric charge amount and store the data of 3 values or more supplied from the outside in association with the data of 2 values of each of said first and second memory cells.

4. The method according to claim 1, wherein each of said first and second memory cells comprises a field effect transistor having at least one charge accumulation layer and at least one control gate.

5. The method according to claim 4, wherein said field effect transistors are formed on the same conductive type well, respectively.

6. The method according to claim 4, wherein said field effect transistors use an FN tunneling current for the writing operation.

7. The method according to claim 4, wherein each of said first and second memory cells includes at least first and second cell transistors adjoined to each other, each of said first and second cell transistors has a source electrode, a drain electrode and said charge accumulation layer, said source electrode of said first cell transistor and said drain electrode of said second cell transistor are connected in series to each other, and a distance between said charge accumulation layer of said first cell transistor and said charge accumulation layer of said second cell transistor is less than twice of a thickness of said charge accumulation layer.

8. The method according to claim 7, wherein the only insulator is formed between the charge accumulation layer of said first memory cell and the charge accumulation layer of said second memory cell.

9. A data writing method for a semiconductor memory device having a memory cell block capable of rewriting data, said memory cell block having at least two first and second memory cells connected in series or in parallel and adjoined to each other, said method comprising:

writing data into said first memory cell;

rewriting the data into said first memory cell when an insufficiency of the data of said first memory cell is determined as a result of verifying the data of said first memory cell at one first reference threshold voltage;

writing data into said second memory cell following writing the data into said first memory cell; and rewriting the data into said first memory cell following writing the data into said second memory cell when an insufficiency of the data of said first memory cell is determined as a result of verifying the data of said first memory cell at one second reference threshold voltage, and said first reference threshold voltage is set to be different from said second reference threshold voltage.

10. The method according to claim 9, wherein said first and second memory cells have a charge accumulation layer, respectively, in which the electric charge is injected or discharged in association with the data to be stored and store the data of 2 values or more as an electric charge amount.

11. The method according to claim 9, wherein said first and second memory cells have a charge accumulation layer, respectively, in which the electric charge is injected or discharged in association with the data to be stored, store the data of 2 values or more as an electric charge amount and store the data of 3 values or more supplied from the outside in association with the data of 2 values of each of said first and second memory cells.

12. The method according to claim 9, wherein each of said first and second memory cells comprises a field effect transistor having at least one charge accumulation layer and at least one control gate.

13. The method according to claim 12, wherein said field effect transistors are formed on the same conductive type well, respectively.

14. The method according to claim 12, wherein said field effect transistors use an FN tunneling current for the writing operation.

15. The method according to claim 12, wherein each of said first and second memory cells includes at least first and second cell transistors adjoined to each other, each of said first and second cell transistors has a source electrode, a drain electrode and said charge accumulation layer, said source electrode of said first cell transistor and said drain electrode of said second cell transistor are connected in series to each other, and a distance between said charge accumulation layer of said first cell transistor and said charge accumulation layer of said second cell transistor is less than twice of a thickness of said charge accumulation layer.

16. A data writing method for a semiconductor memory device having a memory cell block capable of rewriting data, said memory cell block having at least two first and second memory cells connected in series or in parallel and adjoined to each other, and a data control line of said first memory cell and a data control line of said second memory cell adjoin to each other, said method comprising:

writing data into said first memory cell;

rewriting the data into said first memory cell when an insufficiency of the data of said first memory cell is determined as a result of verifying the data of said first memory cell at one first reference threshold voltage;

writing data into said second memory cell following writing the data into said first memory cell; and rewriting the data into said first memory cell following writing the data into said second memory cell when an insufficiency of the data of said first memory cell is determined as a result of verifying the data of said first memory cell at one second reference threshold voltage, and said first reference threshold voltage is set to be different from said second reference threshold voltage.

17. The method according to claim 16, wherein said first and second memory cells have a charge accumulation layer, respectively, in which the electric charge is injected or discharged in association with the data to be stored and store the data of 2 values or more as an electric charge amount.

18. The method according to claim 16, wherein said first and second memory cells have a charge accumulation layer, respectively, in which the electric charge is injected or discharged in association with the data to be stored, store the data of 2 values or more as an electric charge amount and store the data of 3 values or more supplied from the outside in association with the data of 2 values of each of said first and second memory cells.

19. The device according to claim 16, wherein each of said first and second memory cells comprises a field effect transistor having at least one charge accumulation layer and at least one control gate, wherein each of said first and second memory cells includes at least first and second cell transistors adjoined to each other, each of said first and second cell transistors has a source electrode, a drain electrode and said charge accumulation layer, said source electrode of said first cell transistor and said drain electrode of said second cell transistor are connected in series to each other, and a distance between said charge accumulation layer of said first cell transistor and said charge accumulation layer of said second cell transistor is less than twice of a thickness of said charge accumulation layer.

20. The device according to claim 16, wherein each of said first and second memory cells comprises a field effect transistor having at least one charge accumulation layer and at least one control gate, wherein said field effect transistors are formed on the same conductive type well, respectively.

* * * * *